United States Patent
Takada et al.

(10) Patent No.: US 9,922,707 B2
(45) Date of Patent: Mar. 20, 2018

(54) SEMICONDUCTOR STORAGE APPARATUS AND MEMORY SYSTEM COMPRISING MEMORY CELL HOLDING DATA VALUE OF MULTIPLE BITS

(71) Applicant: Toshiba Memory Corporation, Tokyo (JP)

(72) Inventors: Marie Takada, Yokohama Kanagawa (JP); Masanobu Shirakawa, Chigasaki Kanagawa (JP); Yuji Nagai, Sagamihara Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/391,591

(22) Filed: Dec. 27, 2016

(65) Prior Publication Data
US 2017/0186484 A1 Jun. 29, 2017

Related U.S. Application Data

(60) Provisional application No. 62/356,336, filed on Jun. 29, 2016, provisional application No. 62/271,787, filed on Dec. 28, 2015.

(51) Int. Cl.
*G11C 11/56* (2006.01)
*G11C 16/04* (2006.01)
*G11C 29/02* (2006.01)
*G11C 29/04* (2006.01)

(52) U.S. Cl.
CPC ...... *G11C 11/5642* (2013.01); *G11C 16/0483* (2013.01); *G11C 29/028* (2013.01); *G11C 2029/0411* (2013.01); *G11C 2211/5642* (2013.01)

(58) Field of Classification Search
CPC .. G11C 11/5642; G11C 16/08; G11C 16/0483
See application file for complete search history.

(56) References Cited

U.S. PATENT DOCUMENTS

| | | | | |
|---|---|---|---|---|
| 6,581,843 B2 * | 6/2003 | Nobukata | ................ | G11C 7/16 235/380 |
| 8,223,550 B2 * | 7/2012 | Takeuchi | ............. | G11C 7/1012 365/185.17 |
| 8,427,875 B2 * | 4/2013 | Yang | ................... | G11C 11/5642 365/185.03 |

(Continued)

*Primary Examiner* — Vanthu Nguyen
(74) *Attorney, Agent, or Firm* — Patterson & Sheridan, LLP

(57) ABSTRACT

According to one embodiment, a semiconductor storage apparatus includes a memory cell array and a read circuit. The memory cell array includes a memory cell which is connected to a word line. A threshold voltage of the memory cell corresponds to a data value of multiple bits. The read circuit receives designation of one bit among the multiple bits, applies a first reading voltage and a second reading voltage corresponding to the designated bit to the word line, senses ON or OFF of the memory cell for each reading voltage, and outputs a first sensed value and a second sensed value after performing the sensing for each reading voltage. The first sensed value is a sensing result in a case where the first reading voltage is applied. The second sensed value is a sensing result in a case where the second reading voltage is applied.

5 Claims, 58 Drawing Sheets

(56) References Cited

U.S. PATENT DOCUMENTS

| | | | |
|---|---|---|---|
| 8,856,621 B2* | 10/2014 | Eun | G06F 11/1072 |
| | | | 365/185.09 |
| 2014/0169102 A1* | 6/2014 | Sun | G11C 16/26 |
| | | | 365/185.24 |

* cited by examiner

FIG.6

| SECTION | (1) | (2) | (3) | (4) | (5) | (6) | (7) | (8) | (9) | (10) | (11) | (12) |
|---|---|---|---|---|---|---|---|---|---|---|---|---|
| CR | 0 | 0 | 0 | 0 | 0 | 0 | 1 | 1 | 1 | 1 | 1 | 1 |
| SFT1 | 1 | 0 | 0 | 0 | 0 | 0 | 0 | 1 | 1 | 1 | 1 | 1 |
| SFT2 | 1 | 1 | 0 | 0 | 0 | 0 | 0 | 0 | 1 | 1 | 1 | 1 |
| SFT3 | 1 | 1 | 1 | 0 | 0 | 0 | 0 | 0 | 0 | 1 | 1 | 1 |
| SFT4 | 1 | 1 | 1 | 1 | 0 | 0 | 0 | 0 | 0 | 0 | 1 | 1 |
| SFT5 | 1 | 1 | 1 | 1 | 1 | 0 | 0 | 0 | 0 | 0 | 0 | 1 |

FIG.9

| SECTION | (13) | (14) | (15) | (16) | (17) | (18) | (19) | (20) | (21) | (22) | (23) | (24) | (25) | (26) | (27) | (28) | (29) | (30) |
|---|---|---|---|---|---|---|---|---|---|---|---|---|---|---|---|---|---|---|
| CR | 0 | 0 | 0 | 0 | 0 | 0 | 1 | 1 | 1 | 1 | 1 | 1 | 1 | 1 | 1 | 1 | 1 | 1 |
| ER | 0 | 0 | 0 | 0 | 0 | 0 | 0 | 0 | 0 | 0 | 0 | 0 | 1 | 1 | 1 | 1 | 1 | 1 |
| SFT1 | 1 | 0 | 0 | 0 | 0 | 0 | 0 | 0 | 0 | 1 | 1 | 1 | 1 | 0 | 0 | 0 | 0 | 0 |
| SFT2 | 1 | 1 | 0 | 0 | 0 | 0 | 0 | 0 | 0 | 0 | 1 | 1 | 1 | 1 | 0 | 0 | 0 | 0 |
| SFT3 | 1 | 1 | 1 | 0 | 0 | 0 | 0 | 0 | 0 | 0 | 0 | 1 | 1 | 1 | 1 | 0 | 0 | 0 |
| SFT4 | 1 | 1 | 1 | 1 | 0 | 0 | 0 | 0 | 0 | 0 | 0 | 0 | 1 | 1 | 1 | 1 | 0 | 0 |
| SFT5 | 1 | 1 | 1 | 1 | 1 | 0 | 0 | 0 | 0 | 0 | 0 | 0 | 0 | 1 | 1 | 1 | 1 | 0 |

FIG.11

| SECTION | (31) | (32) | (33) | (34) | (35) | (36) | (37) | (38) | (39) | (40) | (41) | (42) |
|---|---|---|---|---|---|---|---|---|---|---|---|---|
| ER | 0 | 0 | 0 | 0 | 0 | 0 | 1 | 1 | 1 | 1 | 1 | 1 |
| SFT1 | 1 | 0 | 0 | 0 | 0 | 0 | 0 | 1 | 1 | 1 | 1 | 1 |
| SFT2 | 1 | 1 | 0 | 0 | 0 | 0 | 0 | 0 | 1 | 1 | 1 | 1 |
| SFT3 | 1 | 1 | 1 | 0 | 0 | 0 | 0 | 0 | 0 | 1 | 1 | 1 |
| SFT4 | 1 | 1 | 1 | 1 | 0 | 0 | 0 | 0 | 0 | 0 | 1 | 1 |
| SFT5 | 1 | 1 | 1 | 1 | 1 | 0 | 0 | 0 | 0 | 0 | 0 | 1 |

SEMICONDUCTOR STORAGE APPARATUS AND MEMORY SYSTEM COMPRISING MEMORY CELL HOLDING DATA VALUE OF MULTIPLE BITS

CROSS-REFERENCE TO RELATED APPLICATIONS

This application is based upon and claims the benefit of priority from U.S. Provisional Application No. 62/271,787, filed on Dec. 28, 2015; and priority from U.S. Provisional Application No. 62/356,336, filed on Jun. 29, 2016; the entire contents of all of which are incorporated herein by reference.

FIELD

Embodiments described herein relate generally to a semiconductor storage apparatus and a memory system.

BACKGROUND

In the related art, a semiconductor storage apparatus including memory cells that hold amounts of charges corresponding to data values is widely known. A data value stored in a memory cell is determined on the basis of comparison of a threshold voltage corresponding to an amount of charges held in the memory cell with a predetermined reading voltage. An amount of charges held in a memory cell varies with time and for each access. The data value varies with the variation in the amount of charges. The varied data value is detected as an error. To decrease the number of data values which are detected as errors, a technique of shifting a reading voltage with the variation in the amount of charges has been developed.

BRIEF DESCRIPTION OF THE DRAWINGS

FIG. 6 is a diagram illustrating data values acquired by each shift reading and a sensing result of C reading in the lower estimation process;

FIG. 9 is a diagram illustrating data values acquired by each shift reading, a sensing result of C reading, and a sensing result of E reading in the middle estimation process;

FIG. 11 is a diagram illustrating data values acquired by each shift reading and a sensing result of E reading in the upper estimation process;

DETAILED DESCRIPTION

In general, according to one embodiment, a semiconductor storage apparatus includes a memory cell array and a read circuit. The memory cell array includes a memory cell which is connected to a word line. A threshold voltage of the memory cell corresponds to a data value of multiple bits. The read circuit receives designation of one bit among the multiple bits, applies a first reading voltage and a second reading voltage corresponding to the designated bit to the word line, senses ON or OFF of the memory cell for each reading voltage, and outputs a first sensed value and a second sensed value after performing the sensing for each reading voltage. The first sensed value is a sensing result in a case where the first reading voltage is applied. The second sensed value is a sensing result in a case where the second reading voltage is applied.

Hereinafter, a semiconductor storage apparatus according to embodiments will be described in detail with reference to the accompanying drawings. The present invention is not limited to the embodiments.

First Embodiment

Figure 1:
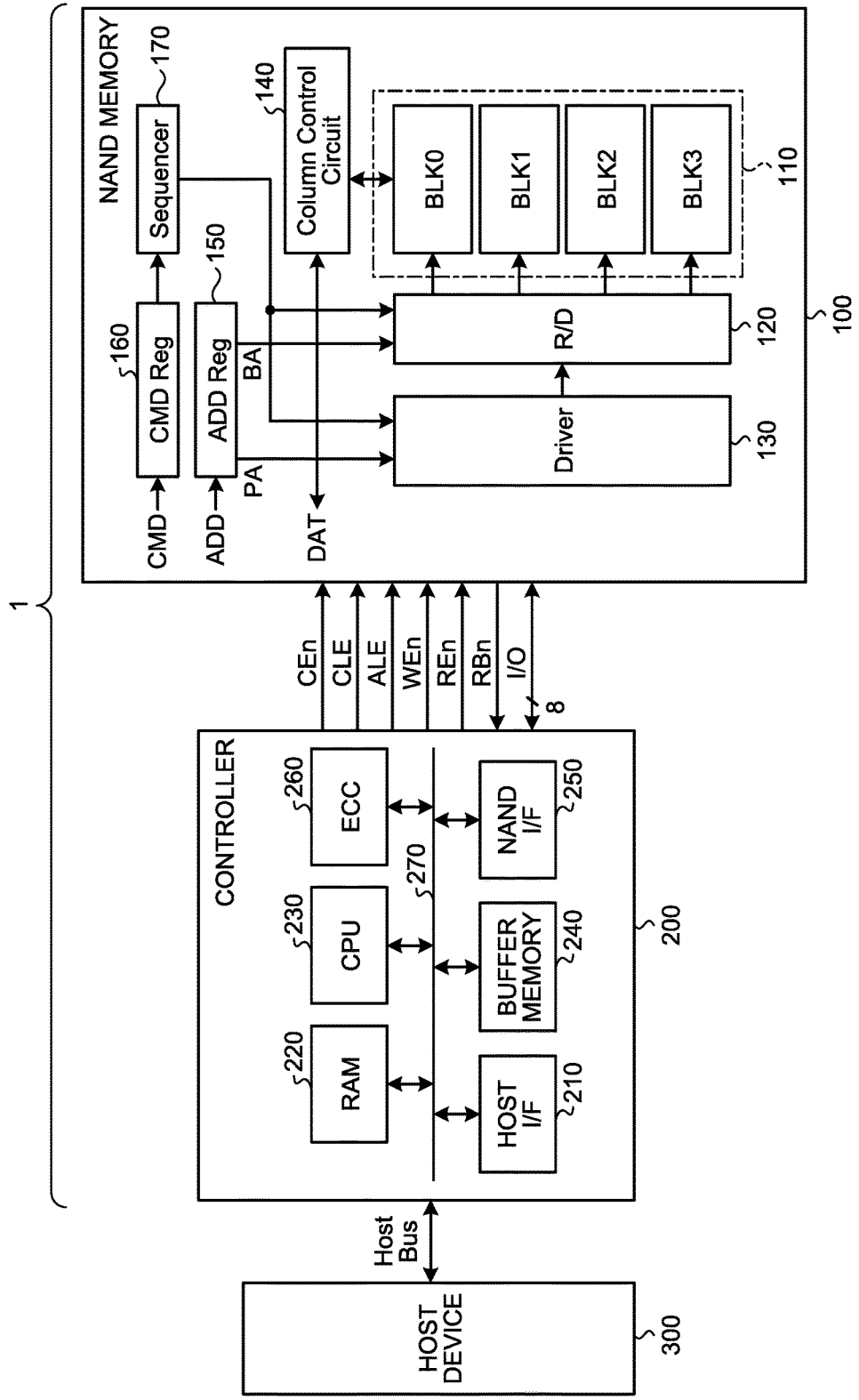
FIG. 1 is a block diagram illustrating a memory system according to a first embodiment.

FIG. 1 is a block diagram illustrating a memory system according to this embodiment. The memory system 1 includes a NAND type flash memory 100 and a controller 200. The NAND type flash memory 100 and the controller 200 may constitute a single memory system, for example, by combination thereof. Examples of the memory system include a memory card such as an SD (registered trademark) card and a solid state drive (SSD). Hereinafter, the NAND type flash memory 100 is simply referred to as a NAND memory 100.

The NAND memory 100 is a semiconductor storage apparatus according to this embodiment. The NAND memory 100 is a nonvolatile memory including plural memory cells. The controller 200 is connected to the NAND memory 100 via a NAND bus and is connected to a host device 300 via a host bus. The controller 200 controls the NAND type flash memory 100. The controller 200 accesses the NAND type flash memory 100 in response to a command received from the host device 300. The host device 300 has a configuration of a computer. Examples of the computer include a personal computer, a server device, a portable information device, or a digital still camera. An arbitrary standard can be employed as a standard on which the host bus is based.

The NAND bus performs transmitting and receiving of a signal in accordance with the NAND interface. Specific examples of the signal include a chip enable signal CEn, an address latching enable signal ALE, a command latching enable signal CLE, a writing enable signal WEn, a read enable signal REn, a ready/busy signal RBn, and an input/output signal I/O.

The signal CEn is a signal for enabling the NAND memory 100. The signal CLE is a signal for notifying the NAND memory 100 that an input signal I/O to the NAND memory 100 is a command. The signal ALE is a signal for notifying the NAND type flash memory 100 that an input signal I/O to the NAND memory 100 is an address. The signal WEn is a signal for writing an input signal I/O to the NAND memory 100. The signal REn is a signal for reading an output signal I/O from the NAND memory 100. The ready/busy signal RBn is a signal indicating whether the NAND memory 100 is in a ready state (a state in which a command from the controller 200 can be accepted) or in a busy state (a state in which a command from the controller 200 cannot be accepted). The input/output signal I/O is, for example, a signal of eight bits. The input/output signals I/O are entities of data which are transmitted and received between the NAND memory 100 and the controller 200. Examples of the input/output signals include a command, an address, write data, and read data. Write data is data to be programmed to a memory cell array (a memory cell array 110 to be described later). Read data is data which has been read from the memory cell array 110. The size of one piece of write data and one piece of read data is arbitrary. Here, for example, the size of one piece of write data and the size of one piece of read data are equal to a size of one page. Details of a page will be described later.

The controller 200 includes a host interface circuit (host I/F) 210, a random access memory (RAM) 220, a central processing unit (CPU) 230, a buffer memory 240, a NAND interface circuit (NAND I/F) 250, and an ECC circuit (ECC) 260. The host interface circuit 210, the RAM 220, the CPU 230, the buffer memory 240, the NAND interface circuit 250, and the ECC circuit 260 are connected to each other via an internal bus 270.

The host interface circuit 210 is connected to the host device 300 via the host bus, transmits a command received from the host device 300 to the CPU 230 and transmits data from the host device 300 to the buffer memory 240. In response to a command from the CPU 230, the host interface circuit transmits data in the buffer memory 240 to the host device 300.

The CPU 230 controls the operation of the controller 200 as a whole. For example, when a write command is received from the host device 300, the CPU 230 issues a write command to the NAND interface circuit 250 in response to the received write command. The same is true of reading and erasing. The CPU 230 performs various processes for managing the NAND memory 100 such as wear leveling and garbage collection.

The NAND interface circuit 250 is connected to the NAND memory 100 via the NAND bus and controls communication with the NAND memory 100. The NAND interface circuit 250 outputs the signal ALE, the signal CLE, the signal WEn, and the signal REn to the NAND memory 100 in response to a command received from the CPU 230. In writing, the write command issued from the CPU 230 and the write data in the buffer memory 240 are transmitted as input/output signals I/O to the NAND memory 100. In reading, the NAND interface circuit 250 transmits a read command issued from the CPU 230 as an input/output signal I/O to the NAND memory 100. The NAND interface circuit 250 receives data read from the NAND memory 100 as an input/output signal I/O and transmits the received data to the buffer memory 240.

The buffer memory 240 functions as a memory area in which write data or read data is temporarily stored. An arbitrary kind of memory can be employed as the buffer memory 240. For example, a dynamic random access memory (DRAM) or a static random access memory (SRAM) can be employed as the buffer memory 240.

The RAM 220 is used as a work area of the CPU 230. Firmware for managing the NAND memory 100, various management tables, and the like are loaded into the RAM 220. An arbitrary type of RAM can be employed as the RAM 220. For example, a DRAM can be employed as the RAM 220.

The ECC circuit 260 performs encoding and decoding of data for error detection and error correction on read data. Specifically, the ECC circuit 260 encodes data. The encoded data is sent as write data to the NAND memory 100. The ECC circuit 260 decodes read data. The ECC circuit 260 performs the error detection and the error correction on the read data by the decoding. When the error correction fails, the ECC circuit 260 notifies the CPU 230 of failure of the error correction. An arbitrary algorithm can be employed as an encoding and decoding algorithm used in the ECC circuit 260.

In an example of the algorithm in the ECC circuit 260, the ECC circuit 260 generates a parity on the basis of data and adds the parity to the data. The data having the parity added thereto is sent as write data to the NAND memory 100. When read data is output from the NAND memory 100, the ECC circuit 260 generates a syndrome on the basis of the parity and determines whether an error is present in the read data. When an error is included in the read data, the ECC circuit 260 specifies a position of the error and corrects the error. The number of errors which can be correctable in the ECC circuit 260 depends on, for example, the number of bits of the parity. When more errors than the number of errors correctable are included in the data, the ECC circuit 260 cannot correct the errors. That is, the ECC circuit 260 fails in the error correction.

The NAND memory 100 includes a memory cell array 110, a row decoder (R/D) 120, a driver circuit (Driver) 130, a column control circuit 140, an address register (ADD Reg) 150, a command register (CMD Reg) 160, and a sequencer 170. The row decoder 120, the driver circuit 130, the column control circuit 140, and the sequencer 170 constitute a read circuit according to this embodiment.

The memory cell array 110 includes plural blocks. In the example illustrated in FIG. 1, the memory cell array 110 includes four blocks BLK (BLK0 to BLK3). Each block BLK is a set of nonvolatile memory cells (memory cell transistors MT) and each memory cell is correlated with a row and a column. The memory cell array 110 stores data received from the controller 200.

The row decoder 120 selects one of the blocks BLK0 to BLK3 and additionally selects a row direction in the selected block BLK.

The driver circuit 130 supplies a voltage to the selected block BLK via the row decoder 120.

The column control circuit 140 transmits write data DAT received from the controller 200 to the memory cell array 110 in a programming process.

In a reading process, the column control circuit 140 senses data read from the memory cell array 110 and performs a necessary operation. The column control circuit 140 outputs the acquired data DAT to the controller 200.

The address register 150 holds an address ADD received from the controller 200. The command register 160 holds a command CMD received from the controller 200.

The sequencer 170 controls the whole operation of the NAND memory 100 on the basis of the command CMD held in the command register 160.

Figure 2:
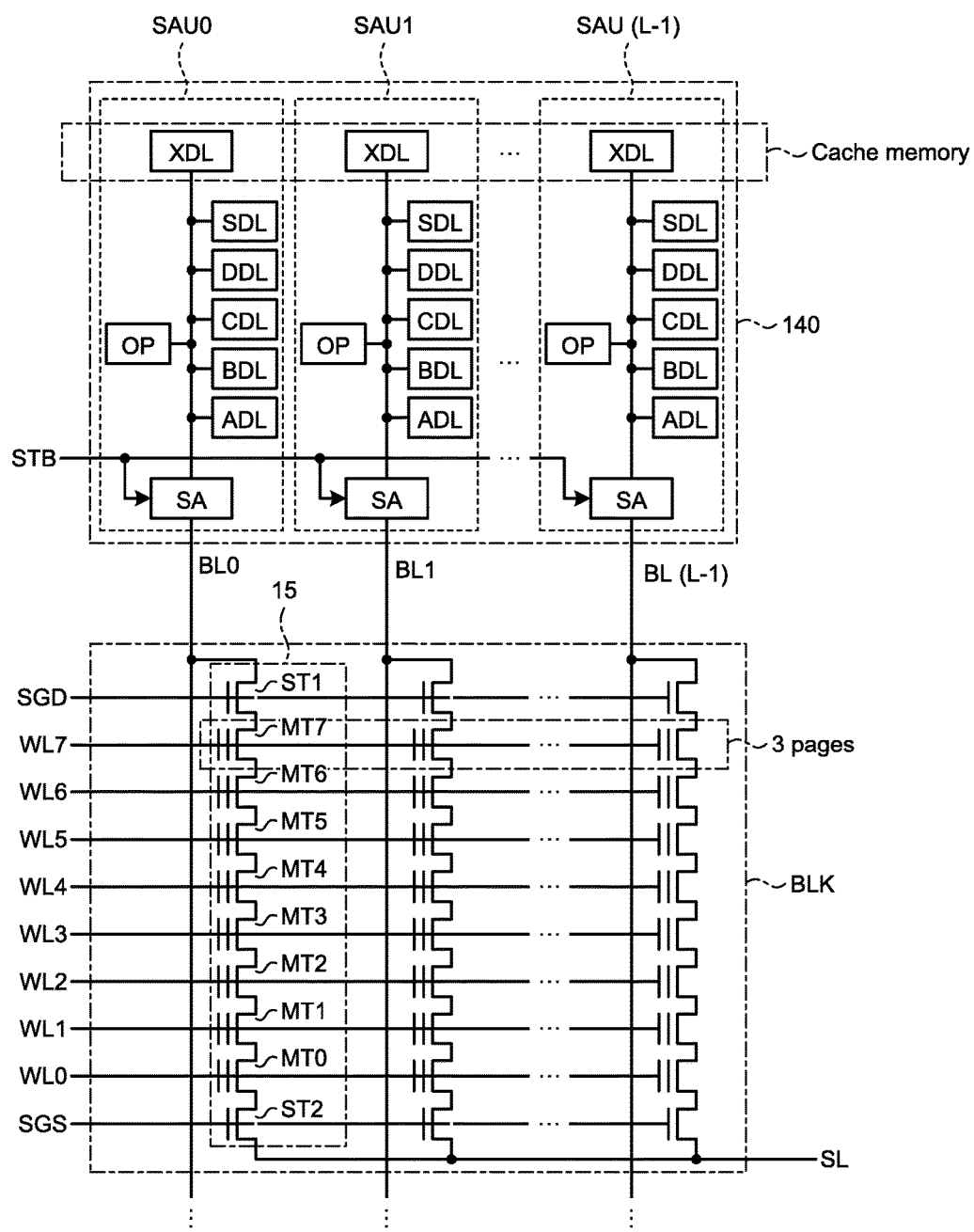
FIG. 2 is a circuit diagram of a block and column control circuit.

FIG. 2 is a circuit diagram of a block BLK and the column control circuit 140.

Each block BLK includes plural NAND strings 15. Each NAND string 15 includes, for example, eight memory cells (memory cell transistors MT0 to MT7) and selection transistors ST1 and ST2. Each memory cell transistor MT includes a control gate and a floating gate. The memory cell transistors MT are connected in series between the source of the selection transistor ST1 and the drain of the selection transistor ST2. Charges are injected to the floating gate of each memory cell transistor MT by the column control circuit 140 such that a threshold voltage thereof is included in a voltage range corresponding to a data value among plural voltage ranges. The threshold voltage of the memory cell transistor MT is converted into a data value by the column control circuit 140. That is, the threshold voltage of the memory cell transistor MT corresponds to the data value. Data coding will be described later.

The gates of the selection transistors ST1 and ST2 in the same block are commonly connected to the selection gate lines SGD and SGS. Similarly, the control gates of the memory cell transistors MT0 to MT7 in the same block are commonly connected to the word lines WL0 to WL7.

The drains of the selection transistors ST1 of the NAND strings 15 located in the same column in the memory cell array 110 are commonly connected to bit lines BL (BL0 to BL(L−1), where L is an integer equal to or greater than 2). That is, each of the bit lines BL is commonly connected to the NAND strings 15 in the plural blocks BLK. The sources of the plural selection transistors ST2 are commonly connected to a source line SL.

The memory cell array 110 may have a configuration in which the memory cell transistors MT are three-dimensionally stacked on a semiconductor substrate. This configuration is described, for example, in U.S. Ser. No. 12/407,403, filed on Mar. 19, 2009, which is titled "Three dimensional stacked nonvolatile semiconductor memory". Such a configuration is also described, for example, in U.S. Ser. No. 12/406,524, filed on Mar. 18, 2009, which is titled "Three dimensional stacked nonvolatile semiconductor memory", U.S. Ser. No. 12/679,991, filed on Dec. 9, 2008, which is titled "Non-volatile semiconductor storage device and method of manufacturing the same", and U.S. Ser. No. 12/532,030, filed on Mar. 23, 2009, which is titled "Semiconductor memory and method for manufacturing same". These patent applications are incorporated therein by reference in their entirety.

Hereinafter, the memory cell transistor MT is simply referred to as a memory cell.

Figure 3:
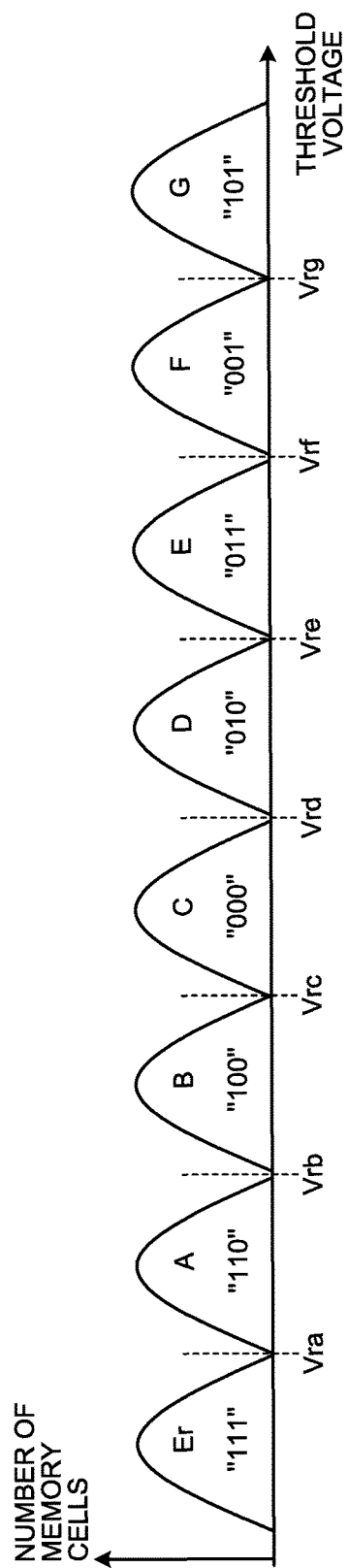
FIG. 3 is a diagram illustrating an example of data coding and threshold voltage distributions according to the first embodiment.

FIG. 3 is a diagram illustrating an example of data coding and threshold voltage distributions in this embodiment. In the first embodiment, it is assumed that a single memory cell can hold a data value of 3 bits. The horizontal axis represents the threshold voltage of a memory cell. The objects of mountain-like shape illustrated in the upper part of FIG. 3 schematically represents threshold voltage distributions. The eight threshold voltage distributions correspond to the voltage ranges and are also referred to as levels. In a memory cell of 3 bits/cell, programming to the memory cell is performed such that a threshold voltage thereof is included in any one of an Er level, an A level, a B level, a C level, a D level, an E level, an F level, and a G level. The eight levels correspond to different data value of 3 bits respectively. According to the example illustrated in the drawing, the Er level corresponds to a data value of "111", the A level corresponds to a data value of "110", the B level corresponds to a data value of "100", the C level corresponds to a data value of "000", the D level corresponds to a data value of "010", the E level corresponds to a data value of "011", the F level corresponds to a data value of "001", and the G level corresponds to a data value of "101". In the data value of 3 bits stored in a single memory cell, a least significant bit (LSB) is referred to as a lower bit, a most significant bit (MSB) is referred to as an upper bit, and a bit between the LSB and the MSB is referred to as a middle bit. A set of lower bits of all memory cell transistors MT connected to the same word line WL is referred to as a lower page. A set of middle bits of all memory cell transistors MT connected to the same word line WL is referred to as a middle page. A set of upper bits of all memory cell transistors MT connected to the same word line is referred to as an upper page. That is, storage areas of three pages are assigned to a single word line WL. Programming and reading on the memory cell array 110 are performed, for example, by pages. Erasing on the memory cell array 110 is performed by blocks BLK.

A voltage of a boundary (hereinafter, referred to as a boundary voltage) between the Er level and the A level is referred to as Vra, a boundary voltage between the A level and the B level is referred to as Vrb, a boundary voltage between the B level and the C level is referred to as Vrc, a boundary voltage between the C level and the D level is referred to as Vrd, a boundary voltage between the D level and the E level is referred to as Vre, a boundary voltage between the E level and the F level is referred to as Vrf, and a boundary voltage between the F level and the G level is referred to as Vrg. In reading, the boundary voltages are used to specify a voltage range to which a threshold voltage of a memory cell belongs.

The data coding illustrated in FIG. 3 is an example. An arbitrary data coding can be employed as data coding of the memory system 1.

The column control circuit 140 includes a sense amplifier unit SAU (SAU0 to SAU(L−1)) disposed for each bit line BL as illustrated in FIG. 2.

The sense amplifier unit SAU detects (senses) whether the memory cell transistor MT is in a conduction state (an ON state) or in a non-conduction state (an OFF state) while the row decoder 120 applies voltages to the word lines WL, and determines the data value based on the sensing result. Specifically, the sense amplifier unit SAU precharges the bit line BL with a voltage Vb1 and the row decoder 120 sequentially applies several boundary voltages as a reading voltage to the selected word line WL (hereinafter, referred to as a selected word line WL). The row decoder 120 applies a transfer potential VREAD to the non-selected word lines WL to turn on the memory cells belonging to the non-selected word lines WL. The sense amplifier unit SAU specifies a voltage range to which a threshold voltage of a target memory cell belongs by detecting a boundary voltage which causes charges accumulated by the precharging to be discharged to the source line SL, and converts the specified voltage range into a corresponding data value.

Here, an example of a method of determining a data value in a normal reading process (hereinafter, referred to as normal reading) will be described.

The process of applying a single reading voltage and determining whether charges are discharged to the source line SL is referred to as single-level reading. The single-level reading in which a voltage between an X level and a Y level is used as a boundary voltage is referred to as X reading. Here, it is assumed that the X level and the Y level are adjacent to each other and the voltage range of the X level is higher than the voltage range of the Y level. That is, X is any one of A, B, C, D, E, F, and G. A reading, B reading, C reading, D reading, E reading, F reading, and G reading may be referred to as types of single-level reading. In the sensing result of the X reading, it is assumed that "0" indicates an event in which charges are discharged to the source line SL (that is, an event in which the memory cell is in the ON state) and "1" indicates an event in which charges are not discharged to the source line SL (that is, an event in which the memory cell is in the OFF state). Which of "0" and "1" should be assigned to each event is not limited to this manner. The sensing result by the X reading may be referred to as XR.

When a target location of reading process is a lower page, a boundary voltage Vra and a boundary voltage Vre are used as reading voltages. That is, in the normal reading on the lower page, two types of single-level reading (the A reading and the E reading) are performed. The boundary voltage Vra is used as the reading voltage in the A reading and the boundary voltage Vre is used as the reading voltage in the E reading. In a case where discharging to the source line SL is detected in the A reading or discharging to the source line SL is not detected in the E reading, the sense amplifier unit SAU determines that a corresponding data value is "1". In a case where discharging to the source line SL is not detected in the A reading and discharging to the source line SL is detected in the E reading, the sense amplifier unit SAU determines that the corresponding data value is "0". For example, the sense amplifier unit SAU can acquire the data values of the lower page by performing a NOT operation on the sensing result AR and performing an OR operation of the inverted sensing result AR and the sensing result ER.

When a target location of reading process is a middle page, a boundary voltage Vrb, a boundary voltage Vrd, and a boundary voltage Vrf are used as reading voltages. That is, in the normal reading on the middle page, three types of single-level reading (the B reading, the D reading, and the F reading) are performed. The boundary voltage Vrb is used as the reading voltage in the B reading, the boundary voltage Vrd is used as the reading voltage in the D reading, and the boundary voltage Vrf is used as the reading voltage in the F reading. In a case where discharging to the source line SL is detected in the B reading, the sense amplifier unit SAU determines that a corresponding data value is "1". In a case where discharging to the source line SL is not detected in the B reading and discharging to the source line SL is detected in the D reading, the sense amplifier unit SAU determines that the corresponding data value is "0". In a case where discharging to the source line SL is not detected in the D reading and discharging to the source line SL is detected in the F reading, the sense amplifier unit SAU determines that the corresponding data value is "1". In a case where discharging to the source line SL is not detected in the F reading, the sense amplifier unit SAU determines that the corresponding data value is "0". For example, the sense amplifier unit SAU can acquire the data values of the middle page by performing a NOT operation on the sensing result BR, performing an OR operation of the inverted sensing result BR and the sensing result DR, performing a NOT operation on the sensing result FR, and performing an AND operation of the result of the OR operation and the inverted sensing result FR.

When a target location of reading process is an upper page, a boundary voltage Vrc and a boundary voltage Vrg are used as the determination. That is, in the normal reading on the upper page, two types of single-level reading (the C reading and the G reading) are performed. The boundary voltage Vrc is used as the reading voltage in the C reading and the boundary voltage Vrg is used as the reading voltage in the G reading. In a case where discharging to the source line SL is detected in the C reading or discharging to the source line SL is not detected in the G reading, the sense amplifier unit SAU determines that a corresponding data value is "1". In a case where discharging to the source line SL is not detected in the C reading and discharging to the source line SL is detected in the G reading, the sense amplifier unit SAU determines that the corresponding data value is "0". For example, the sense amplifier unit SAU can acquire the data values of the upper page by performing a NOT operation on the sensing result CR and performing an OR operation of the inverted sensing result CR and the sensing result GR.

In this manner, each page is correlated in advance with the types of the single-level reading to be performed in the normal reading. The sequencer 170 selects and performs the corresponding types of single-level reading depending on whether the page designated as the target location is a lower page, a middle page, or an upper page.

Each sense amplifier unit SAU includes a sense amplifier unit SA, an operation unit OP, and plural latch circuits. For example, each sense amplifier unit SAU includes a latch circuit SDL, a latch circuit ADL, a latch circuit BDL, a latch circuit CDL, a latch circuit DDL, and a latch circuit XDL.

The sense amplifier unit SAU applies a voltage to the bit line BL on the basis of write data. The sense amplifier unit SA senses whether charges are discharged to the source line SL. The sense amplifier unit SA is supplied with a control signal STB, for example, by the sequencer 170. The sense amplifier unit SA settles the sensing result ("0" or "1") when the signal STB is asserted, and transfers the sensing result to the latch circuit SDL.

The latch circuit SDL, the latch circuit ADL, the latch circuit BDL, the latch circuit CDL, the latch circuit DDL, and the latch circuit XDL temporarily store the sensing result, the read data, the write data, or the operation result data by the operation unit OP. The operation unit OP performs various logical operations such as a NOT operation, an OR operation, an AND operation, and an XOR operation on data held in the latch circuit SDL, the latch circuit ADL, the latch circuit BDL, the latch circuit CDL, the latch circuit DDL, and the latch circuit XDL.

The sense amplifier unit SA, the latch circuit SDL, the latch circuit ADL, the latch circuit BDL, the latch circuit CDL, the latch circuit DDL, the latch circuit XDL, and the operation unit OP are connected to a bus and can transmit and receive data to and from each other via the bus.

Inputting and outputting of data in the column control circuit 140 are performed via the latch circuit XDL. That is, data received from the controller 200 is transferred to the latch circuit SDL, the latch circuit ADL, the latch circuit BDL, the latch circuit CDL, the latch circuit DDL, or the sense amplifier unit SA via the latch circuit XDL. Data in the latch circuit SDL, the latch circuit ADL, the latch circuit BDL, the latch circuit CDL, the latch circuit DDL, or the sense amplifier unit SA is transmitted to the controller 200 via the latch circuit XDL. There is a mode in which the latch circuit XDL is used as a cache memory of the NAND memory 100 (hereinafter, referred to as a cache mode). That is, even when any one of the latch circuit SDL, the latch circuit ADL, the latch circuit BDL, the latch circuit CDL, and the latch circuit DDL is used during an access (programming, reading, or erasing) to the memory cell array 110, the NAND memory 100 can be in the ready state as long as data can be input and output to and from the latch circuit XDL.

Figure 4:
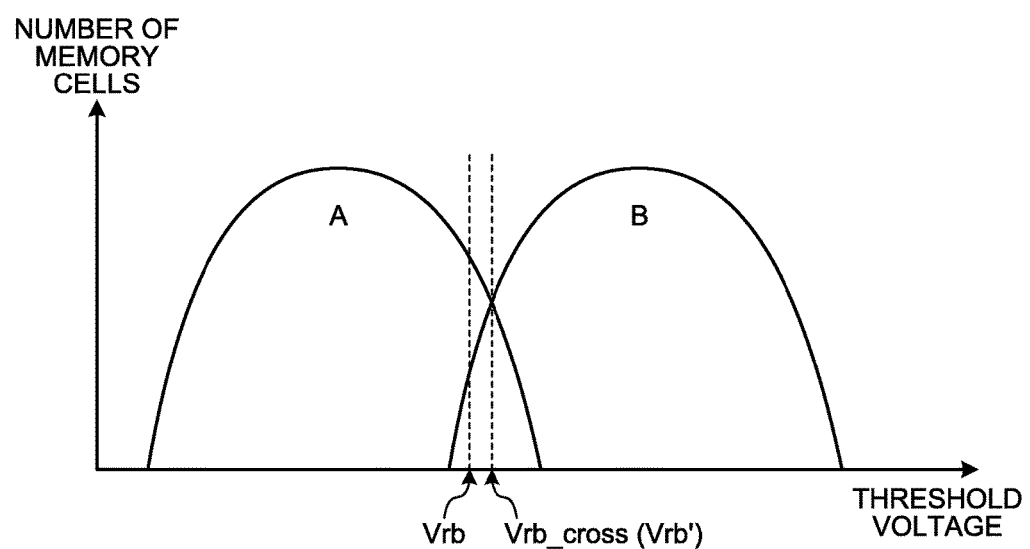
FIG. 4 is a diagram illustrating an example of threshold voltage distributions after variation.

Each threshold voltage distribution may change with time or for every access. FIG. 4 is a diagram illustrating an example of the threshold voltage distributions after variation. In the drawing, only the A level and the B level are illustrated for the purpose of simplification of description. The foot of the threshold voltage distribution of the A level and the foot of the threshold voltage distribution of the B level overlap each other. In other words, the maximum value of the A level is greater than the boundary voltage Vrb and the minimum value of the B level is less than the boundary voltage Vrb. When a memory cell of which the threshold voltage belongs to the A level and the threshold voltage is greater than the boundary voltage Vrb is read, the threshold voltage of the memory cell is decided to belong to the B level. That is, the data value programmed as "110" is read to be "100". When a memory cell of which the threshold voltage belongs to the B level and the threshold voltage is less than the boundary voltage Vrb is read, the threshold voltage of the memory cell is decided to belong to the A level. That is, the data value programmed as "100" is read to be "110". The data value varying from the time of programming is detected as an error by the ECC circuit 260 and correction thereof is tried.

The correction capability of the ECC circuit 260 has an upper limit. The controller 200 can shift the boundary voltages to reduce the number of bits detected as errors (hereinafter, referred to as the number of errors) as much as possible. The controller 200 estimates a boundary voltage with which the number of errors is minimized. The process of estimating the boundary voltage with which the number of errors is minimized is referred to as an estimation process. The boundary voltage with which the number of errors is minimized is referred to as an optimal boundary voltage.

In FIG. 4, when a voltage Vrb_cross at a cross point of the threshold voltage distribution of the A level and the threshold voltage distribution of the B level is used as a boundary voltage, the sum of the number of errors in which the data value "110" is read to be the data value "100" and the number of errors in which the data value "100" is read to be the data value "110" becomes smallest. That is, the voltage Vrb_cross is the optimal boundary voltage of the B reading. Hereinafter, the optimal boundary voltage of X-reading is referred to as Vrx' (where x is a, b, c, d, e, f, or g).

The controller 200 estimates the optimal boundary voltages and sets the estimated values of the optimal boundary voltages in the NAND memory 100. The estimated values of the optimal boundary voltages may not be substantially equal to the optimal boundary voltages. The NAND memory 100 performs reading from the memory cell array 110 using the estimated values of the optimal boundary voltages set by the controller 200. Hereinafter, unless specified otherwise, the estimated value of an optimal boundary voltage is simply referred to as an optimal boundary voltage.

The controller 200 can perform the estimation process at any timing. The controller 200 can start the estimation process with any timing as a trigger. In this embodiment, for example, when the ECC circuit 260 fails in the error correction, the controller 200 performs the estimation process.

The concept of the estimation process will be described below.

The estimation process of estimating the boundary voltages for the lower page will be described with reference to FIGS. 5, 6, and 7. The estimation process of estimating the boundary voltages for the lower page is referred to as a lower estimation process.

According to the lower estimation process, the optimal boundary voltages Vra' and Vre' are estimated. In the lower estimation process, reading (hereinafter, referred to as shift reading) is performed plural times while changing (shifting) the boundary voltages. Each shift reading included in the lower estimation process is the same as the normal reading on the lower page. More specifically, each shift reading in the lower estimation process is a process of determining a data value of the lower bit by performing the A reading and the E reading. In each of the plural times of shift reading, the boundary voltage Vra and the boundary voltage Vre are shifted. FIG. 5 illustrates various voltages which are used in the lower estimation process. In the example illustrated in FIG. 5, five times of shift reading are performed. In the i-th (where i is an integer between 1 and 5) shift reading (SFTi), Shift_ai is used as the boundary voltage Vra and Shift_ei is used as the boundary voltage Vre. Specifically, in the first shift reading (SFT1), Shift_a1 is used as the boundary voltage Vra and Shift_e1 is used as the boundary voltage Vre. In the second shift reading (SFT2), Shift_a2 is used as the boundary voltage Vra and Shift_e2 is used as the boundary voltage Vre. In the third shift reading (SFT3), Shift_a3 is used as the boundary voltage Vra and Shift_e3 is used as the boundary voltage Vre. In the fourth shift reading (SFT4), Shift_a4 is used as the boundary voltage Vra and Shift_e4 is used as the boundary voltage Vre. In the fifth shift reading (SFT5), Shift_a5 is used as the boundary voltage Vra and Shift_e5 is used as the boundary voltage Vre. The amount of shifting each boundary voltage by shift reading may be fixed or may not be fixed. Here, for example, it is assumed that the amount of shifting each boundary voltage is fixed.

In each estimation process, reading for acquiring mask data is performed in addition to the shift reading. Read data of shift reading is generated by operations using sense results of plural times of single-level reading. The mask data is used to separate the sensing result of each single-level reading from the read data of the shift reading. Reading for acquiring the mask data is referred to as mask data reading. In the mask data reading, a specific voltage is applied to the selection word line WL. The specific voltage is a voltage between two neighboring optimal boundary voltages to be estimated. For example, a voltage which is sufficiently distant from the two neighboring optimal boundary voltages to be estimated is used as the specific voltage.

In the lower estimation process, for example, the C reading is performed as the mask data reading. That is, the sensing result CR of the C reading is used as the mask data.

Figure 5:
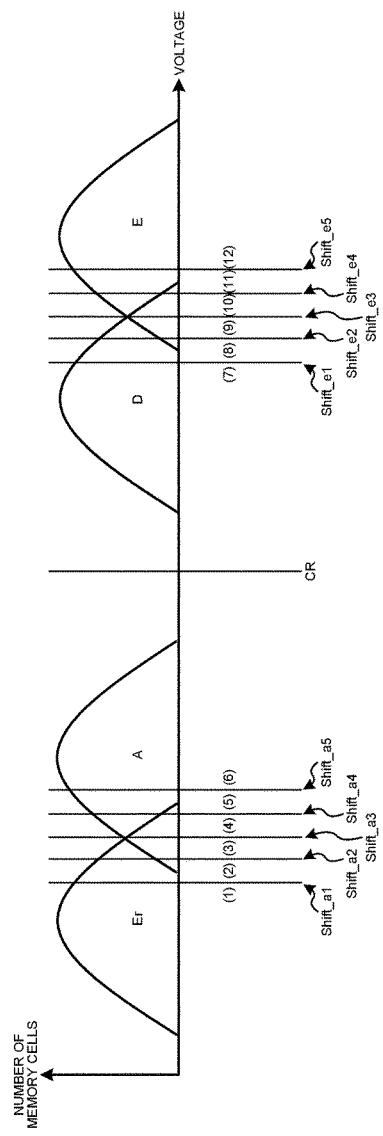
FIG. 5 is a diagram illustrating voltages used in a lower estimation process.

In the lower estimation process, a range in which the threshold voltages of the memory cells can be present is divided into 12 sections ((1) to (12) in FIG. 5) by the boundary voltages used in five times of shift reading and the boundary voltage Vrc used in one time of C reading. FIG. 6 illustrates, for each section, data values acquired by five times of shift reading (SFT1 to SFT5) and the sensing result CR.

For example, in a case of a memory cell of which the threshold voltage is included in section (3), the state of the memory cell is determined to be "0 (a state in which the memory cell is the ON state)" by the C reading. The lower bit stored in the memory cell is determined to be "0" by the shift reading SFT1 and the shift reading SFT2, and is determined to be "1" by the shift reading SFT3, the shift reading SFT4, and the shift reading SFT5.

For example, a memory cell of which the threshold voltage is included in section (1) and a memory cell of which the threshold voltage is included in section (12) are the same in a result of five times of shift reading, but are different from each other in the sensing result CR. That is, the memory cell of which the threshold voltage is included in section (1) and the memory cell of which the threshold voltage is included in section (12) can be distinguished by the sensing result CR.

In a case where a sensing result CR for a memory cell is "0 (a state in which the memory cell is the ON state)", a threshold voltage of the memory cell is decided to be included in the sections (here, sections (1) to (6)) which are near the boundary between the Er level and the A level. In a case where the sensing result CR is "1 (a state in which the memory cell is the OFF state)", the threshold voltage of the memory cell is decided to be included in the sections (here, sections (7) to (12)) which are near the boundary between the D level and the E level. That is, by masking the read data of the five times of shift reading using the sensing result CR, the memory cells of which the threshold voltage is included in the sections near the boundary between the Er level and the A level and the memory cells of which the threshold voltage is included in the sections near the boundary between the D level and the E level from each other can be distinguished from each other.

Accordingly, data equivalent to a sensing result AR which has been used to calculate read data of shift reading can be acquired, from the read data, by assuming that all bits each of which the sensing result of the C reading is "1" should be in the OFF state in a case of A reading. Data equivalent to a sensing result ER which has been used to calculate read data of shift reading can be acquired, from the read data, by assuming that all bits each of which the sensing result of the C reading is "0" should be in the ON state in a case of E reading.

Hereinafter, the sensing results separated from the read data of the shift reading using the mask data is referred to as separated data. The voltage which is used as a boundary voltage in the shift reading may be referred to as a shift reading voltage. The sensing result XR as the separated data acquired by the i-th shift reading may be referred to as XRi.

The plural memory cells belonging to the target word line WL are classified into the sections on the basis of the separated data for each shift reading. The number of memory cells classified into each section is counted for each section. The counting for each section is specifically performed as follows. More specifically, the number of memory cells each having different value between first separated data and second separated data is counted. The first separated data is data acquired by first sift reading in which a first boundary voltage is used. The second separated data is data acquired by second sift reading in which a second boundary voltage is used. The first boundary voltage and the second boundary voltage are adjacent each other through a target section. The counting result corresponds to the number of memory cells classified into the target section. Each section is set as the target section. For example, the numbers of "0"s included in the sensing result ARi as the separated data acquired by the shift reading using Shift_ai and the sensing result ARi+1 as the separated data acquired by the shift reading using Shift_ai+1 are counted. This process corresponds to counting the number of memory cells which are the ON state when Shift_ai is used as the boundary voltage and the number of memory cells which are the ON state when Shift_ai+1 is used as the boundary voltage. After the counting, a difference between the number of "0"s included in the sensing result ARi and the number of "0"s included in the sensing result ARi+1 is calculated. The calculated difference corresponds to the number of memory cells classified into the section between the Shift_ai and Shift_ai+1. It should be noted that the number of memory cells which are the OFF state may be counted. After the numbers of memory cells classified into the sections are counted, the optimal boundary voltages Vra' and Vre' are individually estimated on the basis of the counting result for each section. An arbitrary algorithm can be employed as an algorithm of estimating the optimal boundary voltages Vra' and Vre' on the basis of the counting result for each section.

Figure 7:
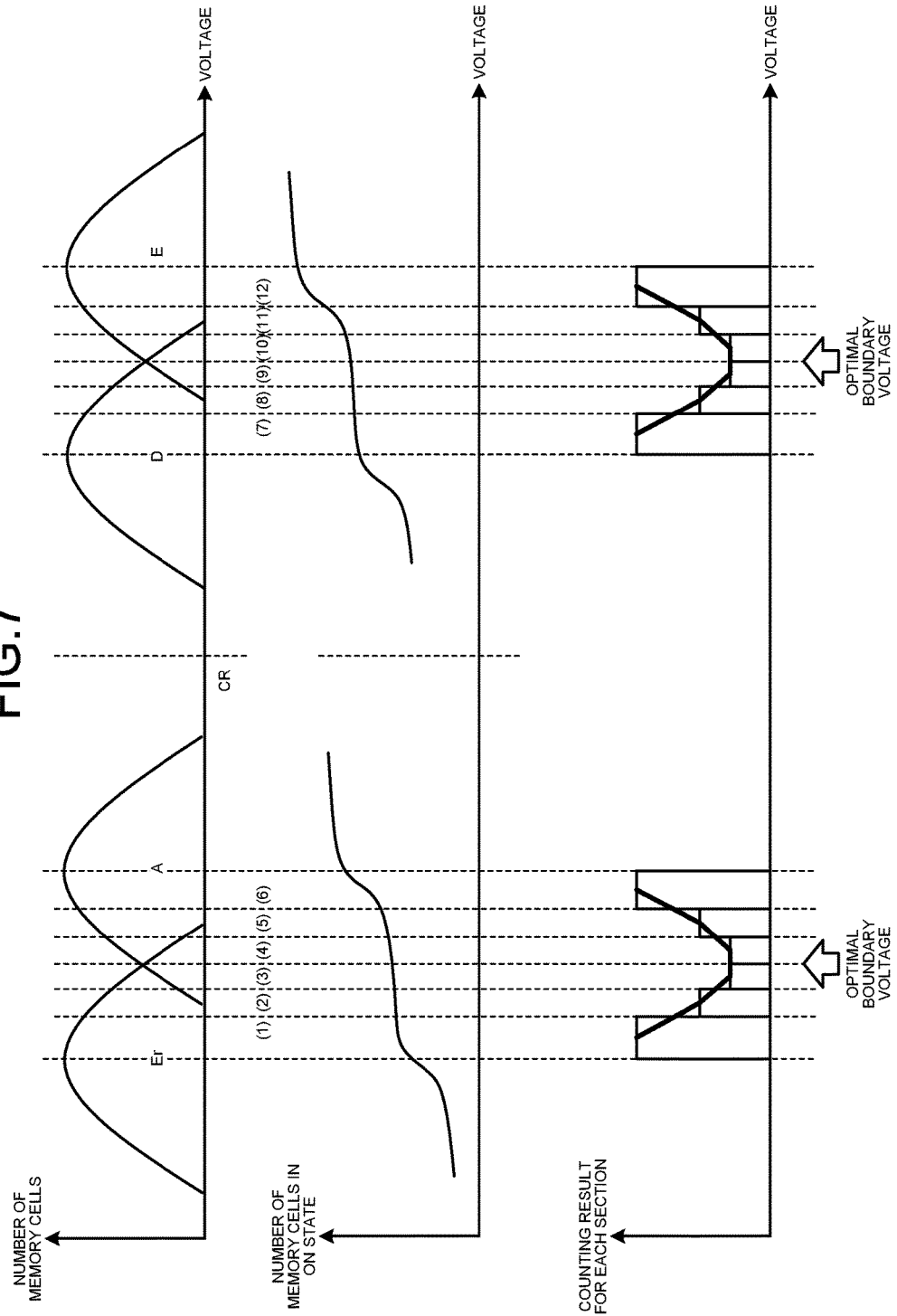
FIG. 7 is a diagram illustrating an example of a counting result in the lower estimation process.

FIG. 7 is a diagram illustrating an example of the counting results. The upper graph is a graph indicating threshold voltage distributions, the middle graph is a graph indicating the number of memory cells which are in the ON state when each shift reading voltage is applied, and the lower graph is a histogram indicating the counting results. In the graphs, the horizontal axis represents voltage. Here, the counting results of sections (2) to (5) and the counting results of sections (8) to (11) are illustrated. As illustrated in the drawing, the difference of the number of memory cells each of which is in the ON state between a case where one shift reading voltage among two neighboring shift reading voltages is used and a case where the other among the two neighboring shift reading voltages is used is calculated as the counting result of the section between the two neighboring shift reading voltages.

According to an example of the algorithm of estimating the optimal boundary voltages, a section in which the counting result becomes smallest is specified in the range of sections (2) to (5). Then, the optimal boundary voltage Vra' is determined on the basis of the specified section among sections (2) to (5). For example, when the counted value of section (4) is smallest among sections (2) to (5), Shift_a3 or Shift_a4 is determined to be the optimal boundary voltage Vra'. For another example, an intermediate value between Shift_a3 and Shift_a4 is determined to be the optimal boundary voltage Vra'. For another example, the counting results of sections (2) to (5) are fitted to an arbitrary curve having the voltage as a variable and the voltage at which a the fitted curve gives a local minimum value is determined to be the optimal boundary voltage Vra'. In a case of FIG. 7, the counting results of section (3) and section (4) are the same and the smallest. The shift reading voltage between section (3) and section (4) may be determined to be the optimal boundary voltage Vra'.

Regarding the optimal boundary voltage Vre', a section in which the counting result becomes smallest in the range of sections (8) to (11) is specified. Thereafter, the optimal boundary voltage Vre' is determined in the same way as the optimal boundary voltage Vra'. That is, for example, when the counted value of section (9) is smallest among sections (8) to (11), Shift_e2 or Shift_e3 is determined to be the optimal boundary voltage Vre'. For another example, an intermediate value between Shift_e2 and Shift_e3 is determined to be the optimal boundary voltage Vre'. For another example, the counting results of sections (8) to (11) are fitted to an arbitrary curve having the voltage as a variable and the voltage at which the fitted curve gives a local minimum value is determined to be the optimal boundary voltage Vre'. In a case of FIG. 7, the counting results of section (9) and section (10) are the same and the smallest. The shift reading voltage between section (9) and section (10) may be determined to be the optimal boundary voltage Vre'.

The estimation process of estimating the boundary voltages for the middle page will be described below with reference to FIGS. 8 and 9. The estimation process of estimating the boundary voltages for the middle page is referred to as a middle estimation process.

Plural times of shift reading are also performed in the middle estimation process. Each shift reading included in the middle estimation process is the same as the normal reading on the middle page. That is, each shift reading in the middle estimation process is same as a process of determining a data value of the middle bit by performing the B reading, the D reading, and the F reading. In each of the plural times of shift reading, the boundary voltage Vrb, the boundary voltage Vrd, and the boundary voltage Vrf are shifted. FIG. 8 illustrates various voltages which are used in the middle estimation process. In the example illustrated in FIG. 8, five times of shift reading are performed. In the i-th (where i is an integer between 1 and 5) shift reading (SFTi), Shift_bi is used as the boundary voltage Vrb, Shift_di is used as the boundary voltage Vrd, and Shift_fi is used as the boundary voltage Vrf. The shift amounts of the boundary voltages may be constant or may be shifted for every performing of the shift reading. For example, it is assumed that the boundary voltages are shifted by the certain amount for each shift reading.

In the middle estimation process, the mask data reading is also performed. An estimation target of the middle estimation process includes three optimal boundary voltages Vrb', Vrd', and Vrf'. Accordingly, the mask data reading using a voltage between the boundary voltage Vrb and the boundary voltage Vrd and the mask data reading using a voltage between the boundary voltage Vrd and the boundary voltage Vrf are performed. Here, the C reading and the E reading are performed as the mask data reading. That is, the sensing result CR of the C reading and the sensing result ER of the E reading are used as the mask data.

Figure 8:
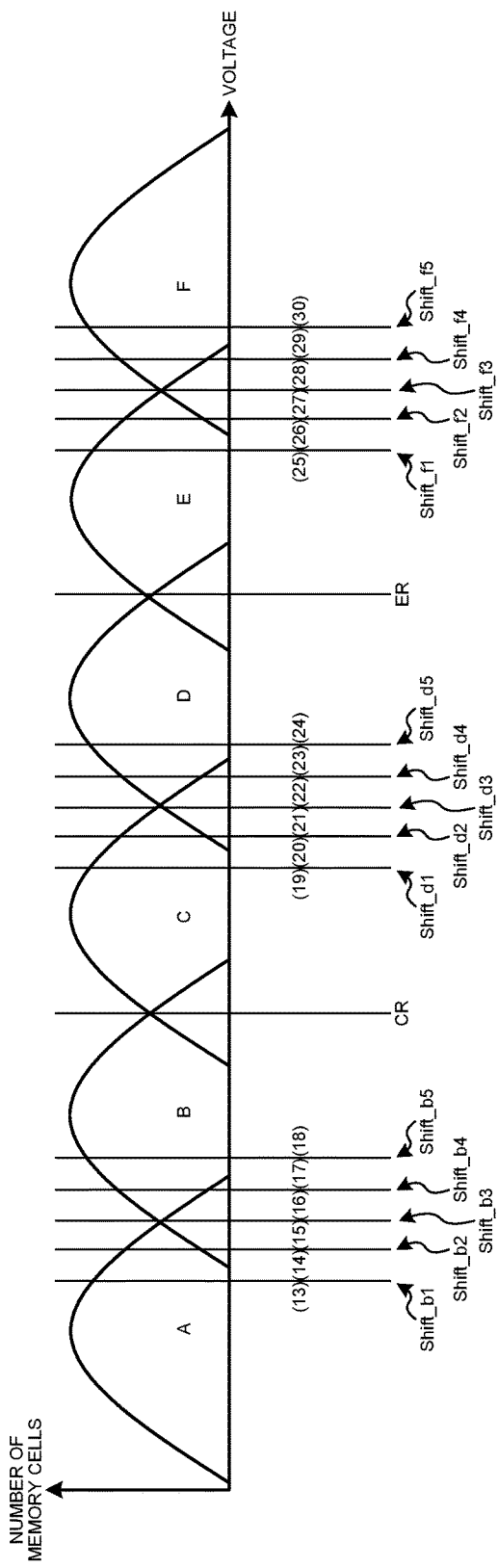
FIG. 8 is a diagram illustrating voltages used in a middle estimation process.

In the middle estimation process, a range in which the threshold voltages of the memory cells can be present is divided into 18 sections ((13) to (30) in FIG. 8) by the voltages used as the boundary voltages in five times of shift reading, the boundary voltage Vrc used in the C reading, and the boundary voltage Vre used in the E reading. FIG. 9 illustrates data values acquired by five times of shift reading (SFT1 to SFT5), the sensing result of the C reading, and the sensing result of the E reading for each section.

In a case where a sensing result CR for a memory cell is "0 (a state in which the memory cell is the ON state)" in the middle estimation process, a threshold voltage of the memory cell is decided to be included in the sections (here, sections (13) to (18)) which are near the boundary between the A level and the B level. In a case where the sensing result CR is "1 (a state in which the memory cell is the OFF state)" and a sensing result ER is "0 (a state in which the memory cell is the ON state)", the threshold voltage of the memory cell is decided to be included in the sections (here, sections (19) to (24)) which are near the boundary between the C level and the D level. In a case where the sensing result CR is "1 (a state in which the memory cell is the OFF state)" and the sensing result ER is "1 (a state in which the memory cell is the OFF state)", the threshold voltage of the memory cell is decided to be included in the sections (here, sections (25) to (30)) which are near the boundary between the E level and the F level. That is, by masking the read data of the five times of shift reading using the sensing result CR and the sensing result ER, the memory cells of which the threshold voltage is included in the sections near the boundary between the A level and the B level, the memory cells of which the threshold voltage is included in the sections near the boundary between the C level and the D level, and the memory cells of which the threshold voltage is included in the sections near the boundary between the E level and the F level from each other can be distinguished.

Accordingly, data equivalent to a sensing result BR which has been used to calculate read data of shift reading can be acquired, from the read data, by assuming that all bits each of which the sensing result of the C reading is "1" should be in the OFF state in a case of B reading. Data equivalent to a sensing result DR which has been used to calculate the read data can be acquired, from the read data, by assuming that all bits each of which the sensing result of the C reading is "0" should be in the ON state in a case of D reading and all bits each of which the sensing result of the E reading is "1" should be in the OFF state in the case of D reading. Data equivalent to a sensing result FR which has been used to calculate the read data can be acquired, from the read data, by assuming that all bits each of which the sensing result of the E reading is "0" should be in the ON state in a case of F reading.

In the middle estimation process, the plural memory cell transistors MT belonging to the target word line WL are classified into the sections on the basis of the separated data for each shift reading and are counted for each section. The counting for each section is, for example, performed in the same manner as the lower estimation process. The optimal boundary voltages Vrb', Vrd', and Vrf' are individually estimated on the basis of the counting result for each section. Similarly to the lower estimation process, an arbitrary algorithm can be employed as an algorithm of acquiring the optimal boundary voltages Vrb', Vrd', and Vrf' on the basis of the counting result for each section.

The estimation process of estimating the boundary voltages for the upper page will be described below with reference to FIGS. 10 and 11. The estimation process of estimating the boundary voltages for the upper page is referred to as an upper estimation process.

Plural times of shift reading are also performed in the upper estimation process. Each shift reading included in the upper estimation process is the same as the normal reading on the upper page. That is, each shift reading in the upper estimation process is same as a process of determining a data value of the upper bit by performing the C reading and the G reading. In each of the plural times of shift reading, the boundary voltage Vrc and the boundary voltage Vrg are shifted. FIG. 10 illustrates various voltages which are used in the upper estimation process. In the example illustrated in FIG. 10, five times of shift reading are performed. In the i-th (where i is an integer between 1 and 5) shift reading (SFTi), Shift_ci is used as the boundary voltage Vrc and Shift_gi is used as the boundary voltage Vrg. The shift amounts of the boundary voltages may be constant or may be shifted for every performing of the shift reading. For example, it is assumed that the boundary voltages are shifted by the certain amount for each shift reading.

In the upper estimation process, the mask data reading is also performed. An estimation target of the upper estimation process includes optimal boundary voltages Vrc' and Vrg'. Accordingly, the mask data reading using a voltage between the boundary voltage Vrc and the boundary voltage Vrg is performed. Here, the E reading is performed as the mask data reading. That is, the sensing result ER of the E reading is used as the mask data.

Figure 10:
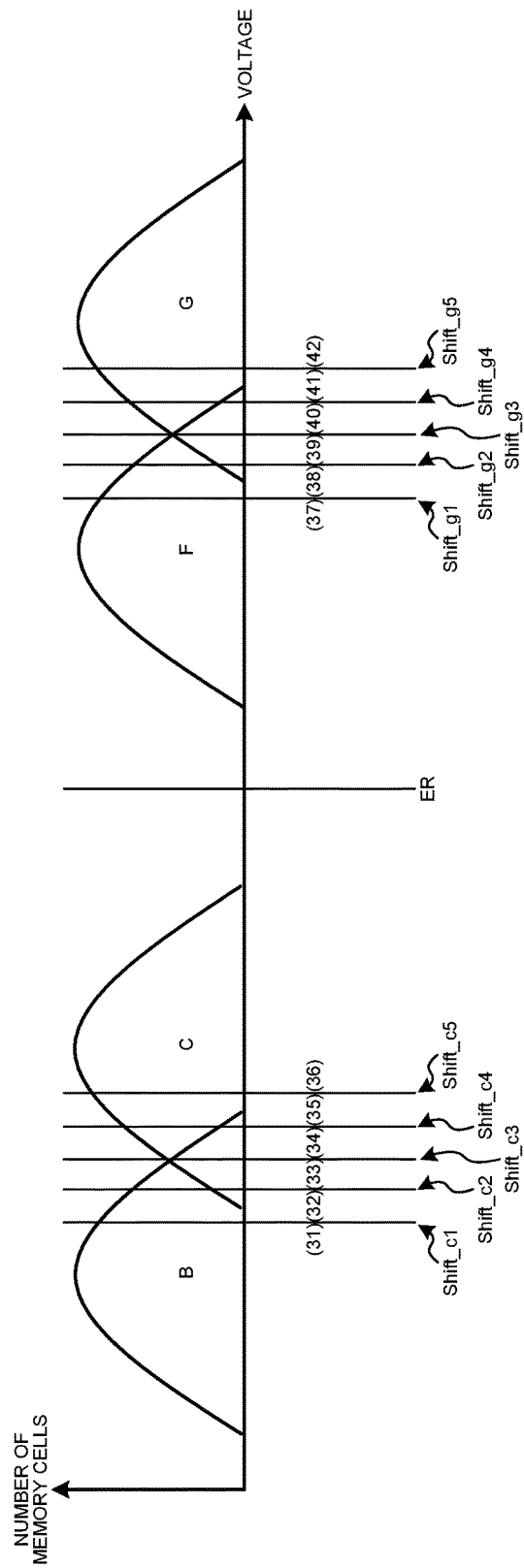
FIG. 10 is a diagram illustrating voltages used in an upper estimation process.

In the upper estimation process, a range in which the threshold voltages of the memory cells can be present is divided into 12 sections ((31) to (42) in FIG. 10) by the voltages used as the boundary voltages in five times of shift reading and the boundary voltage Vre used in the E reading. FIG. 11 illustrates data values acquired by five times of shift reading (SFT1 to SFT5) and the sensing result of the E reading for each section.

In a case where a sensing result ER for a memory cell is "0 (a state in which the memory cell is the ON state)", the threshold voltage of the memory cell is decided to be included in the sections (here, sections (31) to (36)) which are near the boundary between the B level and the C level. In a case where the sensing result ER is "1 (a state in which the memory cell is the OFF state)", the threshold voltage of the memory cell is decided to be included in the sections (here, sections (37) to (42)) which are near the boundary between the F level and the G level. That is, by masking the read data of the five times of shift reading using the sensing result ER of the E reading, the memory cells of which the threshold voltage is included in the sections near the boundary between the B level and the C level and the memory cells of which the threshold voltage is included in the sections near the boundary between the F level and the G level can be distinguished from each other.

Accordingly, data equivalent to a sensing result CR which has been used to calculate read data of shift reading can be acquired, from the read data, by assuming that all bits each of which the sensing result of the E reading is "1" should be in the OFF state in a case of C reading. Data equivalent to a sensing result GR which has been used to calculate read data of shift reading can be acquired, from the read data, by assuming that all bits each of which the sensing result of the E reading is "0" should be in the ON state in a case of G reading.

In the upper estimation process, the plural memory cell transistors MT belonging to the target word line WL are classified into the sections on the basis of the separated data for each shift reading and are counted for each section. The counting for each section is, for example, performed in the same manner as the lower estimation process. The optimal boundary voltages Vrc' and Vrg' are individually estimated on the basis of the counting result for each section. Similarly to the lower estimation process, an arbitrary algorithm can be employed as an algorithm of acquiring the optimal boundary voltages Vrc' and Vrg' on the basis of the counting result for each section.

Figure 12:
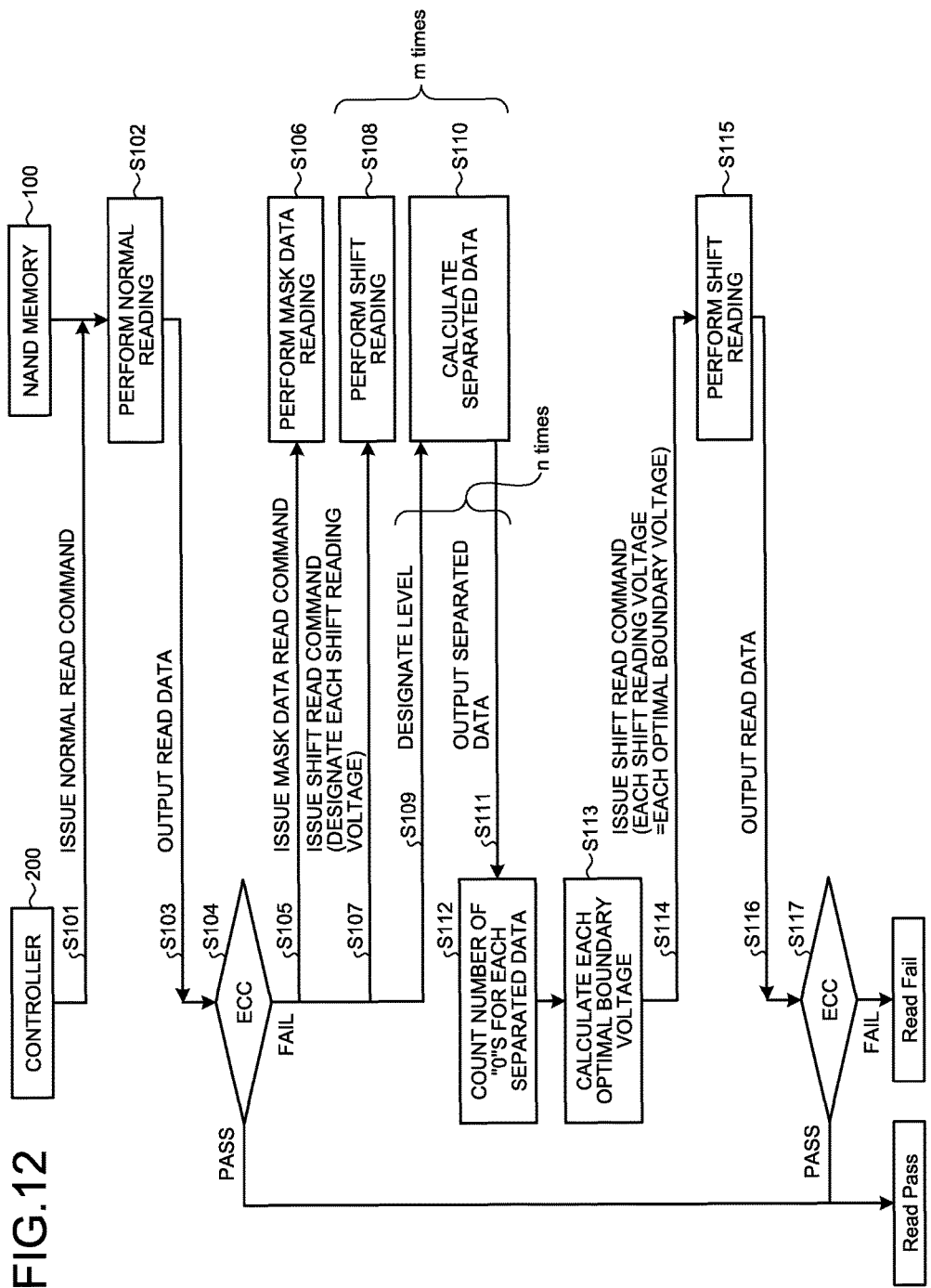
FIG. 12 is a flowchart illustrating an operation of the memory system according to the first embodiment.

FIG. 12 is a flowchart illustrating the operation of the memory system 1 according to the first embodiment.

First, the CPU 230 of the controller 200 issues a normal read command in response to a command from the host device 300, and transmits the issued normal read command to the NAND memory 100 (S101). At this time, the CPU 230 also transmits a block address and a page address to the NAND memory 100.

The normal read command is stored, for example, in the command register 160 of the NAND memory 100. In response thereto, the sequencer 170 performs normal reading (S102). The read data of the normal reading is stored in the latch circuit XDL.

The controller 200 outputs the read data stored in the latch circuit XDL to the NAND memory 100 (S103). The read data is held, for example, in the buffer memory 240 of the controller 200 via the NAND interface. Then, the ECC circuit 260 checks whether an error or errors are present in the read data and corrects the error or errors when the error or errors are present (S104). When no error is present or when the number of errors is equal to or less than a predetermined value and when the error or errors can be corrected (S104, Pass), the data reading is completed (Read Pass).

On the other hand, when the number of errors is greater than the predetermined value, the ECC circuit 260 cannot correct the errors (S104, Fail). Accordingly, the CPU 230 starts the estimation process.

In the estimation process, first, the CPU 230 issues a mask data read command which is a command for requesting for the mask data reading and transmits the issued mask data read command to the NAND memory 100 (S105). At this time, the CPU 230 transmits information indicating a target word line and a level of the mask data reading to the NAND memory 100. The target word line is, for example, the same as a target word line of the normal reading in S102. It is possible to determine which of the lower page, the middle page, and the upper page the target page is from the page address. When the lower page, the middle page, and the upper page are correlated with levels of the mask data reading and the lower page, the middle page, or the upper page is designated, it is possible to derive the level of the mask data reading. Accordingly, the CPU 230 may transmit the same block address and the same page address as in the normal read command to the NAND memory 100.

The mask data read command is transmitted to the NAND memory 100 in the same manner as the normal read command. In response to the mask data read command, the sequencer 170 performs the mask data reading (S106). The column control circuit 140 stores mask data read by the mask data reading in a certain latch circuit of the latch circuits ADL, BDL, CDL, DDL, and XDL.

In the estimation process, subsequent to the mask data reading, the CPU 230 performs plural times (m times herein) of shift reading.

In S107, first, the CPU 230 issues a shift read command which is a command for requesting shift reading and transmits the issued shift read command to the NAND memory 100 (S107). At this time, the CPU 230 designates at least a target page. In other words, the CPU 230 designates a target bit in the multiple bits held in each memory cell. For example, the CPU 230 transmits information indicating the target page to the NAND memory 100. The target page may be same as that of the normal reading in S102. The CPU 230 may transmit the same block address and the same page address as in the normal read command to the NAND memory 100.

In S107, the CPU 230 designates shift reading voltages. An arbitrary method can be employed as the method of designating the shift reading voltages. For example, a method of designating the shift reading voltages using differences from the boundary voltages used in the normal reading can be employed. For another example, a method of designating the shift reading voltages using digital values can be employed. For another example, a method of designating the shift reading voltages using differences from the boundary voltages used in the previous reading process (the normal reading or previous shift reading) can be employed.

The shift read command is transmitted to the NAND memory 100 in the same manner as the normal read command. In response to the shift read command, the sequencer 170 performs the shift reading (S108). The column control circuit 140 stores read data of the shift reading in a latch circuit other than the latch circuit in which the mask data is stored among the latch circuits ADL, BDL, CDL, DDL, and XDL.

Subsequently, a process of acquiring separated data is performed for each type of single-level reading constituting the shift reading. Specifically, processes of S109 to S112 are performed n times. Here, n is the number of types of single-level reading constituting the shift reading. For example, n is "2" in the lower estimation process or the upper estimation process, and n is "3" in the middle estimation process.

In S109, the CPU 230 designates one of the n types of single-level reading constituting the shift reading (S109). In response to the designation, the sequencer 170 causes the column control circuit 140 to calculate sensing results of the designated types of single-level reading as separated data (S110). The column control circuit 140 stores the separated data acquired by the calculation in the latch circuit XDL. The CPU 230 outputs the separated data stored in the latch circuit XDL (S111). Sensing result of X reading as separated data may be referred to as separated data of the X reading. The separated data is transferred, for example, to the buffer memory 240 of the controller 200 via the NAND interface.

Figure 13:
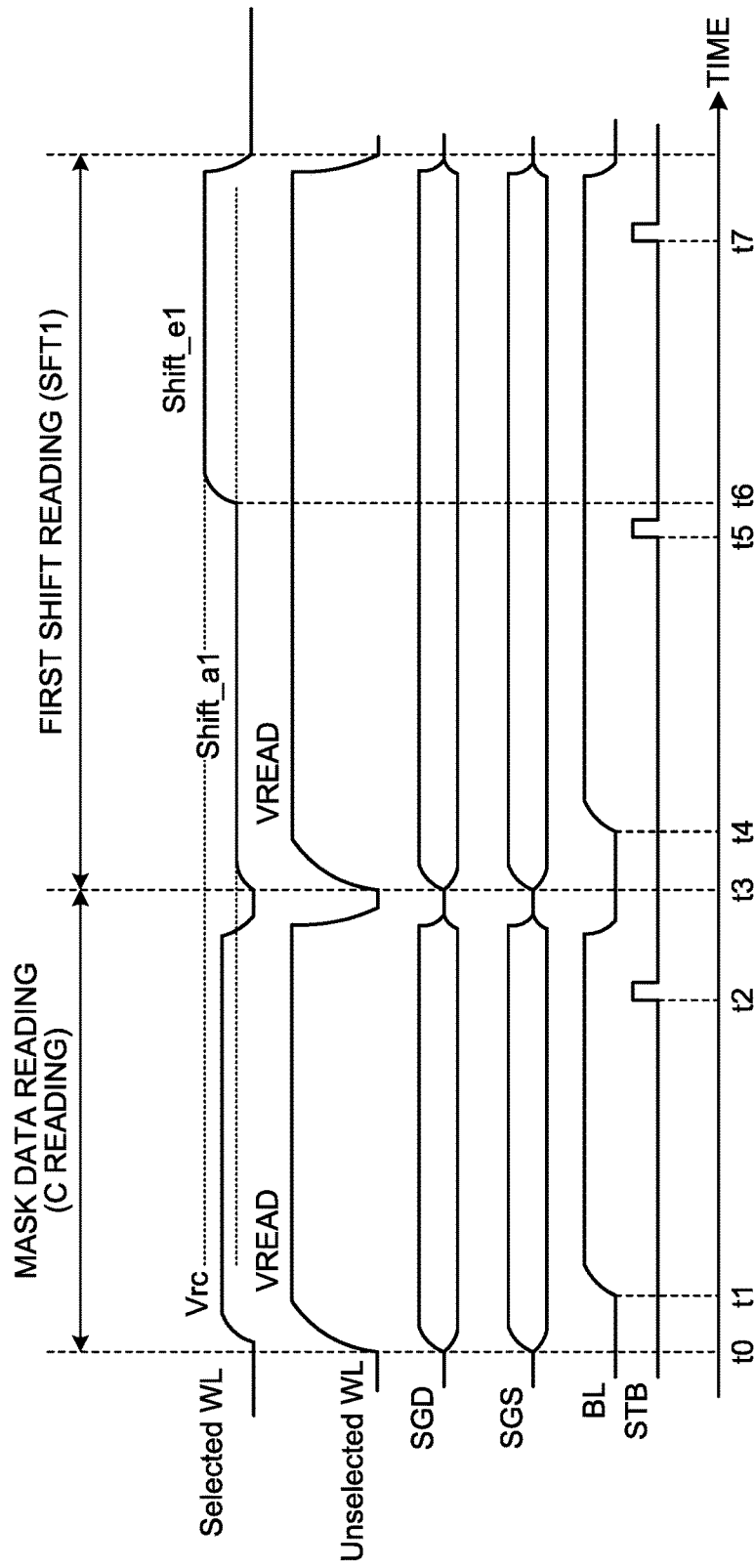
FIG. 13 is a diagram illustrating an example of transition of voltages which are applied to a memory cell array.
Figure 14:
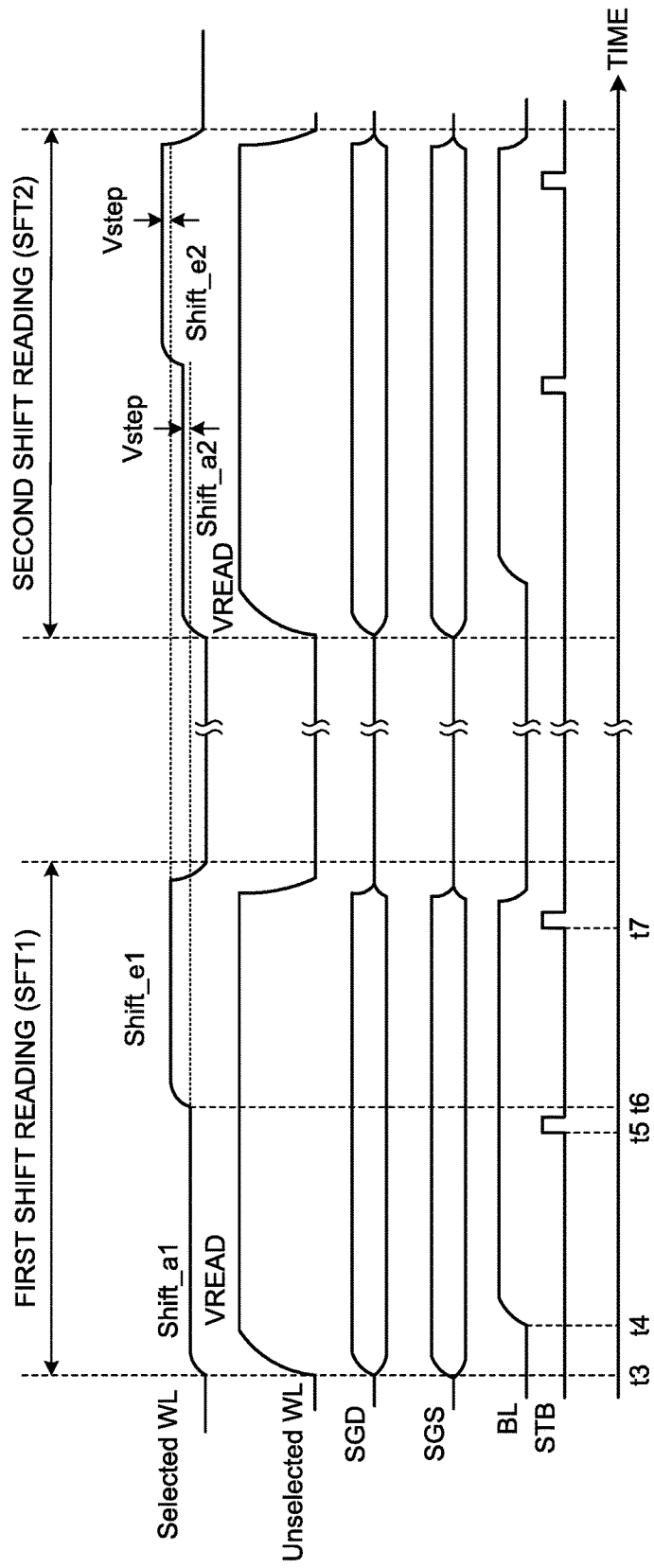
FIG. 14 is a diagram illustrating the example of transition of voltages which are applied to the memory cell array.

FIGS. 13 and 14 are diagrams illustrating an example of transition of various voltages which are applied to the memory cell array 110 by the sequencer 170. Here, the lower estimation process will be described as an example.

As illustrated in FIG. 13, first, the C reading is performed as the mask data reading. In the C reading as the mask data reading, the row decoder 120 starts applying voltages to a selected word line WL (Selected WL), unselected word lines WL (Unselected WL), and the selection gate lines SGD and SGS (time t0).

Specifically, the row decoder 120 applies the boundary voltage Vrc to the selected word line WL. The row decoder 120 applies a voltage VREAD to the unselected word lines WL. As described above, the voltage VREAD is a voltage for changing the state of the memory cell connected to the unselected word lines WL to the ON state regardless of the held data. The row decoder 120 changes the selection transistors ST1 and ST2 to the ON state by applying voltages to the selection gate lines SGD and SGS.

Then, the sense amplifier unit SAU precharges the corresponding bit line BL with a voltage Vbl (time t1). The sense amplifier unit SAU senses whether the state of the memory cell located at a cross point of the corresponding bit line BL and the selected word line WL is the ON state (time t2). The sequencer 170 sets a signal STB to an "H" level. Then, the sense amplifier unit SAU stores the sensing result (the sensing result CR of the C reading) in the latch circuit SDL. The sensing result CR of the C reading is then moved to another latch circuit.

Subsequently, the row decoder 120 resets the various voltages. Then, first shift reading is performed. In the first shift reading, the row decoder 120 starts applying of voltages to the selected word line WL, the unselected word lines WL, and the selection gate lines SGD and SGS (time t3). Specifically, the row decoder 120 applies Shift_a1 as the boundary voltage Vra to the selected word line WL. The row decoder 120 applies the voltage VREAD to the unselected word lines WL. In addition, the row decoder 120 changes the selection transistors ST1 and ST2 to the ON state by applying voltages to the selection gate lines SGD and the SGS.

Then, the sense amplifier unit SAU precharges the corresponding bit line BL (time t4). The sense amplifier unit SAU senses whether the state of the memory cell located at the cross point of the corresponding bit line BL and the selected word line WL is the ON state (time t5). Then, the sense amplifier unit SAU stores the sensing result (the sensing result AR of the A reading) in the latch circuit SDL. Thereafter, the sensing result AR of the A reading is moved to the latch circuit other than the latch circuit in which the sensing result CR is stored.

Then, the row decoder 120 elevates the voltage to the selected word line WL from Shift_a1 to Shift_e1 (time t6). Vrc is approximately a middle value between Shift_a1 and Shift_e1. The sense amplifier unit SAU senses whether the state of the memory cell located at the cross point of the corresponding bit line BL and the selected word line WL is the ON state (time t7). Then, the sense amplifier unit SAU stores the sensing result (the sensing result ER of the E reading) in the latch circuit SDL. The read data of the shift reading is calculated on the basis of the sensing result ER of the E reading and the sensing result AR.

In second shift reading, for example, as illustrated in FIG. 14, the voltage Shift_a2 which is higher by the certain amount (Vstep) than Shift_a1 is used as the boundary voltage Vra and the voltage Shift_e2 which is higher by Vstep than Shift_e1 is used as the boundary voltage Vre. Thereafter, the boundary voltages are elevated by Vstep for every shift reading.

A method of operating the latch circuits from the mask data reading (S106) to the calculation of separated data (S110) will be described below with reference to FIGS. 15 to 36. Method of operating the latch circuits in the lower estimation process, the middle estimation process, and the upper estimation process are, for example, different from each other. The operations of the latch circuits are performed by the operation unit OP.

FIGS. 15 to 23 are diagrams illustrating examples of the method of operating the latch circuits in the lower estimation process. In FIGS. 15 to 23, examples of values in the memory cells of which the threshold voltages are included in sections (1) to (12) illustrated in FIG. 6 are illustrated.

Figure 15:
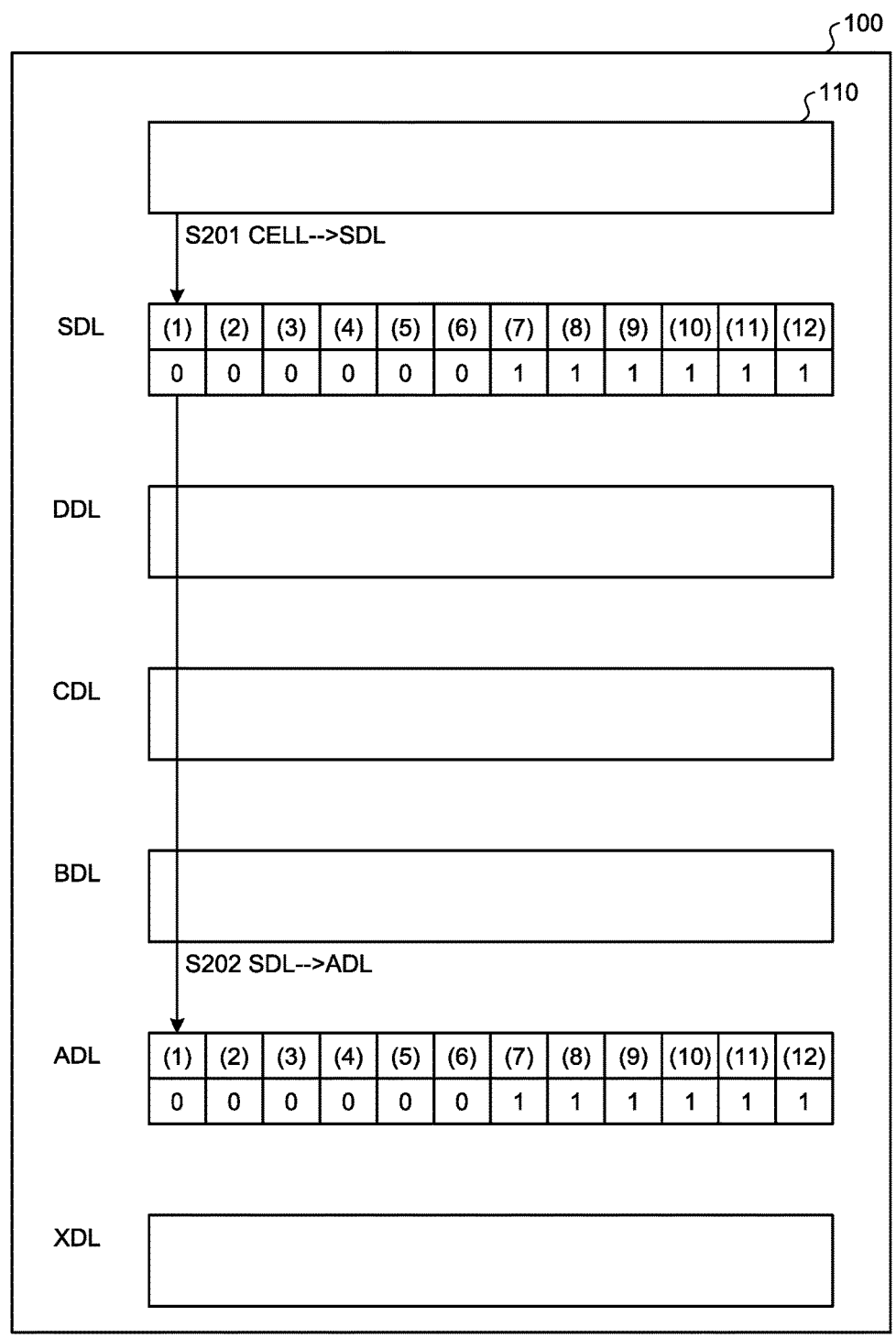
FIG. 15 is a diagram illustrating an example of a method of operating each latch circuit in the lower estimation process according to the first embodiment.

FIG. 15 is a diagram illustrating an example of the method of operating the latch circuits in the mask data reading (S106). As described above, the C reading is performed as the mask data reading in the lower estimation process. The sensing result CR of the C reading is first stored in the latch circuit SDL (S201) and then the data CR stored in the latch circuit SDL is copied to the latch circuit ADL (S202). Accordingly, the sensing result CR of the C reading is stored in the latch circuit ADL. In the memory cells of which the threshold voltages are included in sections (1) to (6), "0" is acquired as the sensing result. In the memory cells of which the threshold voltages are included in sections (7) to (12), "1" is acquired as the sensing result.

Figure 16:
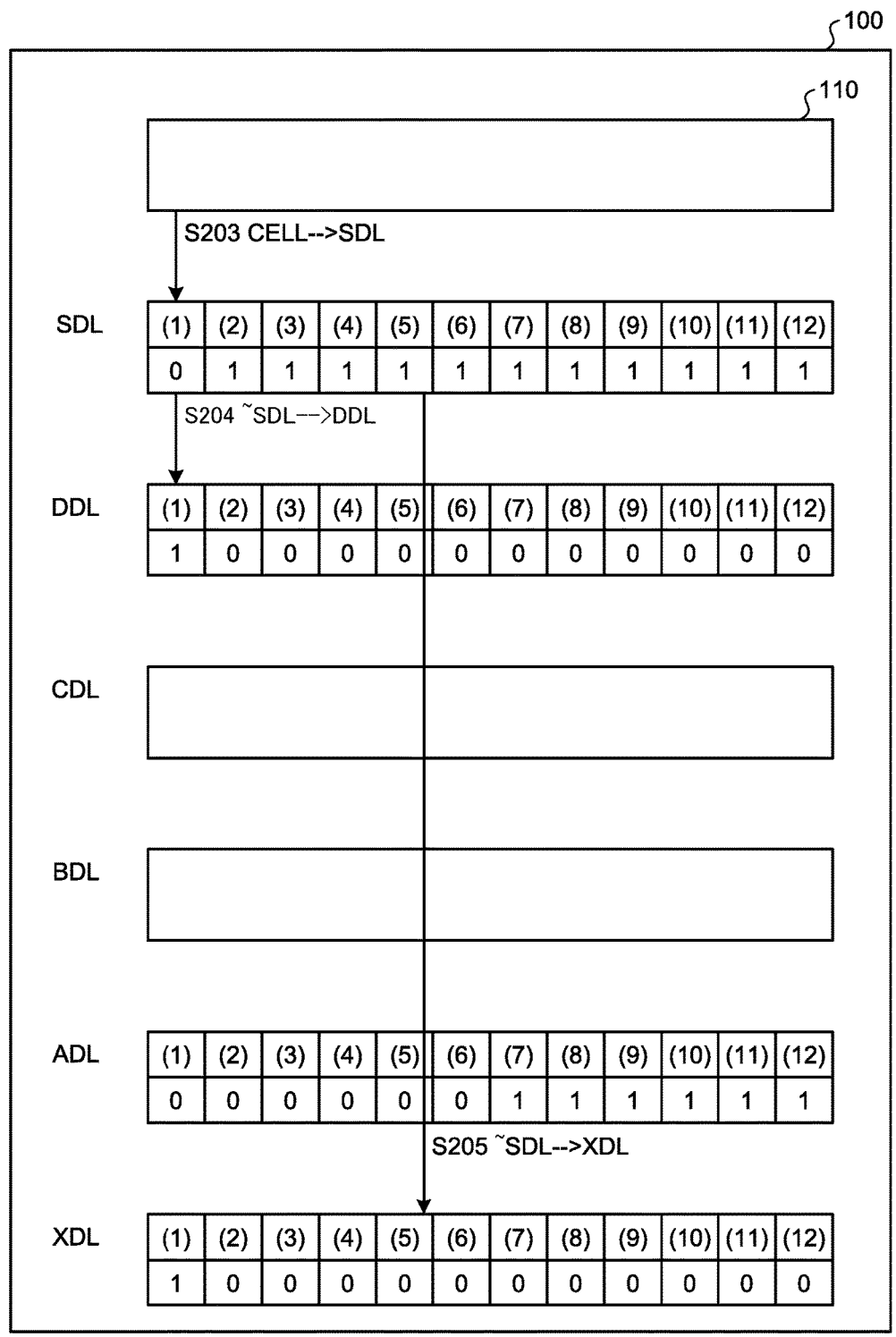
FIG. 16 is a diagram illustrating the example of the method of operating each latch circuit in the lower estimation process according to the first embodiment.

FIG. 16 is a diagram illustrating an example of the method of operating the latch circuits in the A reading of the first shift reading (SFT1). The sensing result AR of the A reading in the first shift reading is first stored in the latch circuit SDL (S203). A NOT operation is performed on the data AR stored in the latch circuit SDL and the data AR which is inverted by the NOT operation is stored in the latch circuit DDL and the latch circuit XDL (S204 and S205).

Figure 17:
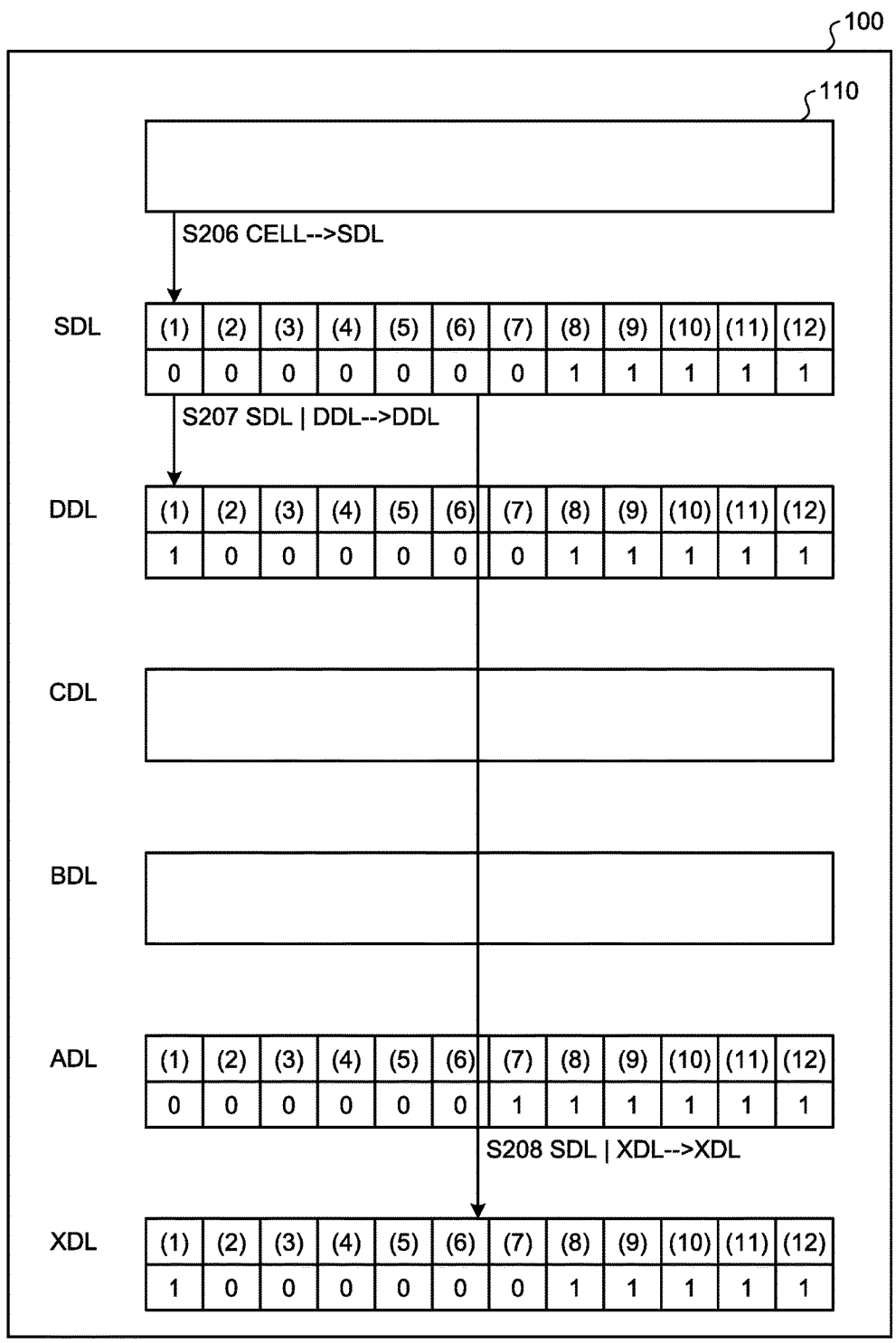
FIG. 17 is a diagram illustrating the example of the method of operating each latch circuit in the lower estimation process according to the first embodiment.

FIG. 17 is a diagram illustrating an example of the method of operating the latch circuits in the E reading of the first shift reading (SFT1). The sensing result ER of the E reading in the first shift reading is first stored in the latch circuit SDL (S206). An OR operation of the data ER stored in the latch circuit SDL and the data stored in the latch circuit DDL (that is, the data AR inverted by the NOT operation) is performed, and the latch circuit DDL is overwritten with the result data of the OR operation (S207). Similarly, an OR operation of the data ER stored in the latch circuit SDL and the data stored in the latch circuit XDL (that is, the data AR inverted by the NOT operation) is performed, and the latch circuit XDL is overwritten with the result data of the OR operation (S208). The read data of the first shift reading is completed in the latch circuit DDL and the latch circuit XDL by S207 and S208. In the read data of the first shift reading, the data value of the memory cells of which the threshold voltages are included in sections (1) and (8) to (12) is "1" and the data value of the memory cells of which the threshold voltages are included in sections (2) to (7) is "0".

Figure 18:
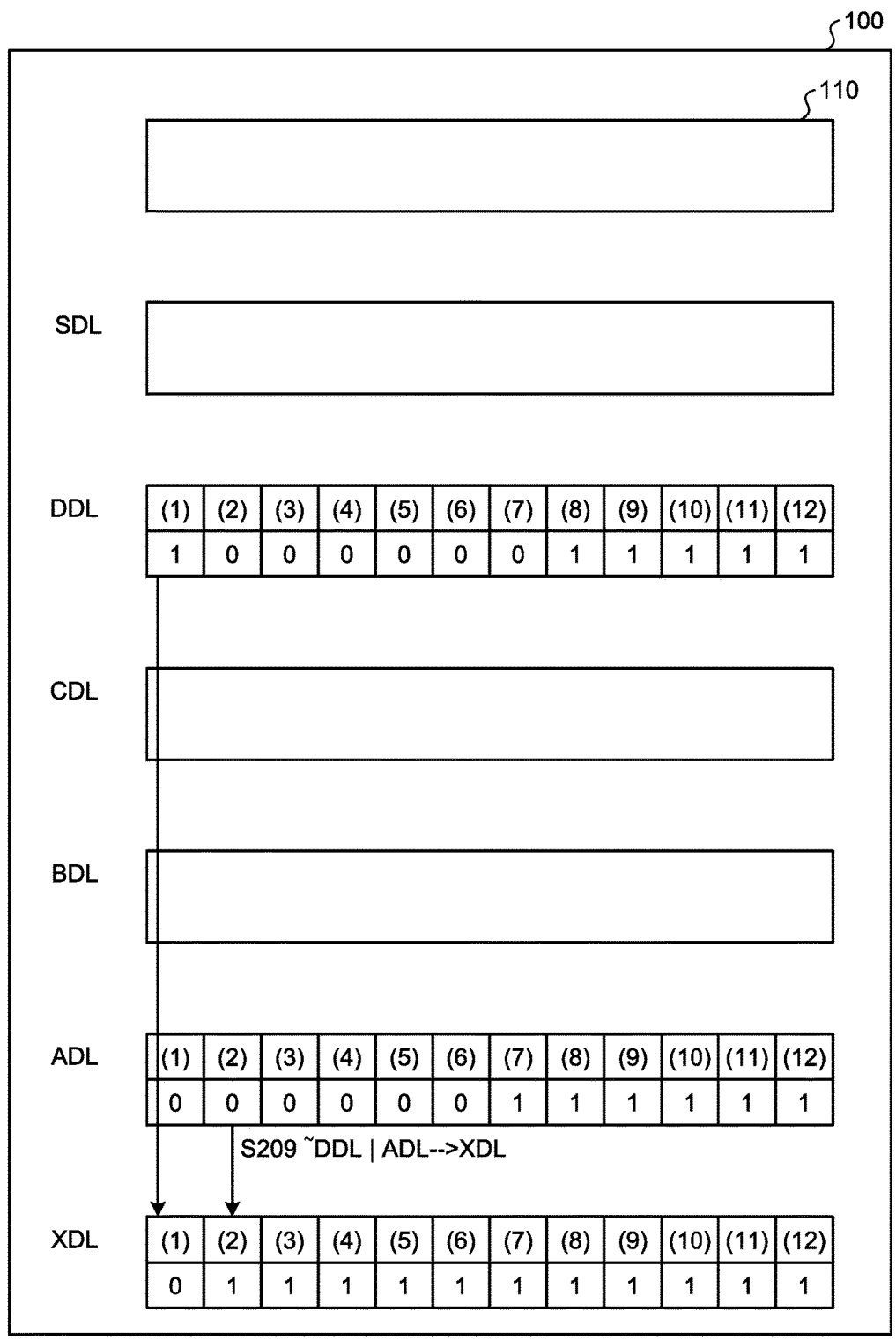
FIG. 18 is a diagram illustrating the example of the method of operating each latch circuit in the lower estimation process according to the first embodiment.

FIG. 18 is a diagram illustrating an example of the method of operating the latch circuits to separate, as separated data of the A reading, the sensing result AR from the read data of the first shift reading (SFT1). The mask data is stored in the latch circuit ADL by the process of S202. The read data of the first shift reading SFT1 is stored in the latch circuit DDL by the process of S207. A NOT operation is performed on the read data of the shift reading SFT1 stored in the latch circuit DDL, an OR operation of the read data of the shift reading SFT1 which is inverted by the NOT operation and the mask data CR stored in the latch circuit ADL is performed, and the latch circuit XDL is overwritten with the result data of the OR operation (S209). The separated data of the A reading is completed in the latch circuit XDL by S209. In the separated data of the A reading, the data value of the memory cells of which the threshold voltages are included in section (1) is "0" and the data value of the memory cells of which the threshold voltages are included in sections (2) to (12) is "1". That is, the separated data of the A reading acquired in S209 is the same as the sensing result AR read from the latch circuit SDL by the A reading constituting the shift reading SFT1 (see S203 in FIG. 16).

Figure 19:
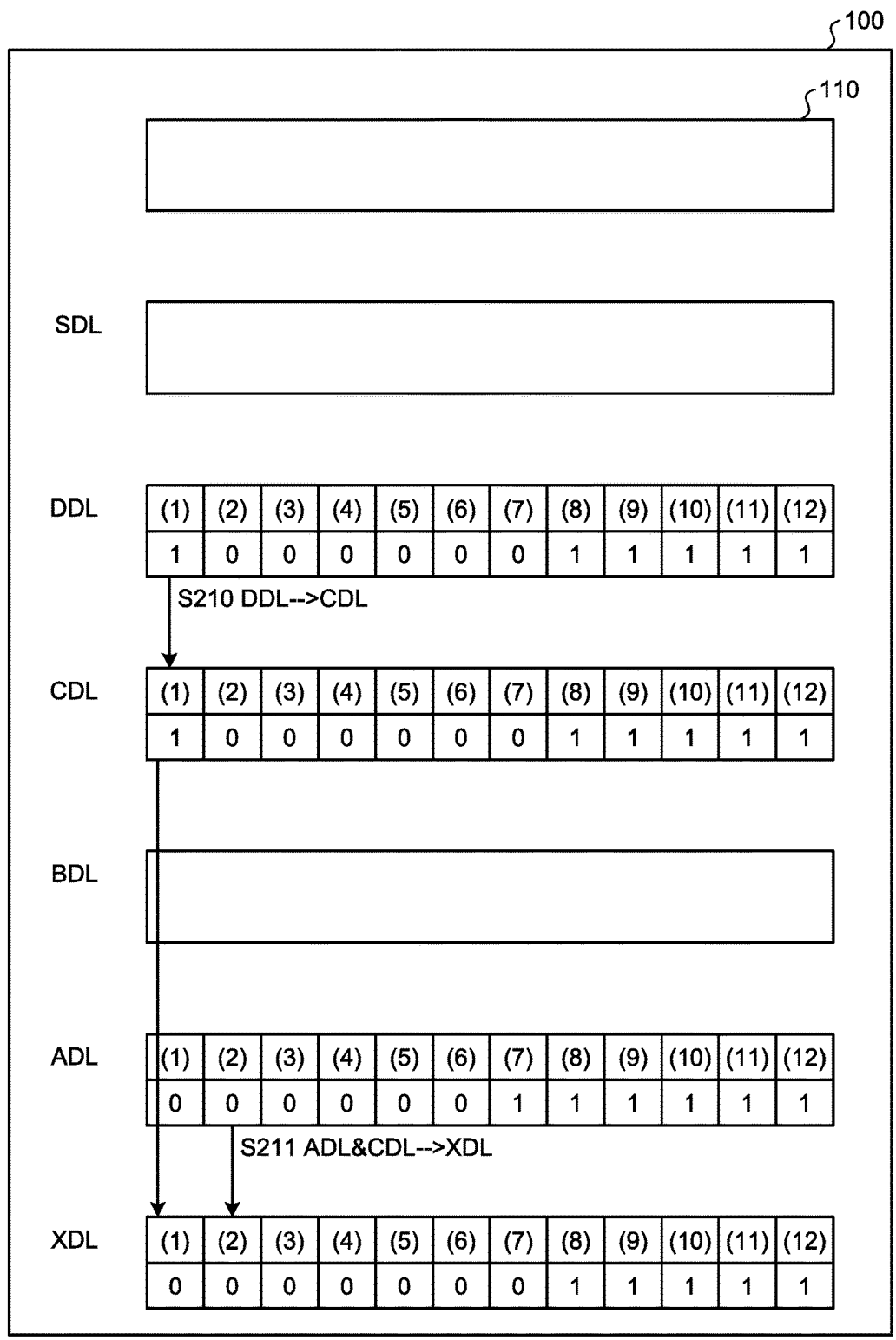
FIG. 19 is a diagram illustrating the example of the method of operating each latch circuit in the lower estimation process according to the first embodiment.

FIG. 19 is a diagram illustrating an example of the method of operating the latch circuits to separate, as separated data of the E reading, the sensing result ER from the read data of the first shift reading (SFT1). The read data of the shift reading SFT1 stored in the latch circuit DDL is copied to the latch circuit CDL (S210). An AND operation of the read data of the shift reading SFT1 stored in the latch circuit CDL and the mask data CR stored in the latch circuit ADL is performed, and the latch circuit XDL is overwritten with the result data of the AND operation (S211). The separated data of the E reading is completed in the latch circuit XDL by S211. In the separated data of the E reading, the data value of the memory cells of which the threshold voltages are included in sections (1) to (7) is "0" and the data value of the memory cells of which the threshold voltages are included in sections (8) to (12) is "1". That is, the separated data of the E reading acquired in S211 is the same as the sensing result ER read from the latch circuit SDL by the E reading constituting the shift reading SFT1 (see S206 in FIG. 17).

The same operations as operating the latch circuits in the first shift reading (SFT1) are performed in the second shift reading or the shift reading subsequent thereto. For the purpose of reference, the operations of the latch circuits in the second shift reading (SFT2) will be described.

Figure 20:
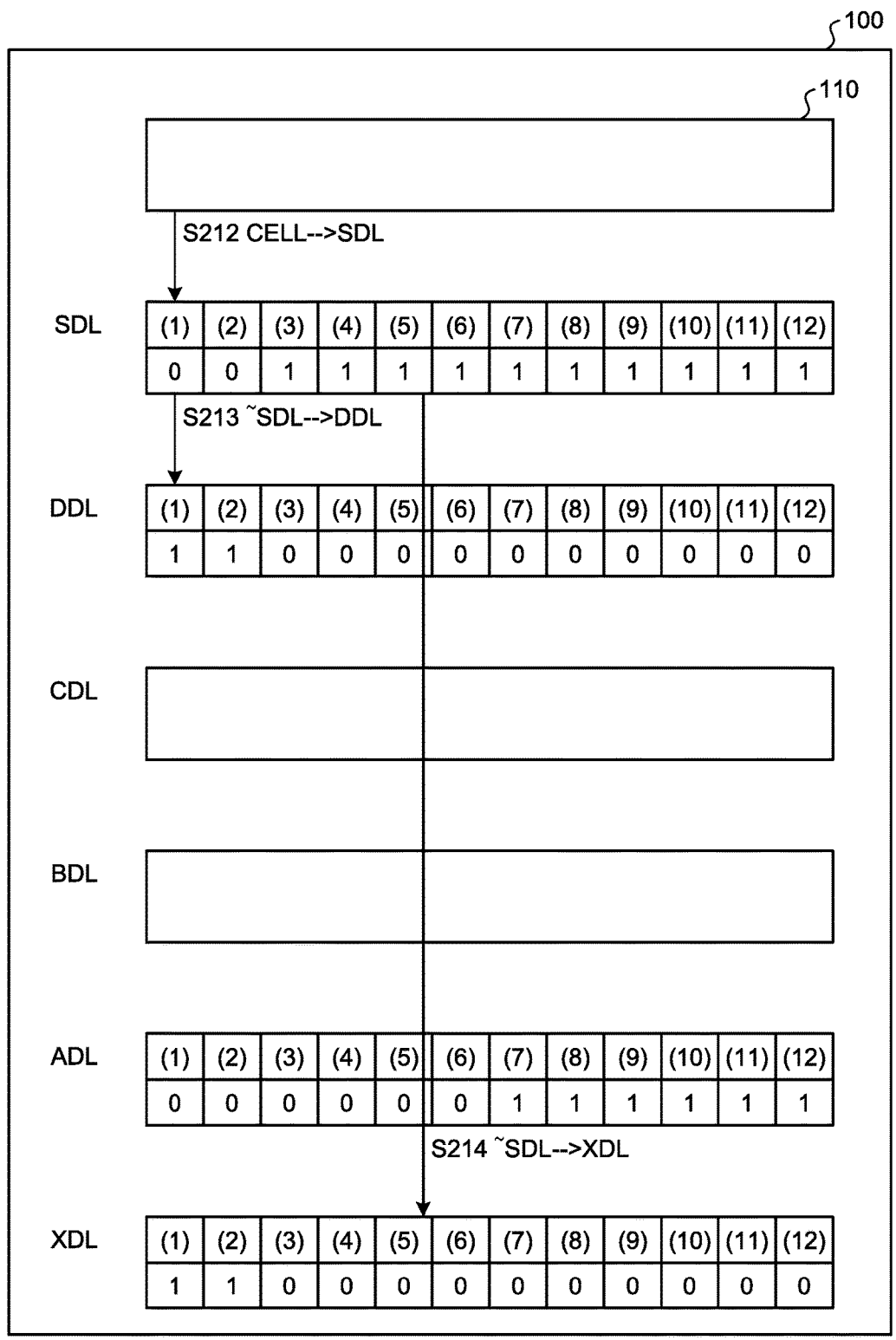
FIG. 20 is a diagram illustrating the example of the method of operating each latch circuit in the lower estimation process according to the first embodiment.

FIG. 20 is a diagram illustrating an example of the method of operating the latch circuits in the A reading of the second shift reading (SFT2). The sensing result AR of the A reading in the second shift reading is stored in the latch circuit SDL (S212). A NOT operation is performed on the data AR stored in the latch circuit SDL and the data AR which is inverted by the NOT operation is stored in the latch circuit DDL and the latch circuit XDL (S213 and S214).

Figure 21:
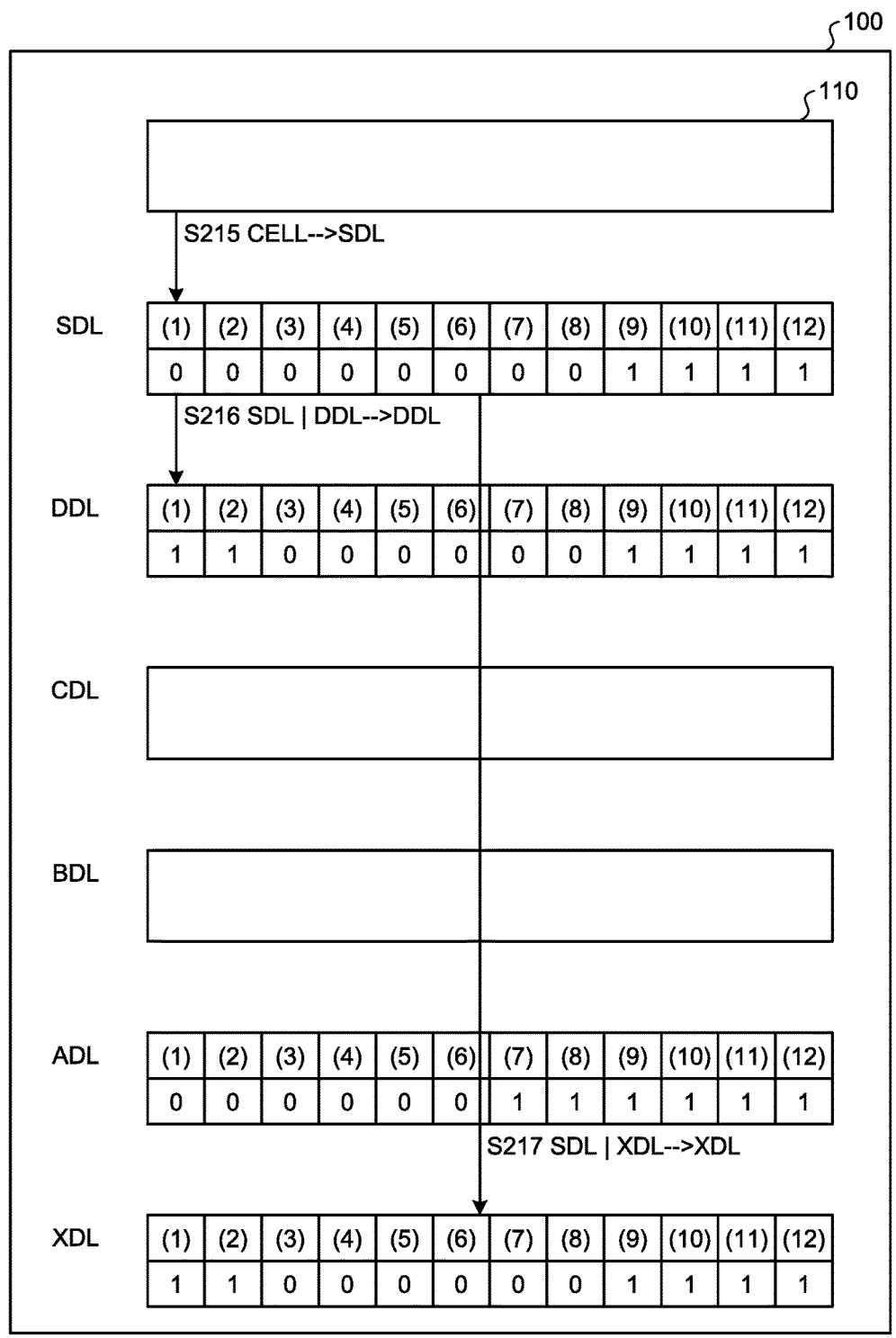
FIG. 21 is a diagram illustrating the example of the method of operating each latch circuit in the lower estimation process according to the first embodiment.

FIG. 21 is a diagram illustrating an example of the method of operating the latch circuits in the E reading of the second shift reading (SFT2). The sensing result ER of the E reading in the second shift reading is stored in the latch circuit SDL (S215). An OR operation of the data ER stored in the latch circuit SDL and the data stored in the latch circuit DDL (that is, the data AR inverted by the NOT operation) is performed, and the latch circuit DDL is overwritten with the result data of the OR operation (S216). Similarly, an OR operation of the data ER stored in the latch circuit SDL and the data stored in the latch circuit XDL (that is, the data AR inverted by the NOT operation) is performed, and the latch circuit XDL is overwritten with the result data of the OR operation (S217). The read data of the second shift reading is completed in the latch circuit DDL and the latch circuit XDL by S216 and S217. That is, the data value of the memory cells of which the threshold voltages are included in sections (1), (2), and (9) to (12) is "1" and the data value of the memory cells of which the threshold voltages are included in sections (3) to (8) is "0".

Figure 22:
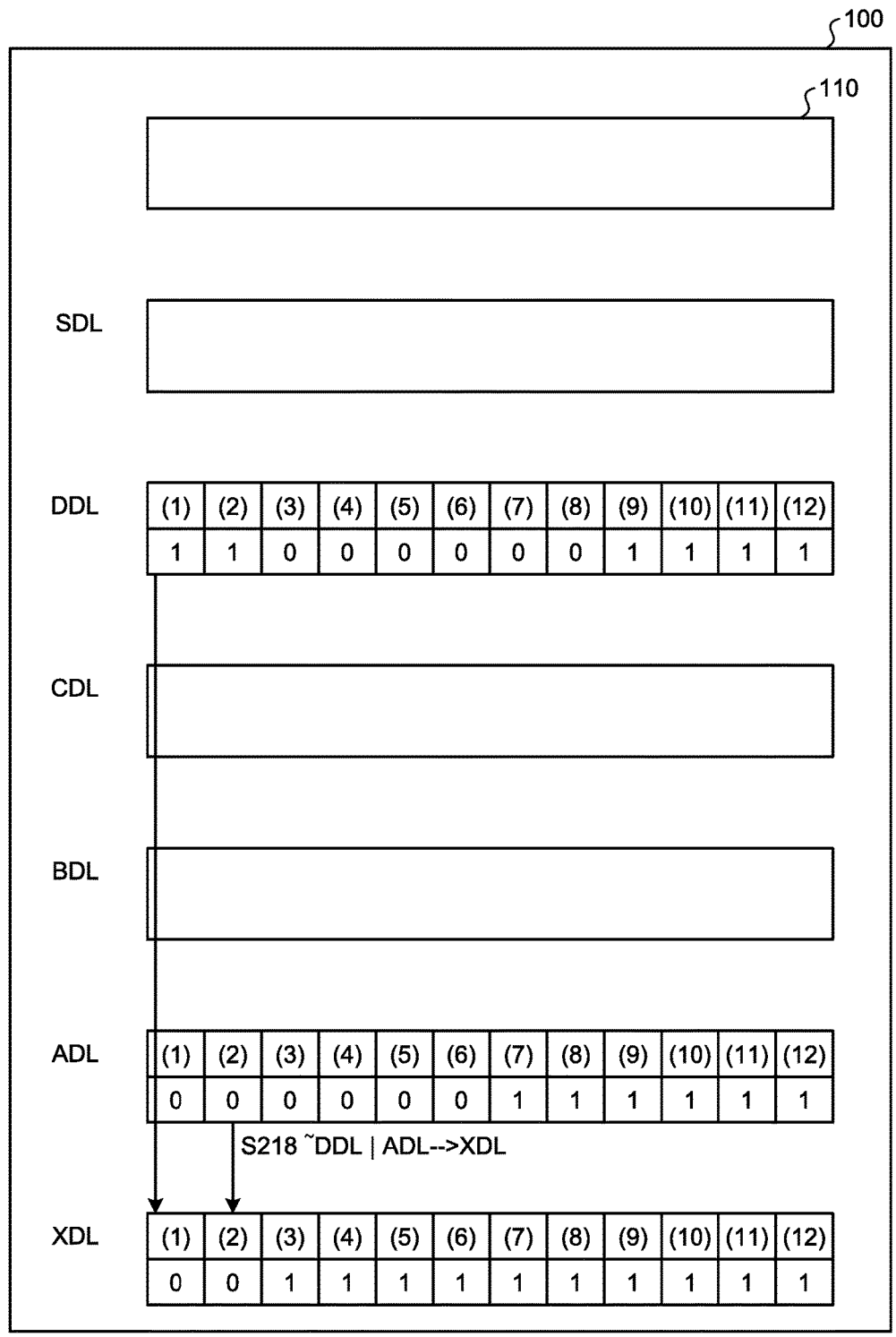
FIG. 22 is a diagram illustrating the example of the method of operating each latch circuit in the lower estimation process according to the first embodiment.

FIG. 22 is a diagram illustrating an example of the method of operating the latch circuits to separate, as separated data of the A reading, the sensing result AR from the read data of the second shift reading (SFT2). A NOT operation is performed on the read data of the shift reading SFT2 stored in the latch circuit DDL, an OR operation of the read data of the shift reading SFT2 which is inverted by the NOT operation and the mask data CR stored in the latch circuit ADL is performed, and the latch circuit XDL is overwritten with the result data of the OR operation (S218). The separated data of the A reading is completed in the latch circuit XDL by the process of S218. In the separated data of the A reading, the data value of the memory cells of which the threshold voltages are included in sections (1) and (2) is "0" and the data value of the memory cells of which the threshold voltages are included in sections (3) to (12) is "1". That is, the separated data of the A reading acquired in S218 is the same as the sensing result AR read from the latch circuit SDL by the A reading constituting the shift reading SFT2 (see S212 in FIG. 20).

Figure 23:
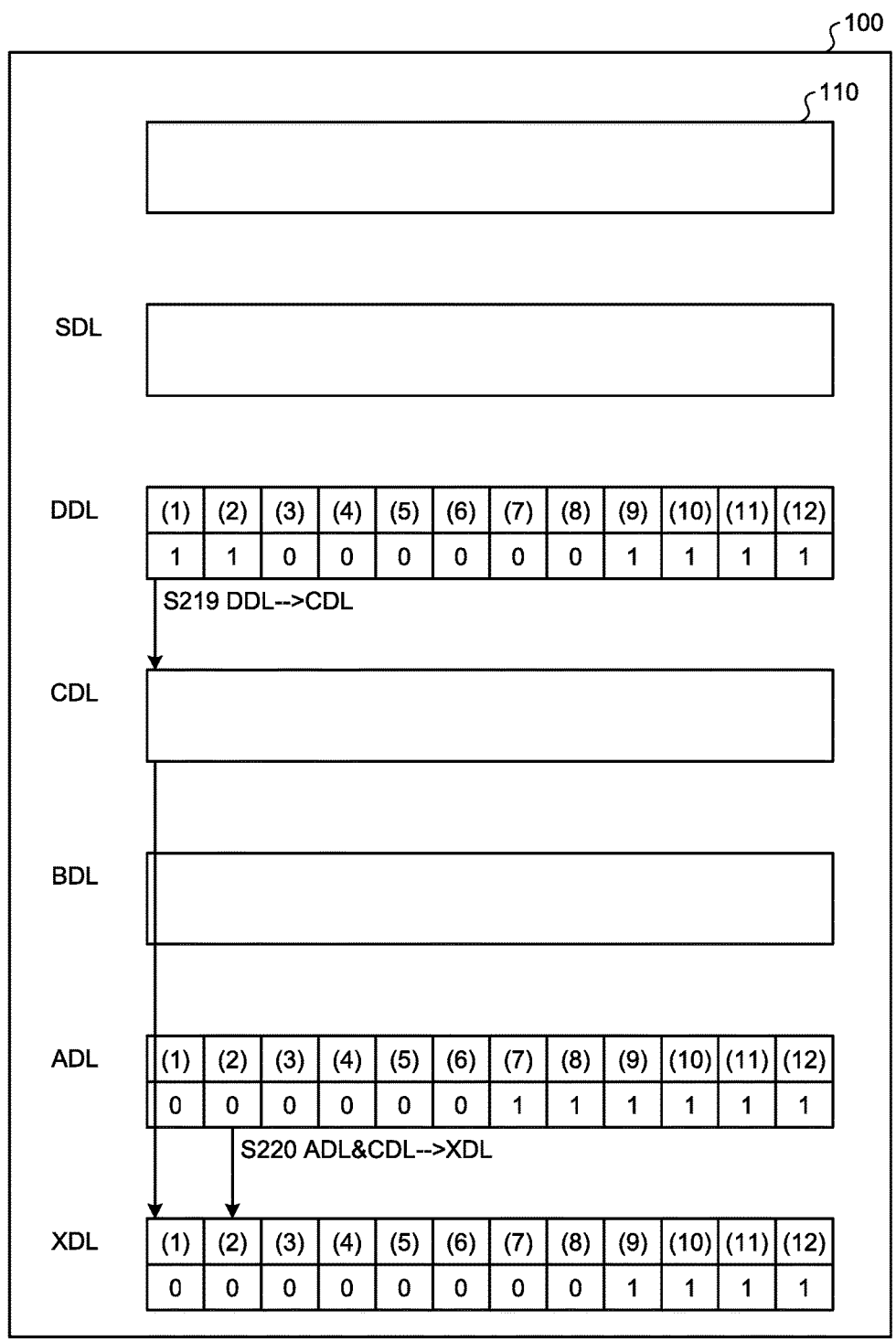
FIG. 23 is a diagram illustrating the example of the method of operating each latch circuit in the lower estimation process according to the first embodiment.

FIG. 23 is a diagram illustrating an example of the method of operating the latch circuits to separate, as separated data of the E reading, the sensing result ER from the read data of the second shift reading (SFT2). The read data of the shift reading SFT2 stored in the latch circuit DDL is copied to the latch circuit CDL (S219). An AND operation of the read data of the shift reading SFT2 stored in the latch circuit CDL and the mask data CR stored in the latch circuit ADL is performed, and the latch circuit XDL is overwritten with the result data of the AND operation (S220). The separated data of the E reading is completed in the latch circuit XDL by S220. In the separated data of the E reading, the data value of the memory cells of which the threshold voltages are included in sections (1) to (8) is "0" and the data value of the memory cells of which the threshold voltages are included in sections (9) to (12) is "1". That is, the separated data of the E reading acquired in S220 is the same as the sensing result ER read from the latch circuit SDL by the E reading constituting the shift reading SFT2 (see S215 in FIG. 21).

FIGS. 24 to 31 are diagrams illustrating examples of the method of operating the latch circuits in the middle estimation process. Hereinafter, exemplification of values for each section will be omitted. Regarding the operation of the latch circuits in the shift reading, an example of the operation in the first shift reading (SFT1) will be described. The operations in the second shift reading and the shift reading subsequent thereto are the same as in the first shift reading (SFT1).

Figure 24:
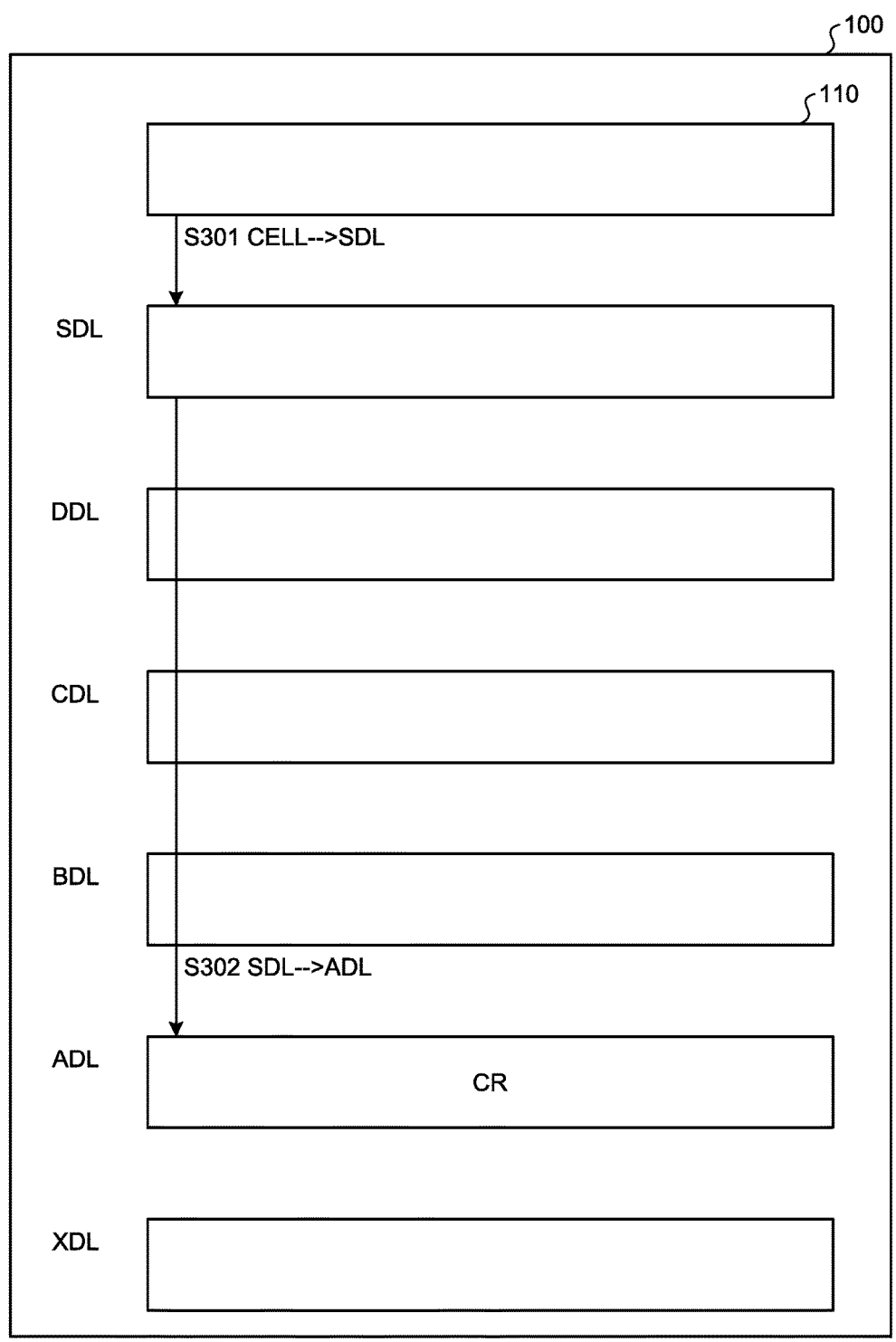
FIG. 24 is a diagram illustrating an example of a method of operating each latch circuit in the middle estimation process according to the first embodiment.
Figure 25:
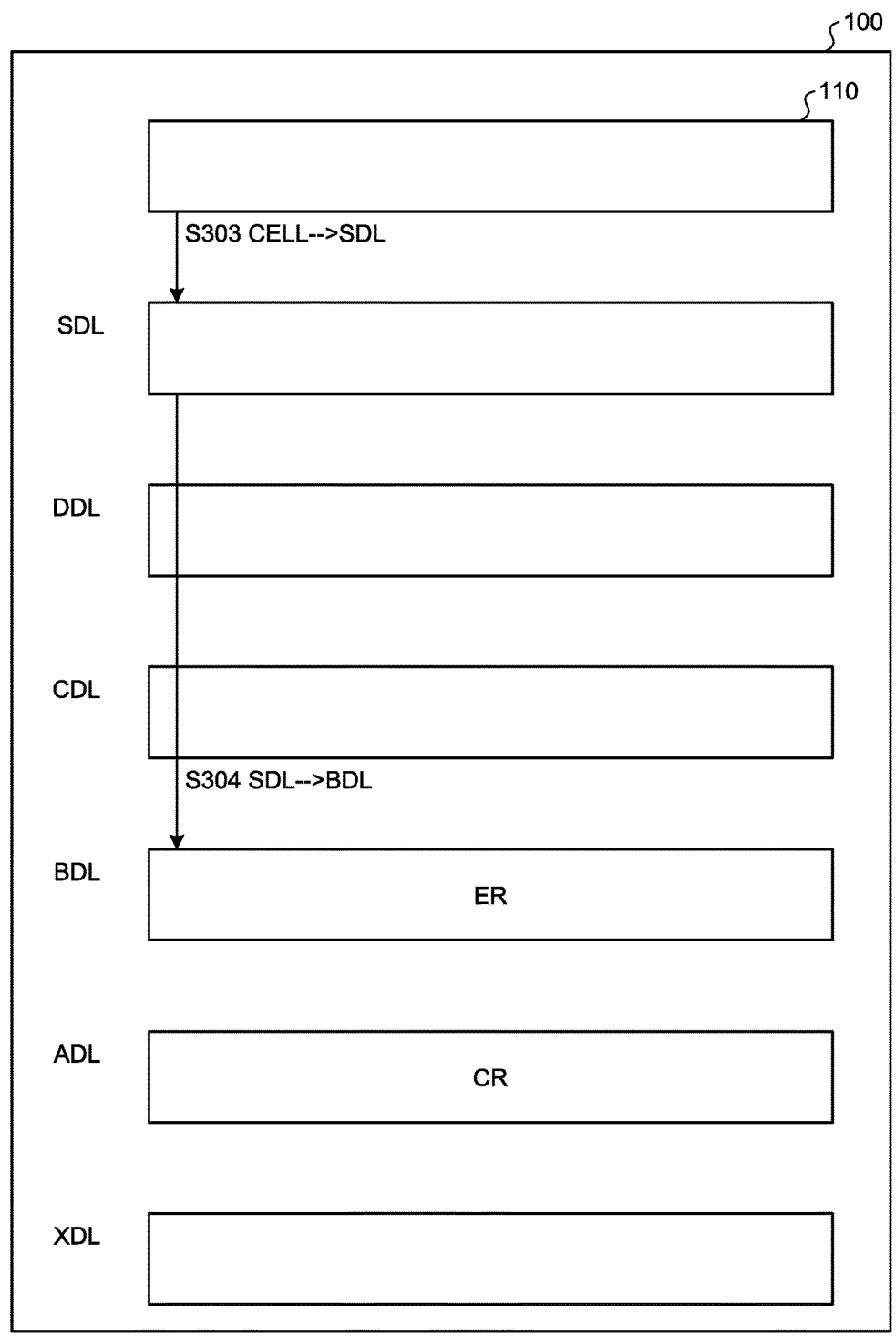
FIG. 25 is a diagram illustrating the example of the method of operating each latch circuit in the middle estimation process according to the first embodiment.

FIGS. 24 and 25 are diagrams illustrating an example of the method of operating the latch circuits in the mask data reading (S106). The C reading and the E reading are performed as the mask data reading in the middle estimation process. As illustrated in FIG. 24, the same operations as in S201 and S202 are performed in S301 and S302 and the sensing result CR of the C reading is stored in the latch circuit ADL. As illustrated in FIG. 25, the sensing result ER of the E reading is first stored in the latch circuit SDL (S303) and then the data ER stored in the latch circuit SDL is copied to the latch circuit BDL (S304). Accordingly, the sensing result ER of the E reading is stored in the latch circuit BDL.

Figure 26:
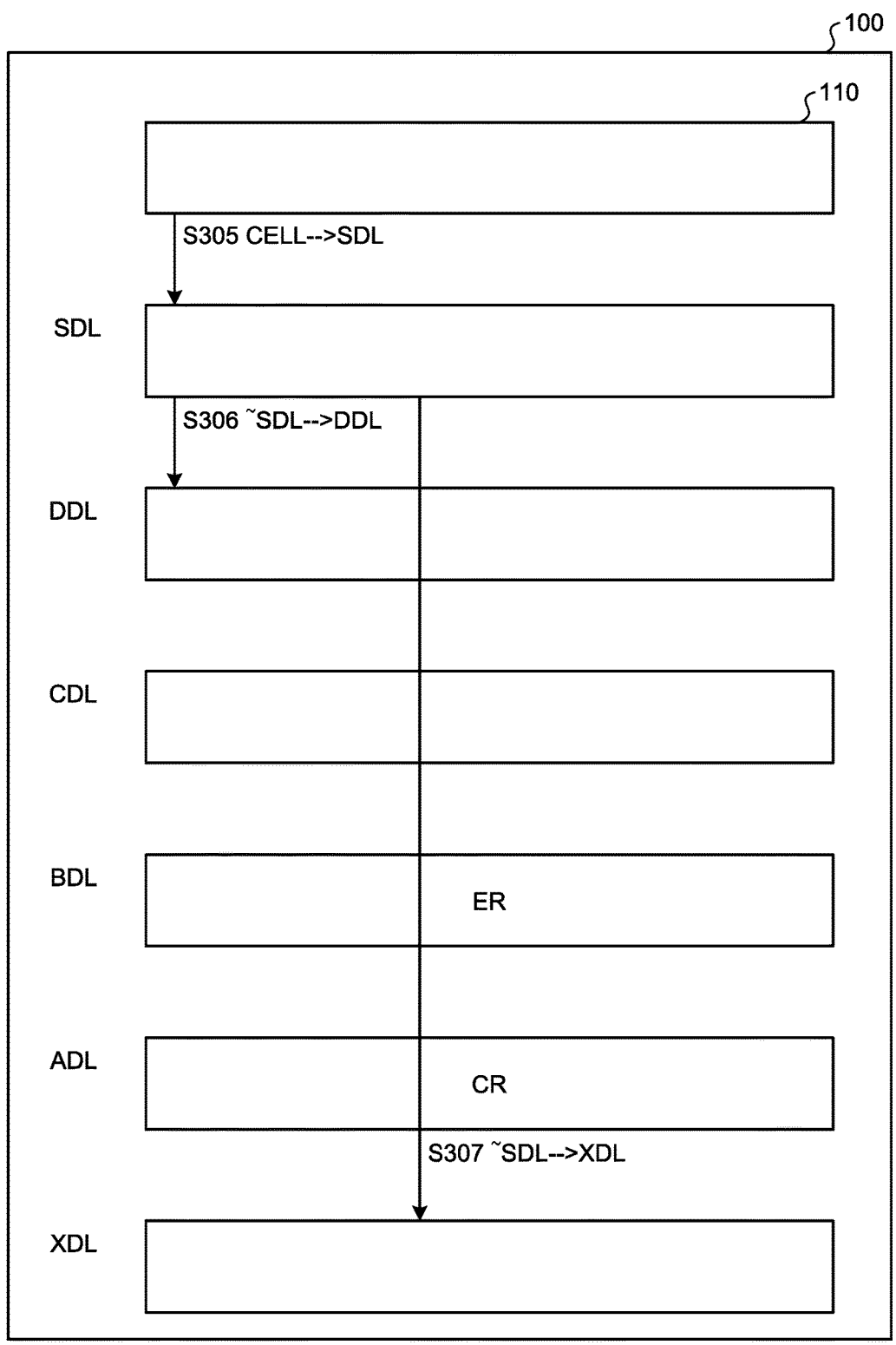
FIG. 26 is a diagram illustrating the example of the method of operating each latch circuit in the middle estimation process according to the first embodiment.

FIG. 26 is a diagram illustrating an example of the method of operating the latch circuits in the B reading of the first shift reading (SFT1). The sensing result BR of the B reading in the first shift reading is first stored in the latch circuit SDL (S305), a NOT operation is performed on the data BR stored in the latch circuit SDL, and the data BR which is inverted by the NOT operation is stored in the latch circuit DDL and the latch circuit XDL (S306 and S307).

Figure 27:
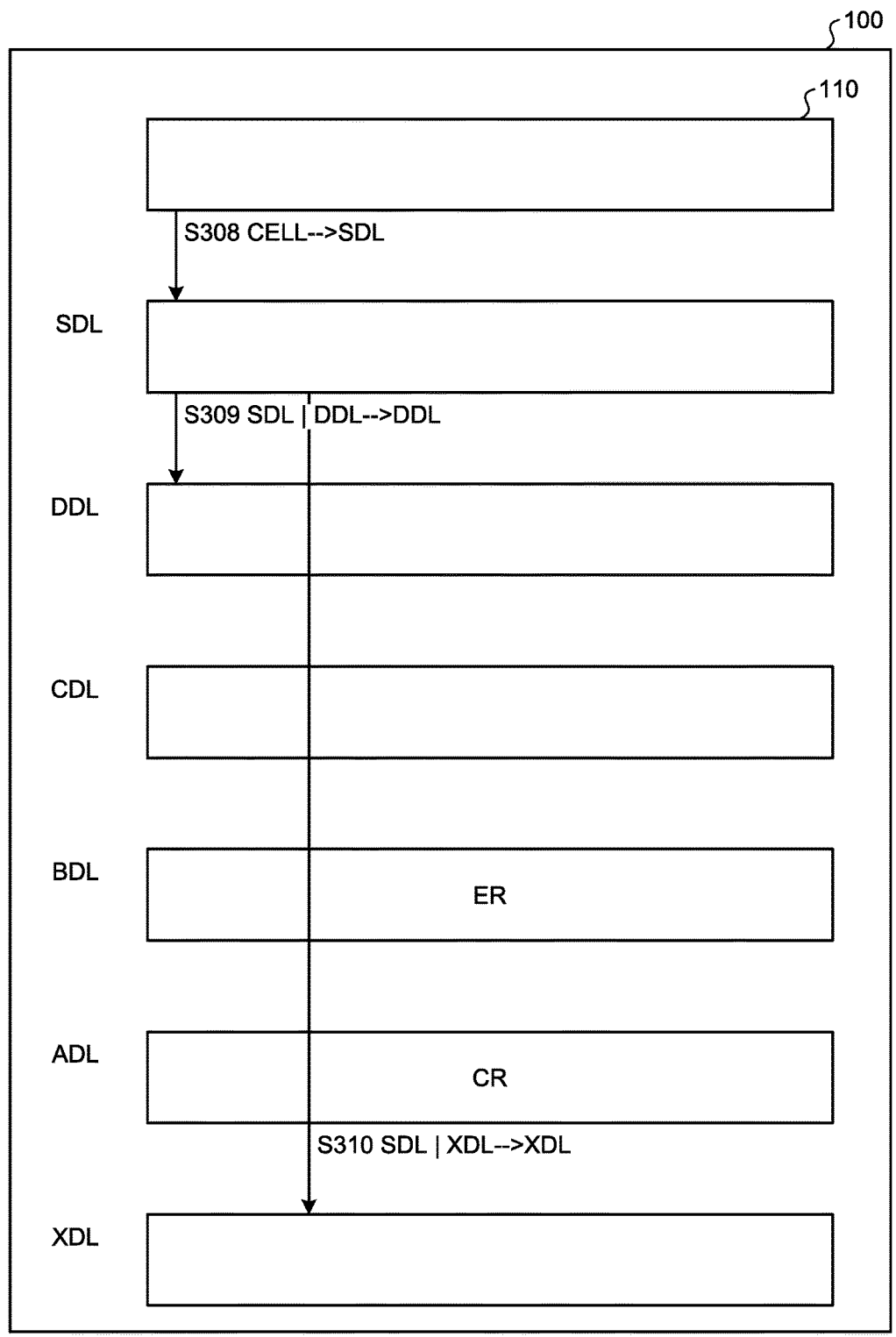
FIG. 27 is a diagram illustrating the example of the method of operating each latch circuit in the middle estimation process according to the first embodiment.

FIG. 27 is a diagram illustrating an example of the method of operating the latch circuits in the D reading of the first shift reading (SFT1). The sensing result DR of the D reading in the first shift reading is first stored in the latch circuit SDL (S308). An OR operation of the inverted data BR stored in the latch circuit DDL and the data DR stored in the latch circuit SDL is performed, and the latch circuit DDL is overwritten with the result data of the OR operation (S309). Similarly, an OR operation of the inverted data BR stored in the latch circuit XDL and the data DR stored in the latch circuit SDL is performed, and the latch circuit XDL is overwritten with the result data of the OR operation (S310).

Figure 28:
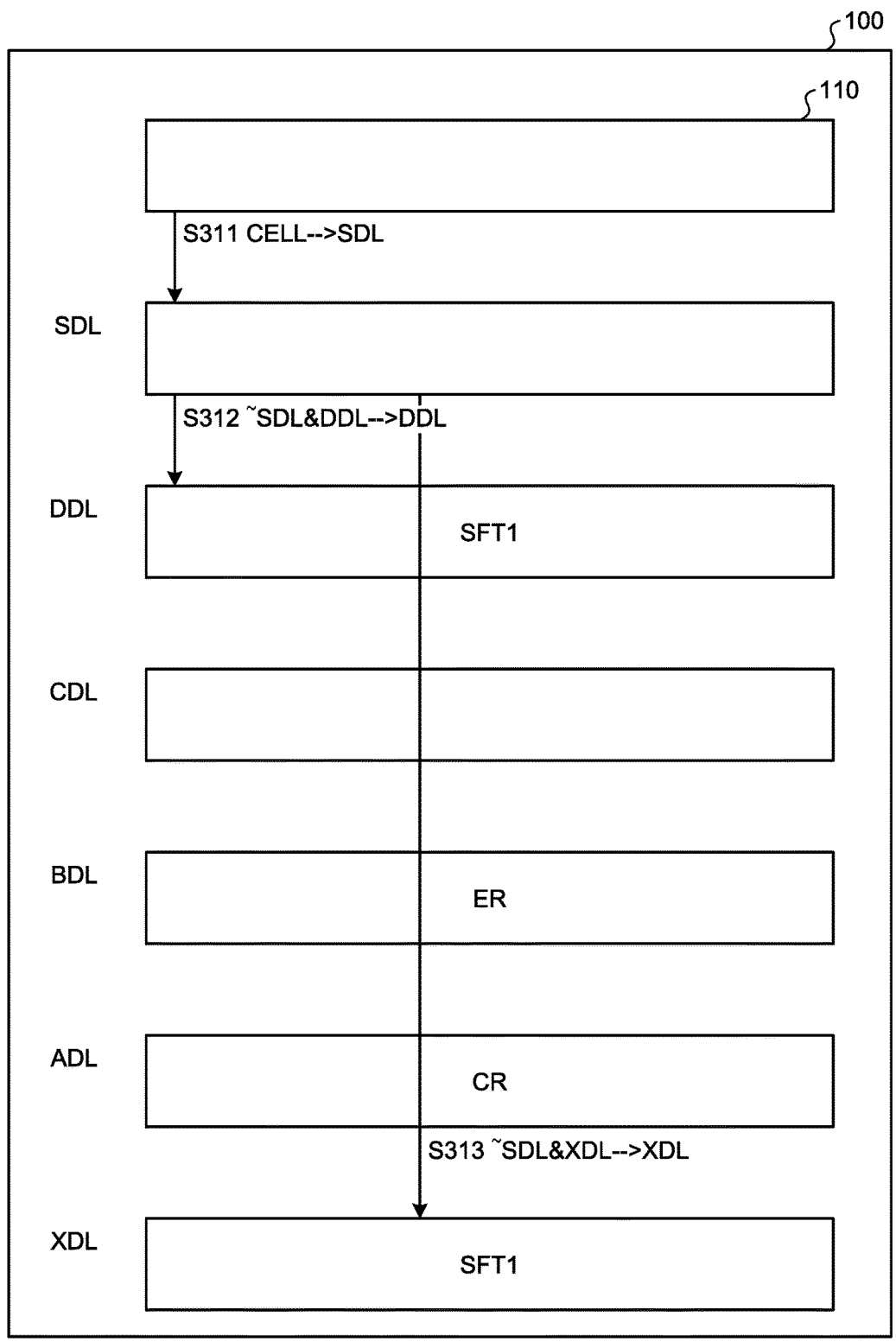
FIG. 28 is a diagram illustrating the example of the method of operating each latch circuit in the middle estimation process according to the first embodiment.

FIG. 28 is a diagram illustrating an example of the method of operating the latch circuits in the F reading of the first shift reading (SFT1). The sensing result FR of the F reading in the first shift reading is first stored in the latch circuit SDL (S311). A NOT operation is performed on the sensing result FR of the F reading stored in the latch circuit SDL, an AND operation of the sensing result FR of the F reading which is inverted by the NOT operation and the data stored in the latch circuit DDL is performed, and the latch circuit DDL is overwritten with the result data of the AND operation (S312). An AND operation of the sensing result FR of the F reading which is inverted by the NOT operation and the data stored in the latch circuit XDL is performed, and the latch circuit XDL is overwritten with the result data of the AND operation (S313). By S312 and S313, the read data of the first shift reading is completed in the latch circuit DDL and the latch circuit XDL.

Figure 29:
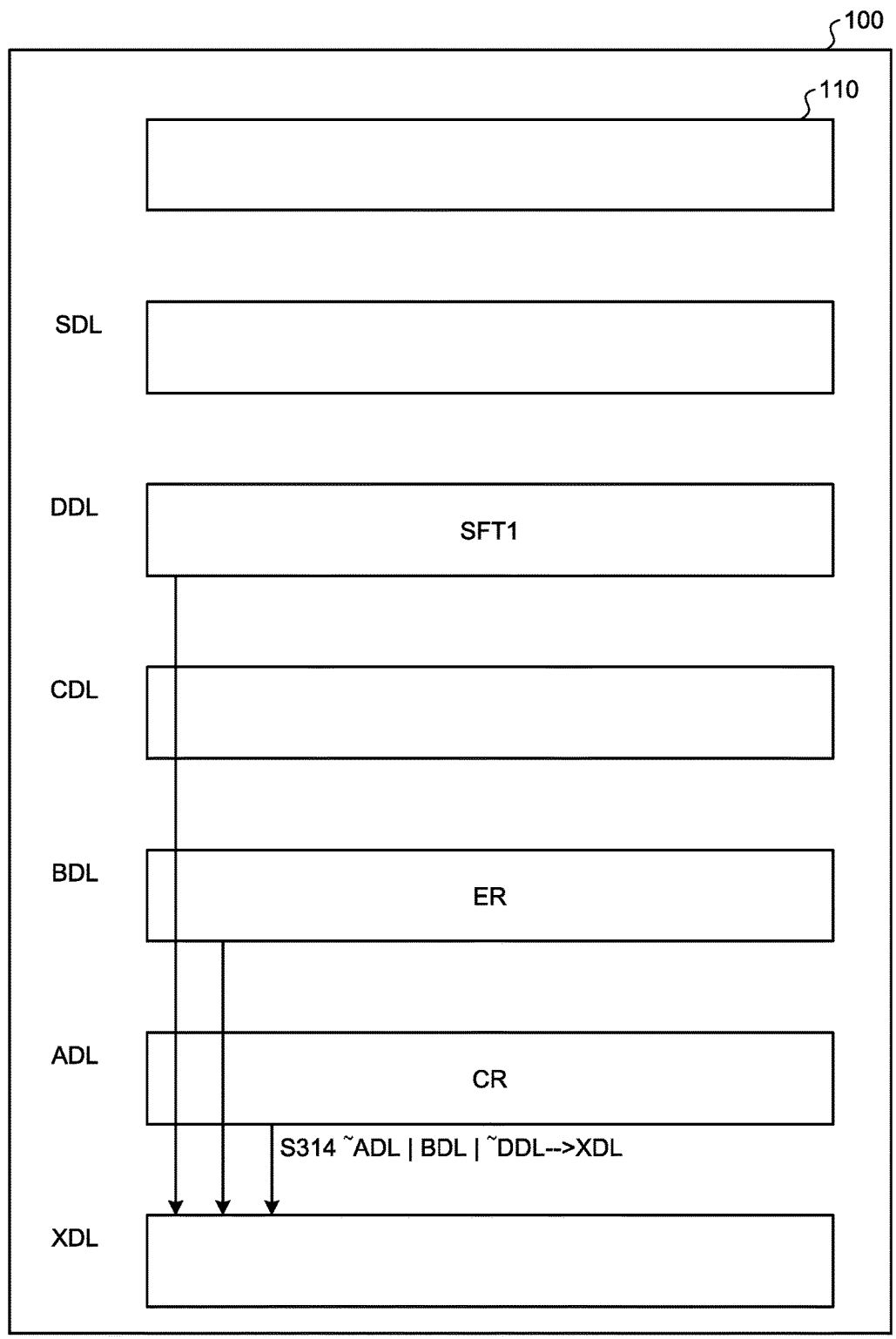
FIG. 29 is a diagram illustrating the example of the method of operating each latch circuit in the middle estimation process according to the first embodiment.

FIG. 29 is a diagram illustrating an example of the method of operating the latch circuits to separate, as separated data of the B reading, the sensing result BR from the read data of the first shift reading (SFT1). A NOT operation is performed on the read data of the shift reading SFT1 stored in the latch circuit DDL, an OR operation of the read data of the shift reading SFT1 which is inverted by the NOT operation, the mask data CR stored in the latch circuit ADL, and the mask data ER stored in the latch circuit BDL is performed, and the latch circuit XDL is overwritten with the result data of the OR operation (S314). The separated data of the B reading is completed in the latch circuit XDL by S314.

Figure 30:
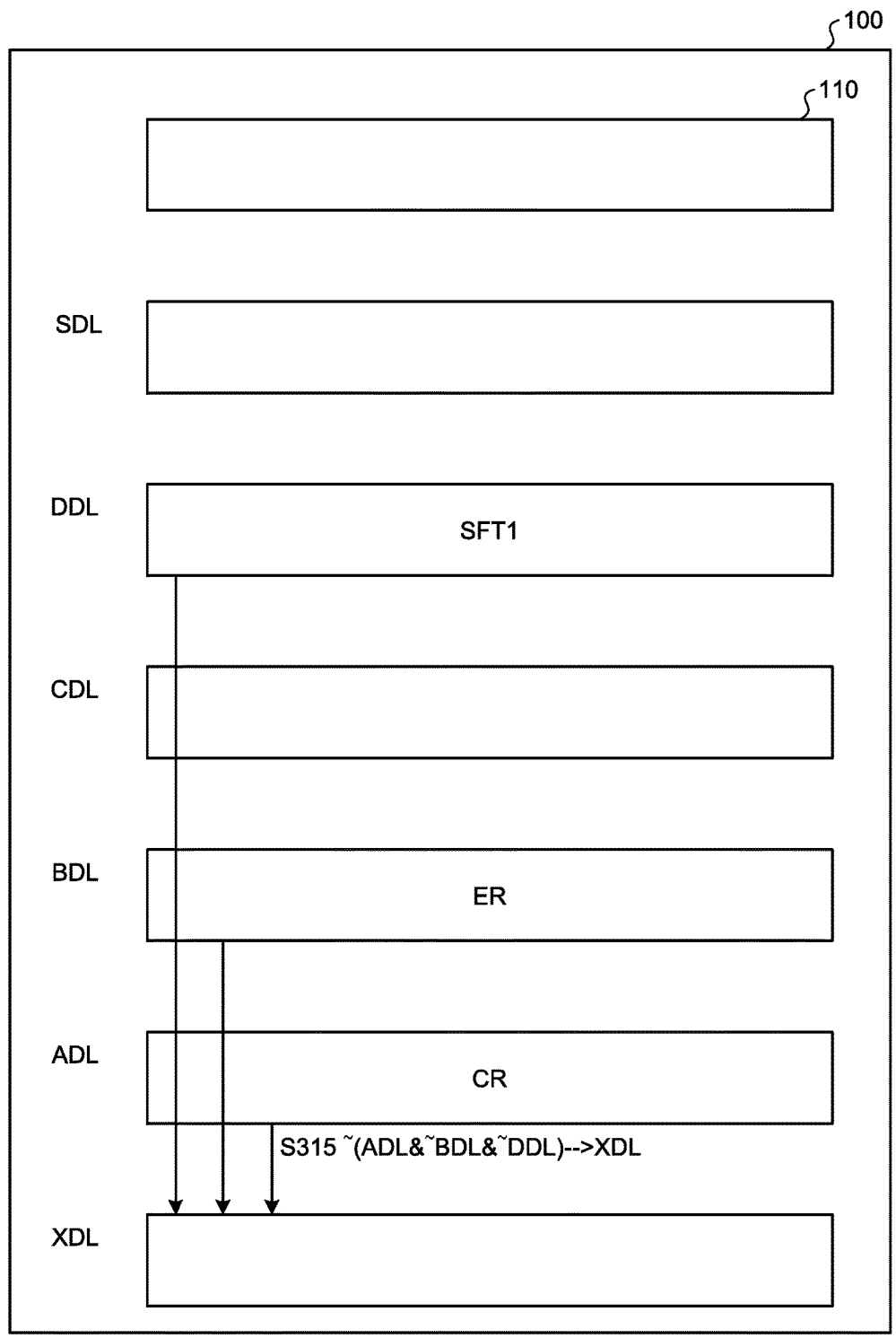
FIG. 30 is a diagram illustrating the example of the method of operating each latch circuit in the middle estimation process according to the first embodiment.

FIG. 30 is a diagram illustrating an example of the method of operating the latch circuits to separate, as separated data of the D reading, the sensing result DR from the read data of the first shift reading (SFT1). A NOT operation is performed on the mask data ER stored in the latch circuit BDL and the read data of the shift reading SFT1 stored in the latch circuit DDL. An AND operation of the mask data CR stored in the latch circuit ADL, the mask data ER which is inverted by the NOT operation, and the read data of the shift reading SFT1 which is inverted by the NOT operation is performed. A NOT operation is performed on the result data of the AND operation and the acquired data is stored in the latch circuit XDL (S315). The separated data of the D reading is completed in the latch circuit XDL by S315.

Figure 31:
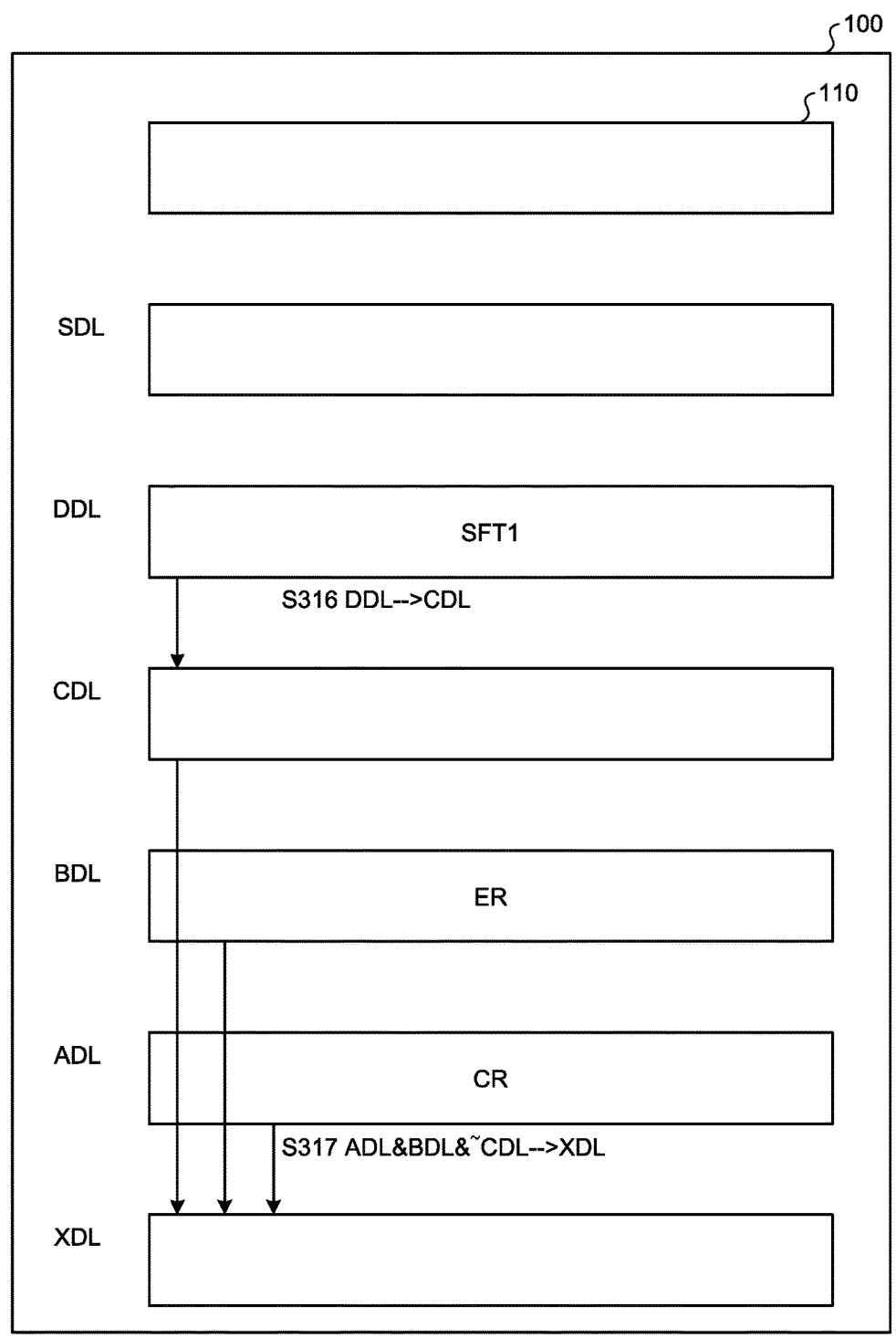
FIG. 31 is a diagram illustrating the example of the method of operating each latch circuit in the middle estimation process according to the first embodiment.

FIG. 31 is a diagram illustrating an example of the method of operating the latch circuits to separate, as separated data of the F reading, the sensing result FR from the read data of the first shift reading (SFT1). The read data of the shift reading SFT1 stored in the latch circuit DDL is copied to the latch circuit CDL (S316). A NOT operation is performed on the read data of the shift reading SFT1 stored in the latch circuit CDL, an AND operation of the read data of the shift reading SFT1 which is inverted by the NOT operation, the mask data CR stored in the latch circuit ADL, and the mask data ER stored in the latch circuit BDL is performed, and the latch circuit XDL is overwritten with the result data of the AND operation (S317). The separated data of the F reading is completed in the latch circuit XDL by S317.

FIGS. 32 to 36 are diagrams illustrating examples of the method of operating the latch circuits in the upper estimation process. Regarding the operations of the latch circuits in the shift reading, an example of the operations in the first shift reading (SFT1) will be described. The operations in the second shift reading and the shift reading subsequent thereto are the same as in the first shift reading (SFT1).

Figure 32:
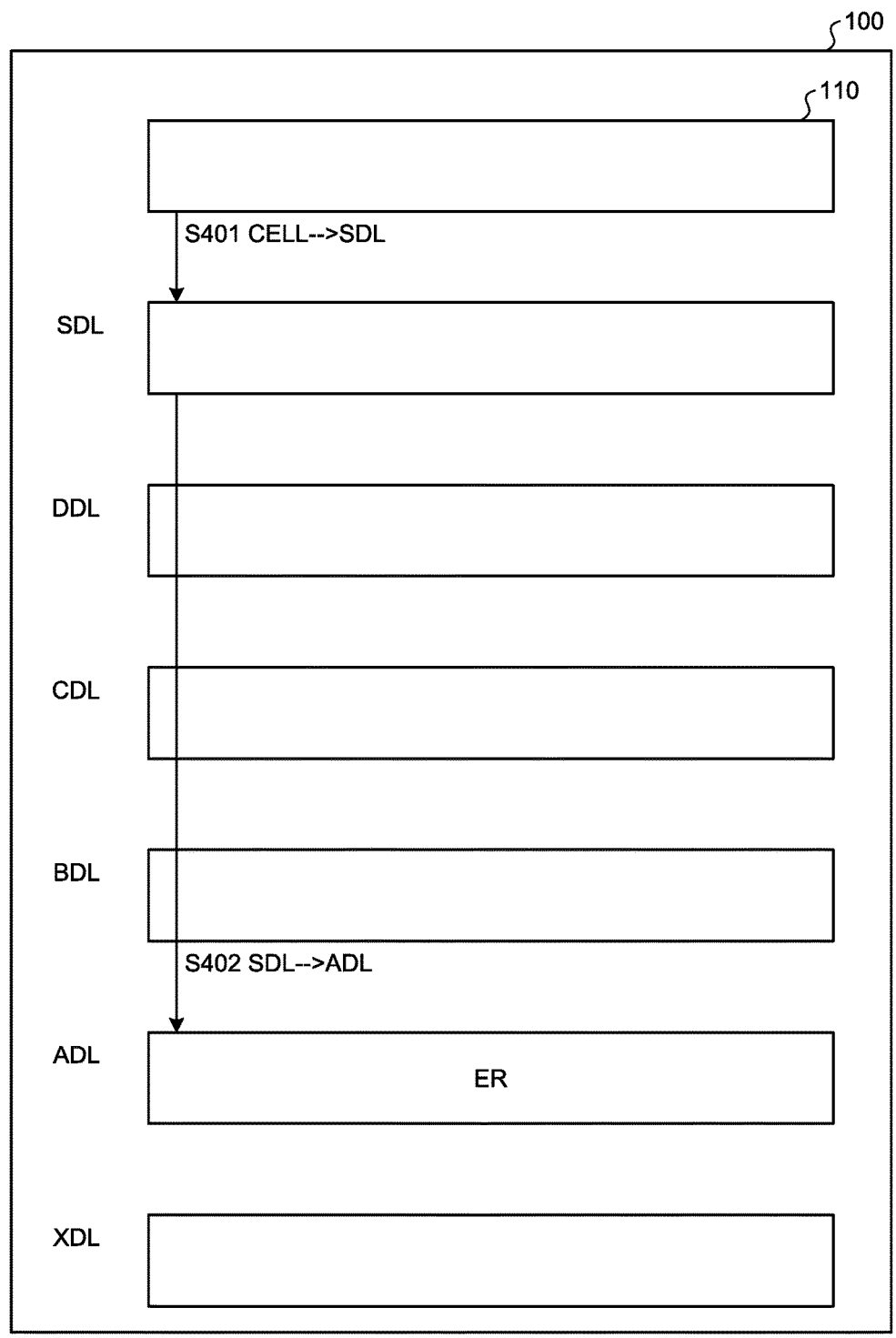
FIG. 32 is a diagram illustrating an example of a method of operating each latch circuit in the upper estimation process according to the first embodiment.

FIG. 32 is a diagram illustrating an example of the method of operating the latch circuits in the mask data reading (S106). The E reading is performed as the mask data reading in the upper estimation process. As illustrated in FIG. 32, the sensing result ER of the E reading is first stored in the latch circuit SDL (S401) and then the data ER stored in the latch circuit SDL is copied to the latch circuit ADL (S402). Accordingly, the sensing result ER of the E reading is stored in the latch circuit ADL.

Figure 33:
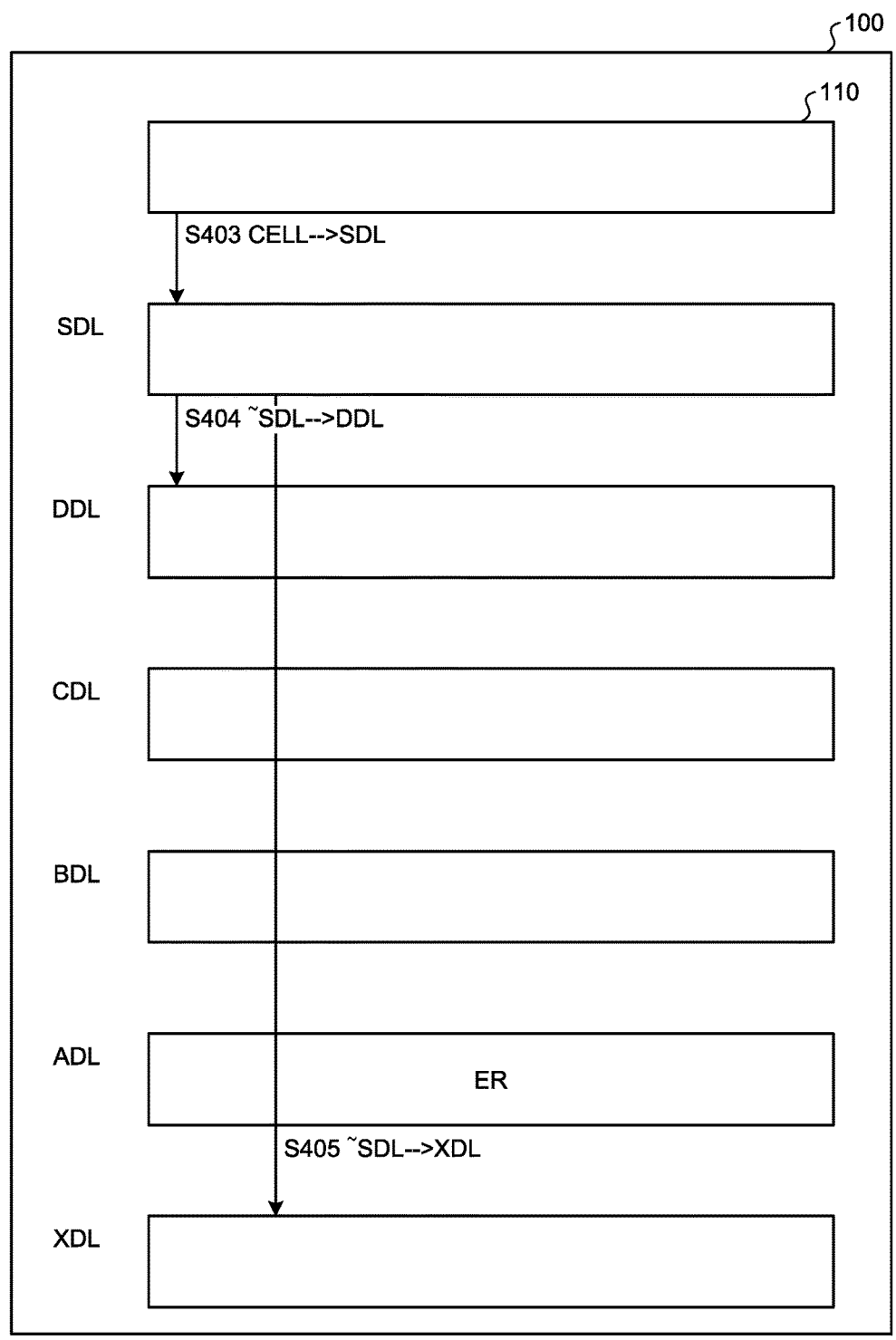
FIG. 33 is a diagram illustrating the example of the method of operating each latch circuit in the upper estimation process according to the first embodiment.

FIG. 33 is a diagram illustrating an example of the method of operating the latch circuits in the C reading of the first shift reading (SFT1). The sensing result CR of the C reading in the first shift reading is first stored in the latch circuit SDL (S403). A NOT operation is performed on the data CR stored in the latch circuit SDL and the data CR which is inverted by the NOT operation is stored in the latch circuit DDL and the latch circuit XDL (S404 and S405).

Figure 34:
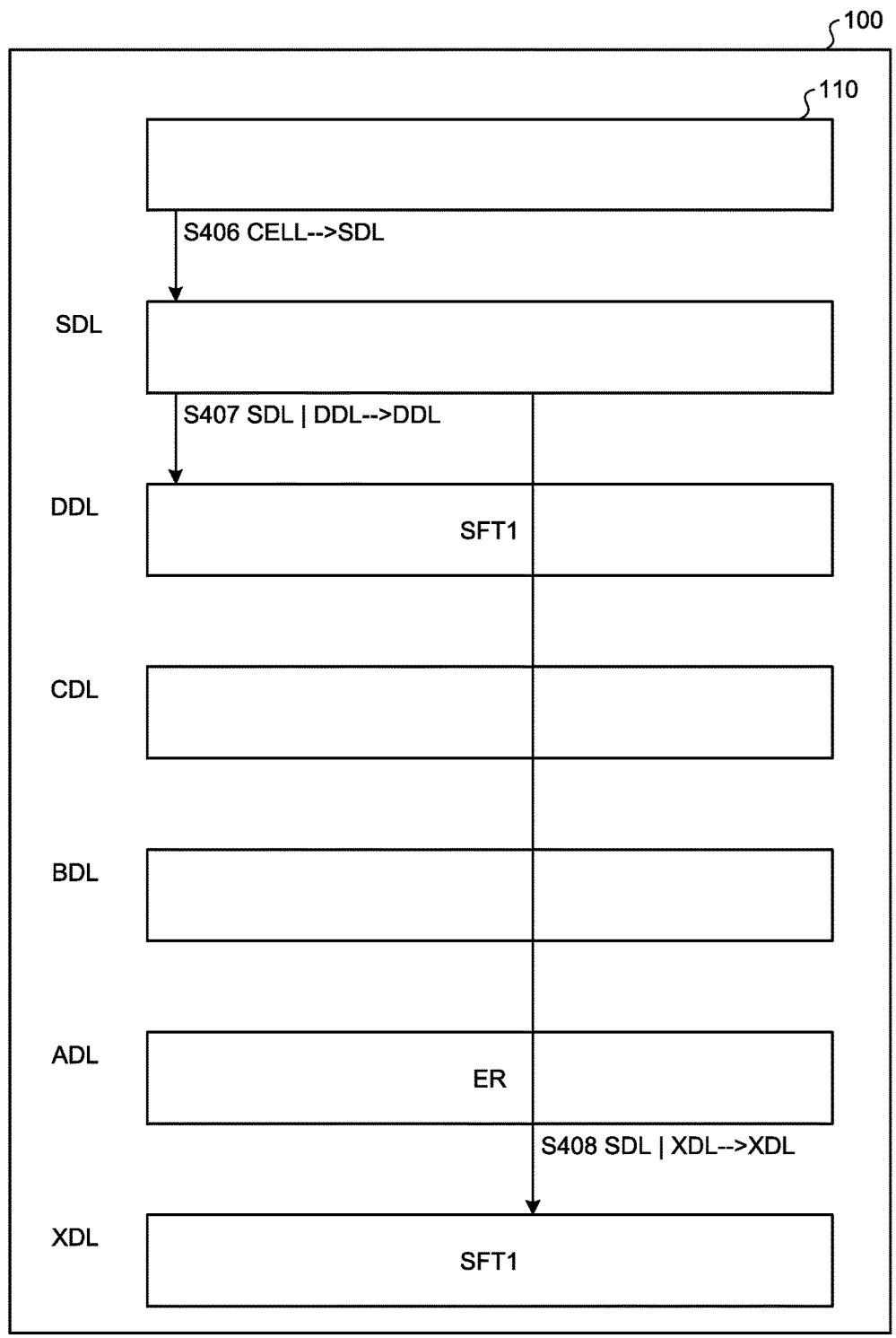
FIG. 34 is a diagram illustrating the example of the method of operating each latch circuit in the upper estimation process according to the first embodiment.

FIG. 34 is a diagram illustrating an example of the method of operating the latch circuits in the G reading of the first shift reading (SFT1). The sensing result GR of the G reading in the first shift reading is first stored in the latch circuit SDL (S406). An OR operation of the inverted data CR stored in the latch circuit DDL and the data GR stored in the latch circuit SDL is performed, and the latch circuit DDL is overwritten with the result data of the OR operation (S407). An OR operation of the inverted data CR stored in the latch circuit XDL and the data GR stored in the latch circuit SDL is performed, and the latch circuit XDL is overwritten with the result data of the OR operation (S408). The read data of the first shift reading is completed in the latch circuit DDL and the latch circuit XDL by S407 and S408.

Figure 35:
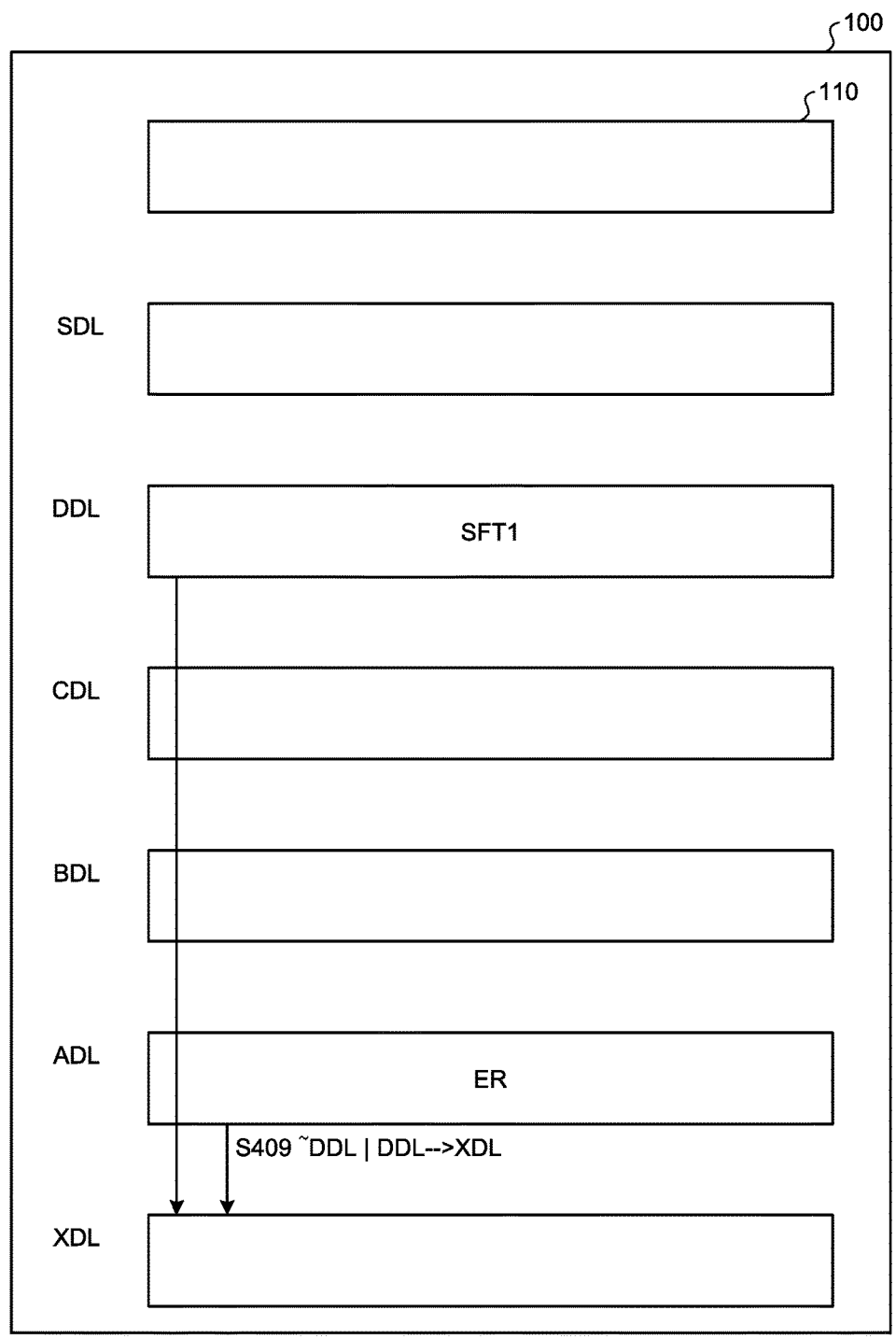
FIG. 35 is a diagram illustrating the example of the method of operating each latch circuit in the upper estimation process according to the first embodiment.

FIG. 35 is a diagram illustrating an example of the method of operating the latch circuits to separate, as separated data of the C reading, the sensing result CR from the read data of the first shift reading (SFT1). A NOT operation is performed on the read data of the shift reading SFT1 stored in the latch circuit DDL, an OR operation of the read data of the shift reading SFT1 which is inverted by the NOT operation and the mask data ER stored in the latch circuit ADL is performed, and the latch circuit XDL is overwritten with the result data of the OR operation (S409). The separated data of the C reading is completed in the latch circuit XDL by S409.

Figure 36:
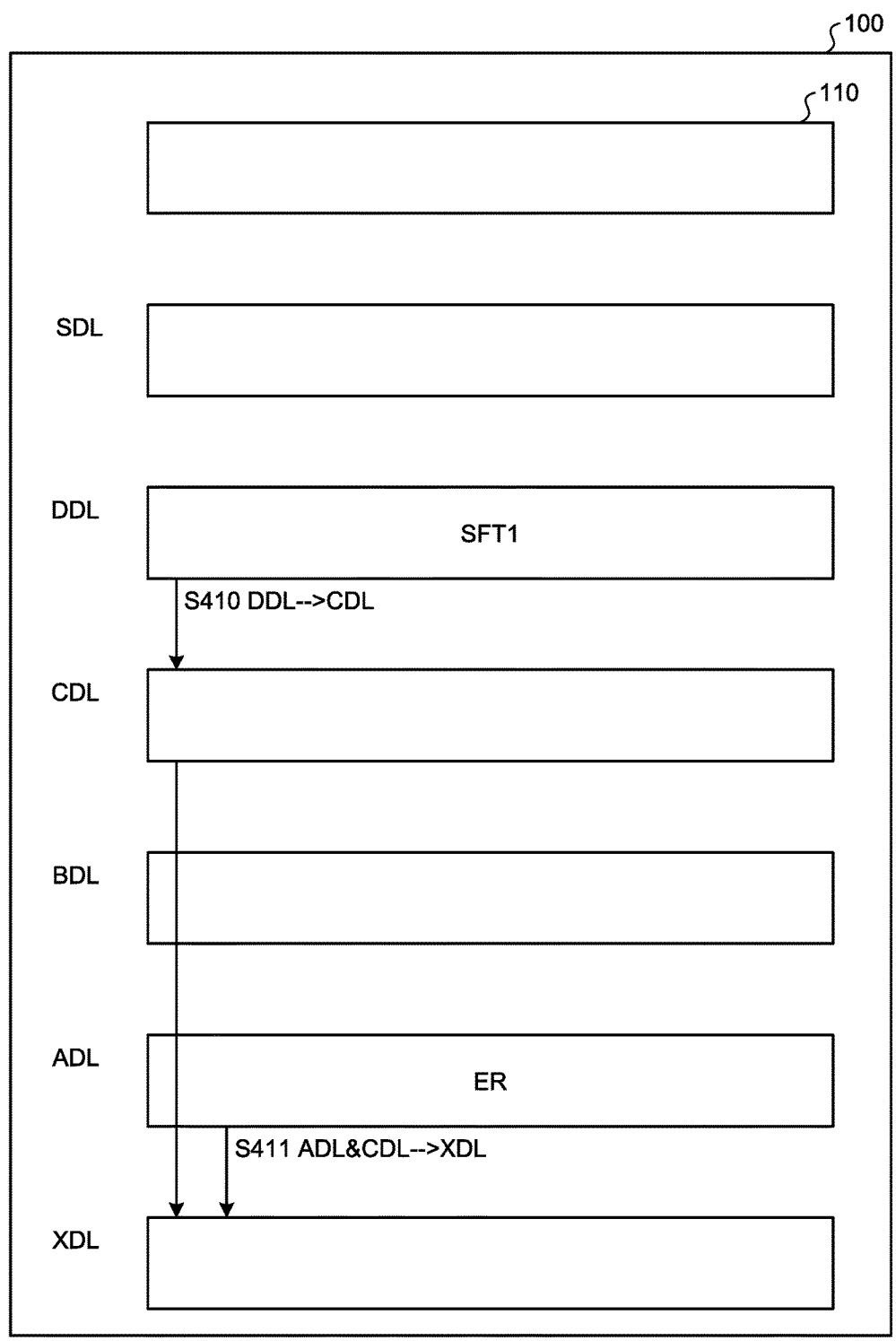
FIG. 36 is a diagram illustrating the example of the method of operating each latch circuit in the upper estimation process according to the first embodiment.

FIG. 36 is a diagram illustrating an example of the method of operating the latch circuits to separate, as separated data of the G reading, the sensing result GR from the read data of the first shift reading (SFT1). The read data of the shift reading SFT1 stored in the latch circuit DDL is copied to the latch circuit CDL (S410). An AND operation of the read data of the shift reading SFT1 stored in the latch circuit CDL and the mask data ER stored in the latch circuit ADL is performed, and the latch circuit XDL is overwritten with the result data of the AND operation (S411). The separated data of the E reading is completed in the latch circuit XDL by S411.

Referring to FIG. 12 again, when the separated data is acquired by the process of S111, the CPU 230 counts the number of "0"s included in the separated data (S112). The count value acquired in S112 is referred to as a bit count. In the separated data, "0" indicates that the state of the memory cell is the ON state. That is, the process of S112 is a process of counting the number of memory cells which should be in the ON state if each of the shifted boundary voltages is used. For example, in the case of the lower estimation process, in S112, the CPU 230 counts the number of memory cells which are in the ON state if each of Shift_a1, Shift_a2, Shift_a3, ... is used as the boundary voltage Vra, and counts the number of memory cells which are in the ON state if each of Shift_e1, Shift_e2, Shift_e3, ... is used as the boundary voltage Vre. The CPU 230 stores the bit count for each separated data, for example, in the buffer memory 240.

A bit counter may be disposed in the internal bus 270 and the number of "0"s included in the separated data may be counted by the bit counter instead of the CPU 230. The separated data sent from the NAND memory 100 may be input to the bit counter without passing through the buffer memory 240, and the bit counter may count the number of "0"s included in the separated data. The bit count is stored, for example, in the buffer memory 240.

The processes of S107 to S112 are repeated m times while shifting the boundary voltages. For example, the boundary voltages are shifted to elevate by the certain amount whenever the shift reading is performed. Alternatively, the boundary voltages are shifted to reduce by the certain amount whenever the shift reading is performed.

The CPU 230 calculates the optimal boundary voltages when m times of shift reading are completed (S113).

In S113, for example, the CPU 230 calculates a difference between two bit counts of which corresponding shift reading voltages are neighboring each other. The difference between the two bit counts is same as the number of memory cells each of which the threshold voltage is included in the section defined by the two corresponding shift reading voltages. For example, the difference between the bit count for Shift_a2 and the bit count for Shift_a3 indicates the number of memory cells each of which the threshold voltage is included in section (3). The CPU 230 determines the optimal boundary voltages using the above-mentioned algorithm for the count value for each section.

Subsequently, the CPU 230 issues a shift read command which is a command for requesting for shift reading and transmits the shift read command to the NAND memory 100 (S114). At this time, the CPU 230 transmits information indicating a target page to the NAND memory 100. The target page is, for example, same as the target page of the normal reading in S102. The CPU 230 may transmit the same block address and the same page address as in the normal read command to the NAND memory 100. The CPU 230 designates the optimal boundary voltages acquired in S113 as the boundary voltages for the shift reading. Similarly to the shift reading in the estimation process, an arbitrary method can be employed as the method of designating the optimal boundary voltages.

In response to the shift read command, the sequencer 170 performs the shift reading using the designated optimal boundary voltages as the boundary voltages (S115). The column control circuit 140 stores the read data of the shift reading in the latch circuit XDL. The controller 200 outputs the read data stored in the latch circuit XDL (S116). Then, the ECC circuit 260 checks whether an error or errors are present in the read data, and corrects the error or errors when the error or errors are is present (S117). When no error is present or the number of errors is equal to or less than a predetermined value and the error or errors can be corrected (S117, Pass), the data reading is completed. When the number of errors is greater than the predetermined value (S117, Fail), the CPU 230 determines that the data reading fails (Read Fail) and the data reading ends.

As described above, according to the first embodiment, in the NAND memory 100, the column control circuit 140 performs mask data reading and stores sensing result of the mask data reading in a latch circuit. In the example of the lower estimation process illustrated in FIG. 15, the sensing result CR of the mask data reading is stored in the latch circuit ADL. In the example of the middle estimation process illustrated in FIG. 25, the sensing result CR of the mask data reading is stored in the latch circuit ADL and the sensing result ER of the mask data reading is stored in the latch circuit BDL. Boundary voltage used in the mask data reading is at least between two levels used in shift reading. Subsequently, the NAND memory 100 performs the shift reading. The column control circuit 140 calculates the read data from the sensing results of the two levels in the shift reading. The column control circuit 140 stores the calculated read data in a latch circuit other than the latch circuit in which the sensing result of the mask data reading is stored. The column control circuit 140 calculates the sensing results of the two levels on the basis of the sensing result of the mask data reading and the read data. The NAND memory 100 outputs the calculated sensing results.

Since the NAND memory 100 according to the first embodiment has the above-mentioned configuration, the controller 200 can acquire the sensing result regarding each of all the boundary voltages required for the normal reading by one shift reading and it is thus possible to efficiently estimate the optimal boundary voltages.

The sequencer 170 may perform adjustment on the boundary voltages in the normal reading and the shift reading. A adjustment algorithm in the normal reading is same as the shift reading. For example, a adjustment algorithm based on temperature can be employed as an example of the adjustment algorithm.

The method of calculating each bit count is not limited to the above description. The number of "1 (in which a memory cell is turned off)"s included in each separated data may be counted. Each bit count may be calculated by counting the number of "1"s included in each separated data and subtracting the number of "1"s from the number of bits constituting one page. The number of "1"s included in each separated data may be treated as the bit count. In this case, in the process of calculating the optimal boundary voltages, the voltages each in which the counting result becomes largest are determined as the optimal boundary voltages. Similarly, in the following embodiments, an arbitrary method can be employed as the method of calculating the bit count.

It has been described above that the mask data read command (S105) and the shift read command (S107) are issued at different times. The mask data read command and the shift read command may be collectively issued at the time of S105 and then the mask data reading (S106) and the first shift reading (S108) may be successively performed. In this way, the timings at which the commands are issued are not limited to the above description but can be arbitrarily designed. In the following embodiments, the timings at which the commands are issued can be arbitrarily designed.

The first shift read command (S107) may include designation of the amount (Vstep) of shifting the boundary voltages, and the second or later shift read command (S107) may not include the designation. The calculation order of each separated data may be determined in advance and a command for promoting calculation of next separated data may be issued instead of the designation of the type (S109). In this way, information included in each command or each designation is not limited to the above description but can be arbitrarily designed. Similarly, information included in each commands or each designation can be arbitrarily designed in the following embodiments.

Second Embodiment

The operation of outputting separated data from the NAND memory 100 to the controller 200 and the access to the memory cell array 110 require a relatively long time. In a second embodiment, the access to the memory cell array 110 and the operation of outputting separated data from the NAND memory 100 to the controller 200 are performed in parallel.

Figure 37:
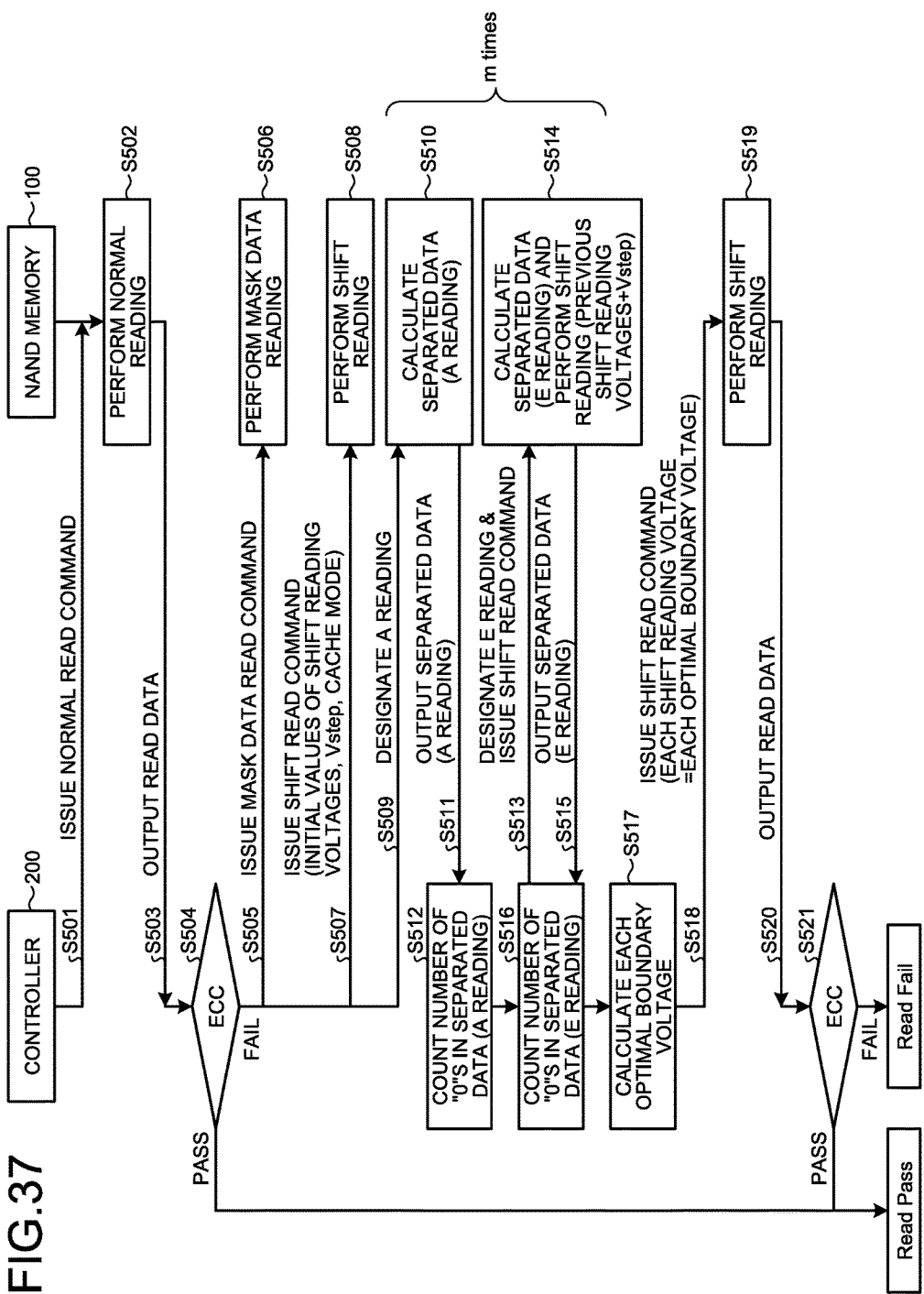
FIG. 37 is a flowchart illustrating an operation of a memory system according to a second embodiment.

FIG. 37 is a flowchart illustrating the operation of the memory system 1 according to the second embodiment. For example, reading on a lower page as a target page of reading will be described herein.

In S501 to S504, the same processes as S101 to S104 are performed. In S504, when no error is present or the number of errors is equal to or less than a predetermined value and the error or errors can be corrected (S504, Pass), the data reading is completed.

When the number of error or errors is greater than the predetermined value (S504, Fail), the CPU 230 starts the estimation process.

First, the CPU 230 issues a mask data read command and transmits the mask data read command to the NAND memory 100 (S505). In response to the mask data read command, the sequencer 170 performs mask data reading (S506). The column control circuit 140 stores the mask data read by the mask data reading in a certain latch circuit among the latch circuits ADL, BDL, CDL, DDL, and XDL.

Subsequently, the CPU 230 issues a shift read command which is a command for requesting shifting reading and transmits the shift read command to the NAND memory 100 (S507). At this time, the CPU 230 transmits information indicating a target page to the NAND memory 100. The target page is, for example, same as the target page of the normal reading in S502. The CPU 230 designates initial values of the shift reading voltages, Vstep, and a cache mode. Here, it is assumed that each shift reading voltage is elevated by Vstep whenever each shift reading is performed, and the initial values of the shift reading voltages are shift reading voltages which are used in the first shift reading. In the example illustrated in FIG. 37, Shift_a1 and Shift_e1 are designated as the initial values of the shift reading voltages.

The sequencer 170 performs the first shift reading in response to the shift read command (S508).

Subsequently, the CPU 230 designates A reading among the single-level reading (A reading and E reading) constituting the shift reading (S509). In response to the designation, the sequencer 170 causes the column control circuit 140 to calculate separated data of the A reading (S510). The column control circuit 140 stores the separated data of the A reading acquired by the calculation in the latch circuit XDL. The CPU 230 outputs the separated data of the A reading stored in the latch circuit XDL (S511). The separated data of the A reading is transferred, for example, to the buffer memory 240 of the controller 200 via the NAND interface. The CPU 230 counts the number of "0"s included in the separated data of the A reading (S512).

Subsequently, the CPU 230 issues designation of the E reading and a shift read command for requesting next shift reading and successively transmits them to the NAND memory 100 (S513). The successive transmitting of designation of the E reading and the shift read command to the NAND memory 100 means transmitting the designation of the E reading and then transmitting the shift read command before the sequencer 170 starts calculating of the separated data of the E reading in response to the designation of the E reading. In response to the designation of the E reading and the shift read command, the sequencer 170 causes the column control circuit 140 to calculate the separated data of the E reading and performs the shift reading (S514). In S514, the sequencer 170 uses voltage values, which are acquired by adding Vstep to the shift reading voltages which have been used in the previous shift reading, as current shift reading voltages. That is, for example, when the current shift reading is second shift reading and Shift_a1 and Shift_e1 are used as the boundary voltages in the first shift reading, Shift_a1+Vstep and Shift_e1+Vstep are used as the current boundary voltages.

The column control circuit 140 stores the separated data of the E reading acquired by the calculation in the latch circuit XDL. The CPU 230 outputs the separated data of the E reading stored in the latch circuit XDL (S515). The separated data of the E reading is transferred, for example, to the buffer memory 240 of the controller 200 via the NAND interface. The CPU 230 counts the number of "0"s included in the separated data of the E reading (S516).

The processes of S512 to S516 are performed m times while elevating the shift reading voltages by Vstep.

In S514, for example, when calculating of the separated data is started, the sequencer 170 changes the ready/busy signal RBn to a busy state. Then, after the separated data is stored in the latch circuit XDL, the sequencer 170 changes the ready/busy signal RBn to the ready state regardless of whether the shift reading is performed on the memory cell array 110 in the background. The CPU 230 can recognize that the separated data of the E reading is stored in the latch circuit XDL by monitoring the ready/busy signal RBn after the process of S514. Since the CPU 230 performs the process of S515 with the recognition of completion of storing the separated data of the E reading in the latch circuit XDL, the NAND memory 100 can perform the shift reading and the outputting of the separated data of the E data in parallel. In S514 and S515, the NAND memory 100 performs at least the A reading included in the next shift reading while outputting the separated data. The NAND memory 100 may complete the A reading until the outputting of the separated data is completed or may not complete the A reading until the outputting of the separated data is completed. The NAND memory 100 performs a part or all of the outputting of the separated data and a part or all of the first single-level reading constituting the next shift reading in parallel.

The method of operating the latch circuits will be described below with reference to FIGS. 38 to 44. For example, the lower estimation process will be described herein.

Figure 38:
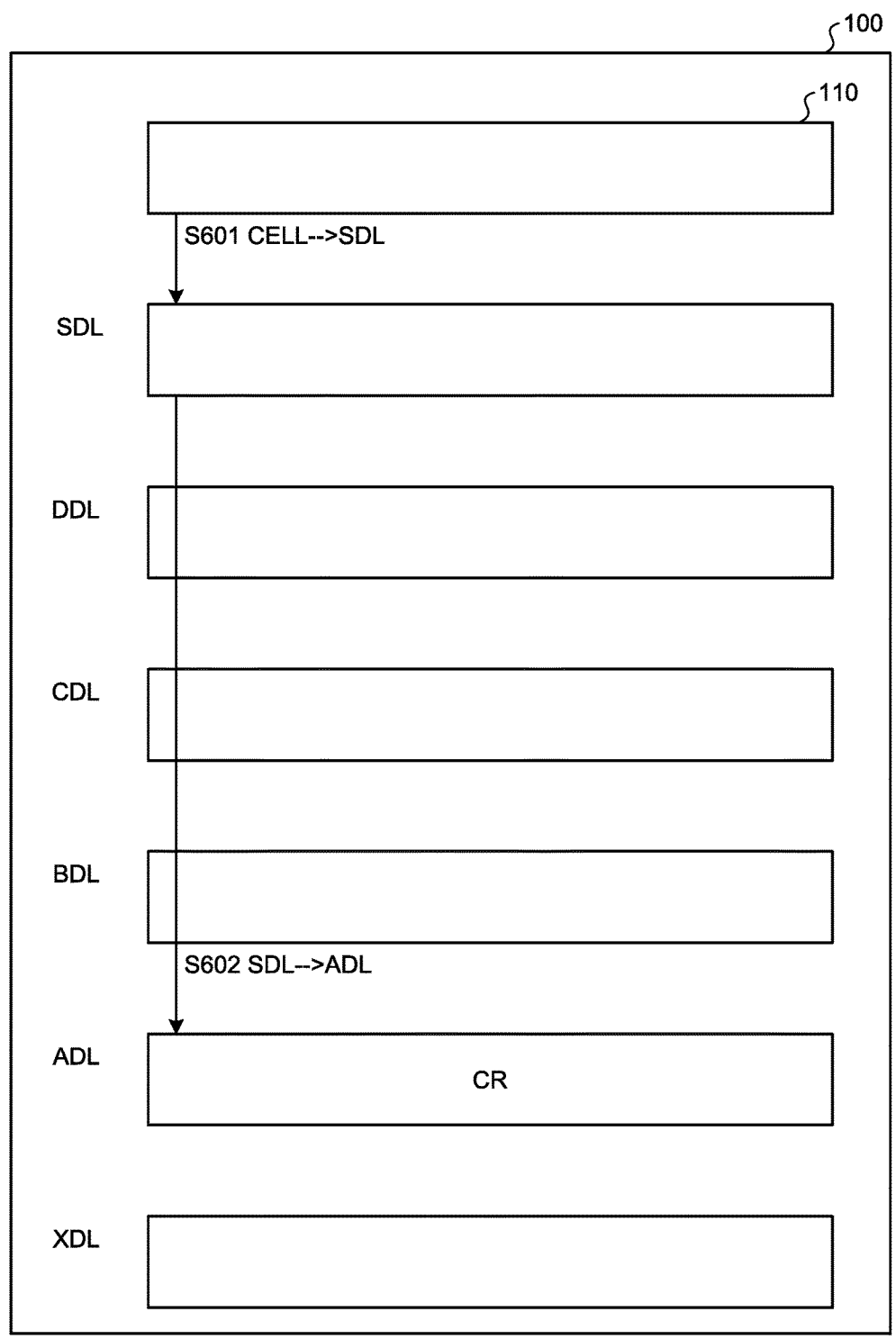
FIG. 38 is a diagram illustrating an example of a method of operating each latch circuit in the lower estimation process according to the second embodiment.

FIG. 38 is a diagram illustrating an example of the method of operating the latch circuits in the mask data reading (S506). As illustrated in the drawing, the same processes as S201 and S202 are performed in S601 and S602, and the sensing result CR of the C reading is stored in the latch circuit ADL.

Figure 39:
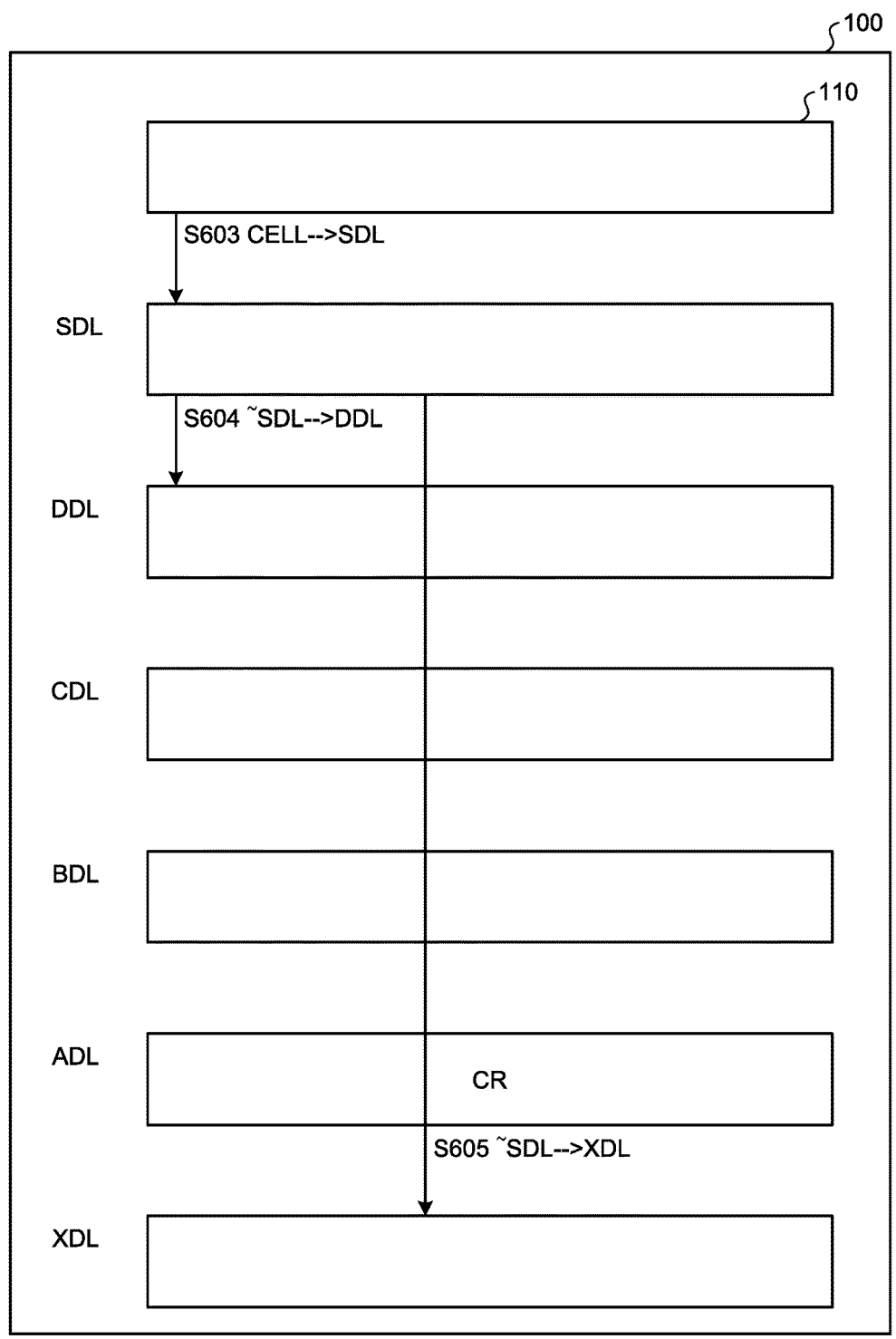
FIG. 39 is a diagram illustrating the example of the method of operating each latch circuit in the lower estimation process according to the second embodiment.

FIG. 39 is a diagram illustrating an example of the method of operating the latch circuits in the A reading of the first shift reading (SFT1, S508). In the drawing, the same processes as S203 to S205 are performed in S603 to S605.

Figure 40:
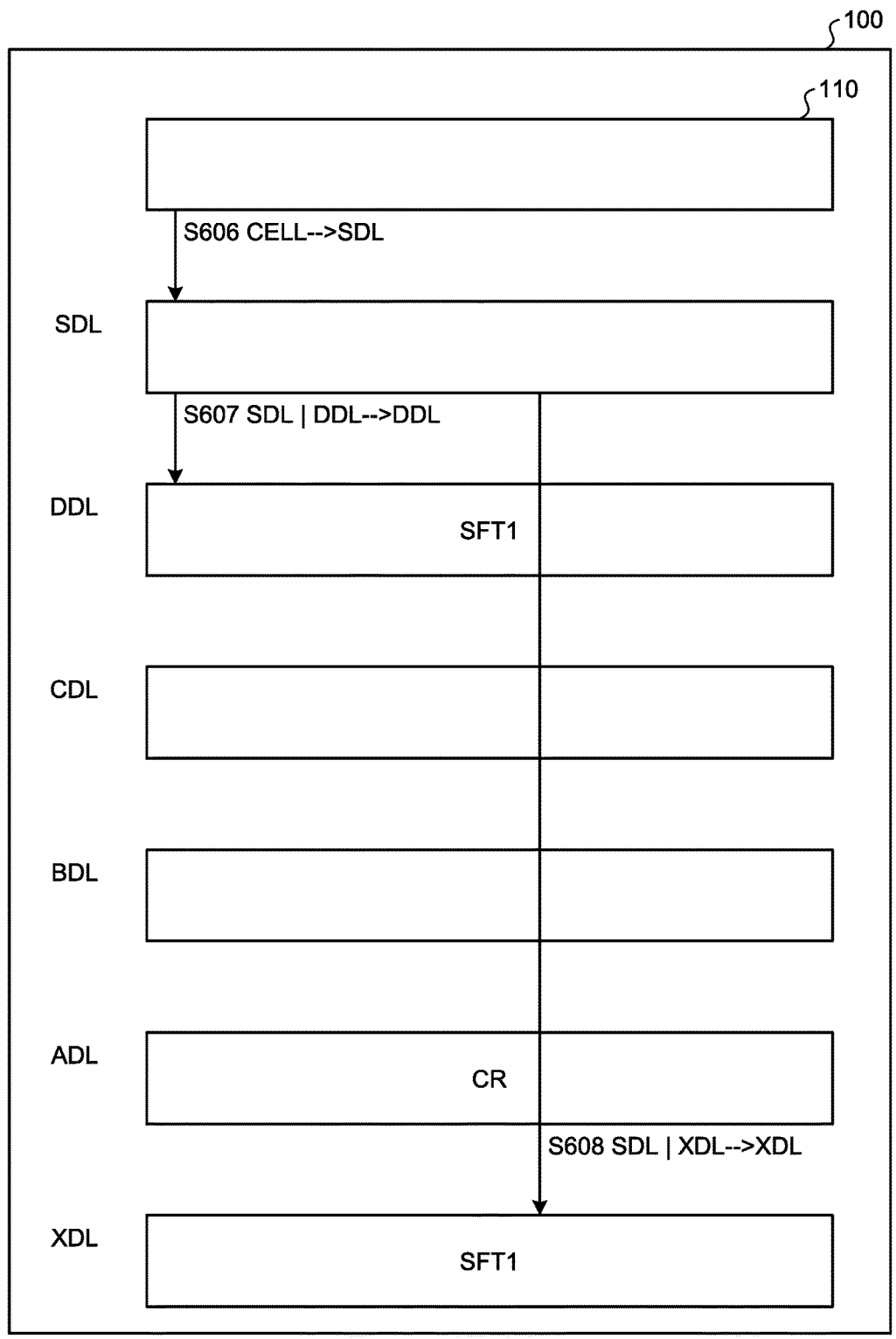
FIG. 40 is a diagram illustrating the example of the method of operating each latch circuit in the lower estimation process according to the second embodiment.

FIG. 40 is a diagram illustrating an example of the method of operating the latch circuits in the E reading of the first shift reading (SFT1, S508). In the drawing, the same processes as S206 to S208 are performed in S606 to S608.

Figure 41:
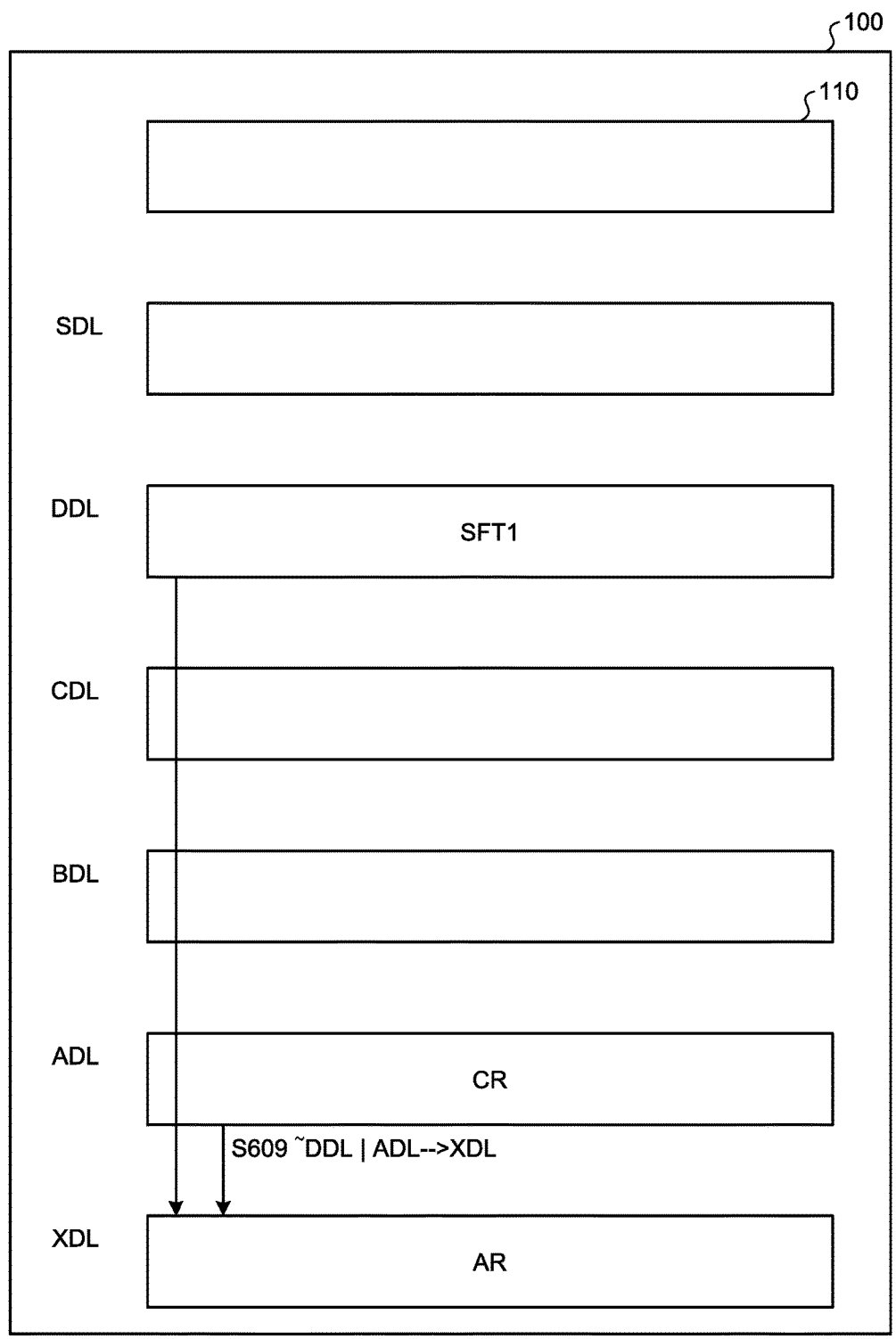
FIG. 41 is a diagram illustrating the example of the method of operating each latch circuit in the lower estimation process according to the second embodiment.

FIG. 41 is a diagram illustrating an example of the method of operating the latch circuits to acquire the separated data of the A reading from the read data of the first shift reading (SFT1) (S510). In the drawing, the same process as S209 is performed in S609.

Figure 42:
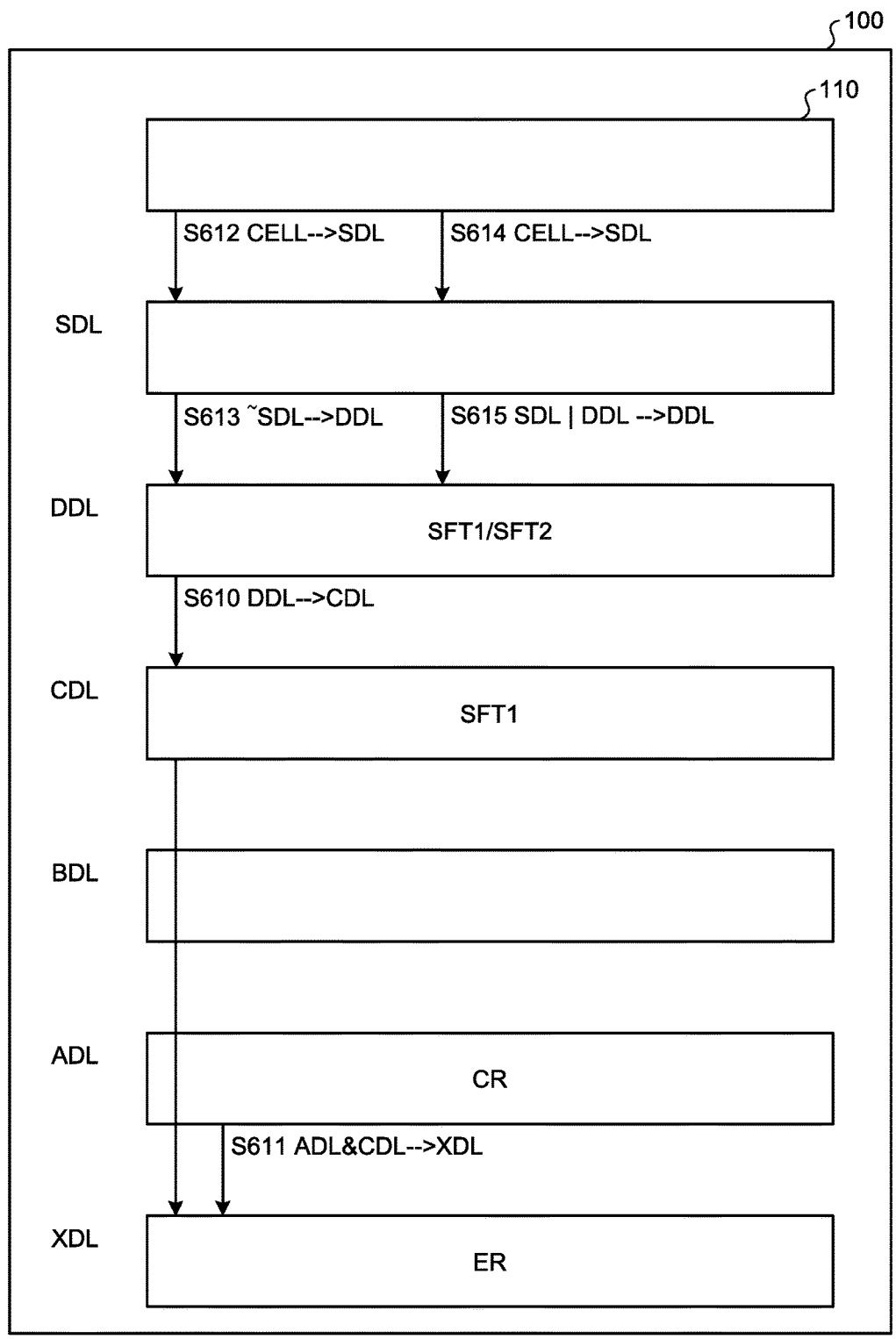
FIG. 42 is a diagram illustrating the example of the method of operating each latch circuit in the lower estimation process according to the second embodiment.

FIG. 42 is a diagram illustrating an example of the method of operating the latch circuits to acquire the separated data of the E reading from the read data of the first shift reading (SFT1) and to read the read data of the second shift reading (SFT2). The read data of the shift reading SFT1 stored in the latch circuit DDL is copied to the latch circuit CDL (S610). An AND operation of the read data of the shift reading SFT1 stored in the latch circuit CDL and the mask data CR stored in the latch circuit ADL is performed and the latch circuit XDL is overwritten with the result data of the AND operation (S611). The separated data of the E reading is completed in the latch circuit XDL by S611. The CPU 230 starts transferring separated data of the E reading in the latch circuit XDL by toggling the read enable signal REn or the like.

In the background of transferring the separated data of the E reading, the sequencer 170 performs second shift reading (SFT2). Specifically, the sensing result AR of the A reading in the second shift reading is first stored in the latch circuit SDL (S612), a NOT operation is performed on the data AR stored in the latch circuit SDL, and the latch circuit DDL is overwritten with the data AR which is inverted by the NOT operation (S613). Subsequently, the sensing result ER of the E reading in the second shift reading (SFT2) is stored in the latch circuit SDL (S614). An OR operation of the data ER stored in the latch circuit SDL and the data stored in the latch circuit DDL (that is, the data AR which is inverted by the NOT operation) is performed and the latch circuit DDL is overwritten with the result data of the OR operation (S615). The read data of the second shift reading (SFT2) is completed in the latch circuit DDL by S615.

The read data of the first shift reading (SFT1) is moved from the latch circuit DDL to the latch circuit CDL by S610. After being moved, the read data of the second shift reading (SFT2) can be stored in the latch circuit DDL. So long as the order of S610 and S613 is kept, S612 can be started earlier than S611.

In this way, the second shift reading is started in the background while transferring the separated data of the first E reading. Accordingly, the time required for the shift reading is concealed by the time required for transferring the separated data of the first E reading and thus the entire processing time is shortened.

As for acquiring the separated data of the A reading, acquiring the separated data of the E reading, and the next shift reading, the same operations as the operations of the latch circuits in the first shift reading (SFT1) are also performed in the second or later shift reading. For the purpose of reference, the operations of the latch circuits in the second shift reading (SFT2) will be described below.

Figure 43:
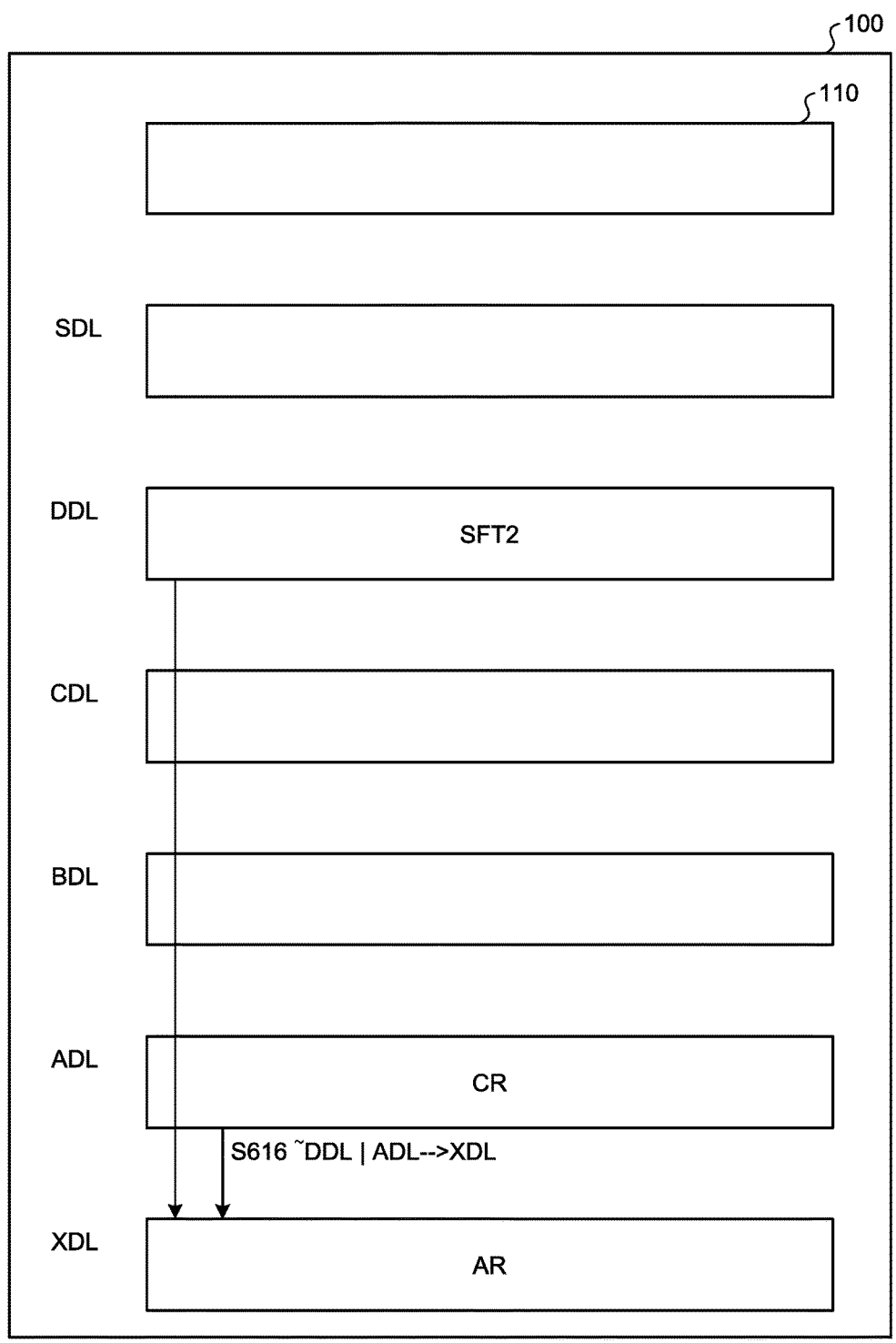
FIG. 43 is a diagram illustrating the example of the method of operating each latch circuit in the lower estimation process according to the second embodiment.

FIG. 43 is a diagram illustrating an example of the method of operating the latch circuits to acquire the separated data of the A reading from the read data of the second shift reading (SFT2). As illustrated in the drawing, the same process as S218 is performed in S616. Accordingly, the separated data of the A reading is completed in the latch circuit XDL.

Figure 44:
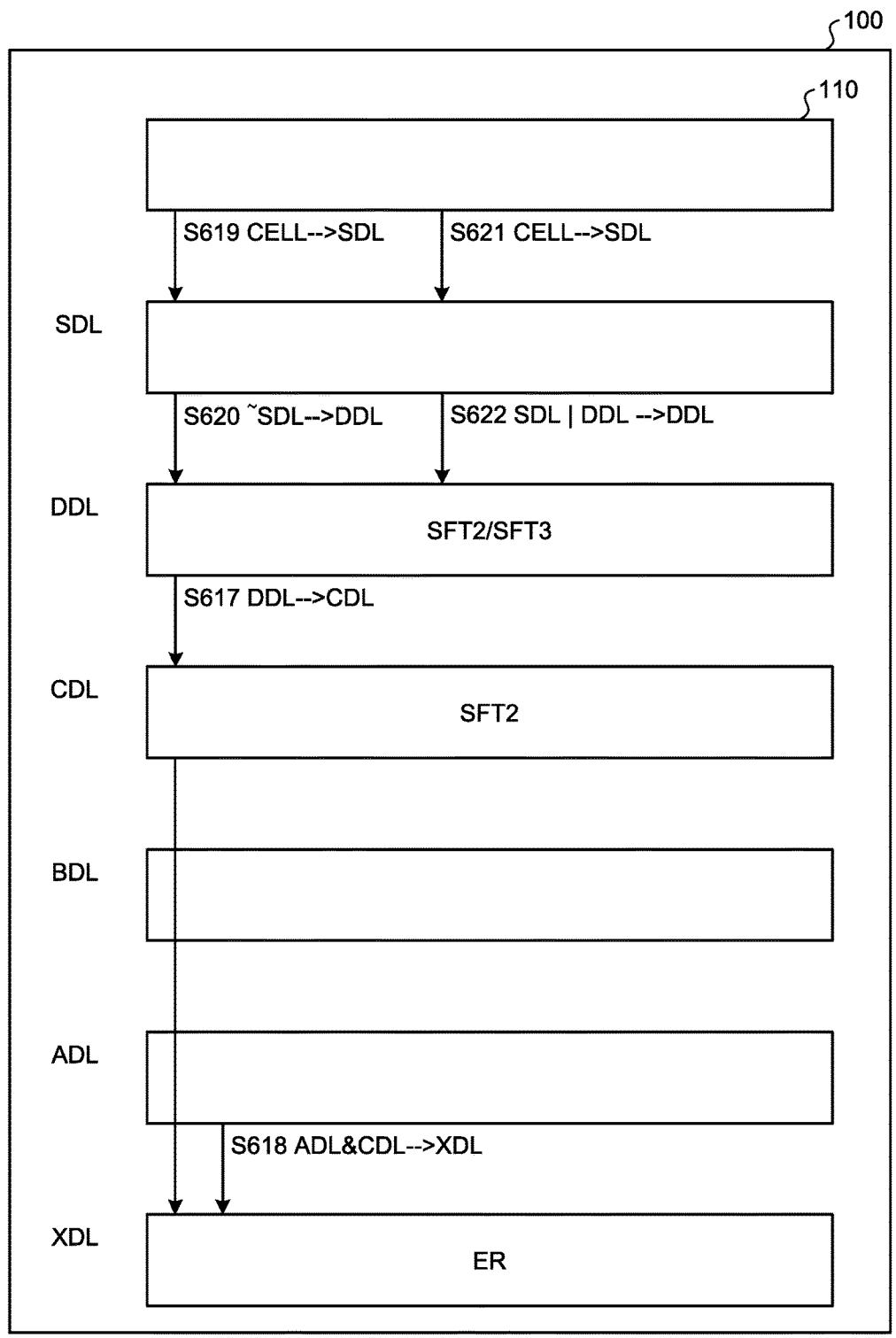
FIG. 44 is a diagram illustrating the example of the method of operating each latch circuit in the lower estimation process according to the second embodiment.

FIG. 44 is a diagram illustrating an example of the method of operating the latch circuits to acquire the separated data of the E reading from the read data of the second shift reading (SFT2) and to read the read data of the third shift reading (SFT3). The read data of the shift reading SFT2 stored in the latch circuit DDL is copied to the latch circuit CDL (S617). An AND operation of the read data of the shift reading SFT2 stored in the latch circuit CDL and the mask data CR stored in the latch circuit ADL is performed and the latch circuit XDL is overwritten with the result data of the AND operation (S618). The separated data of the E reading is completed in the latch circuit XDL by S618. The CPU 230 starts transferring the separated data of the E reading in the latch circuit XDL by toggling the read enable signal REn or the like.

In the background of transferring the separated data of the E reading, the sequencer 170 performs third shift reading (SFT3). Specifically, the sensing result AR of the A reading in the third shift reading (SFT3) is first stored in the latch circuit SDL (S619), a NOT operation is performed on the data AR stored in the latch circuit SDL, and the latch circuit DDL is overwritten with the data AR which is inverted by the NOT operation (S620). Subsequently, the sensing result ER of the E reading in the third shift reading (SFT3) is stored in the latch circuit SDL (S621). An OR operation of the data ER stored in the latch circuit SDL and the data stored in the latch circuit DDL (that is, the data AR which is inverted by the NOT operation) is performed and the latch circuit DDL is overwritten with the result data of the OR operation (S622). The read data of the third shift reading (SFT3) is completed in the latch circuit DDL by S622.

In this way, in the lower estimation process, next shift reading is performed while the separated data of the E reading is being output. Accordingly, the total time required for the lower estimation process is shortened. Here, it is assumed that the separated data of the E reading is output subsequent to the separated data of the A reading, but the separated data of the A reading may be output subsequent to the separated data of the E reading. In this case, the next shift reading is performed while the separated data of the A reading is being output.

In the middle estimation process, the next shift reading can be performed while the separated data is being output. For example, the separated data of the B reading, the separated data of the D reading, and the separated data of the F reading are output for every shift reading. The next shift reading is performed while the last separated data among these is being output. Accordingly, the total time required for the middle estimation process is shortened.

In the upper estimation process, the next shift reading can also be performed while the separated data is being output. For example, the separated data of the C reading and the separated data of the G reading are output for every shift reading. The next shift reading is performed while the last separated data among these is being output. Accordingly, the total time required for the upper estimation process is shortened.

In this way, according to the second embodiment, the column control circuit 140 performs the outputting of the separated data and the applying of the boundary voltages for the next shift reading in parallel. Accordingly, the total time required for the estimation process is shortened.

Third Embodiment

In the first and second embodiments, the separated data is generated by the NAND memory 100. The generating of the separated data may be performed by the controller 200 instead of the NAND memory 100. In a third embodiment, an example in which the controller 200 generates the separated data will be described.

In the third embodiment, the ECC circuit 260 can perform decoding based on soft decision. The soft decision is a decoding process using soft bit information. An example of the method using the soft decision is low-density parity-check code (LDPC). The soft decision requires soft bit information, that is, likelihood information. When assuming that a voltage of a reference for determining a bit value, that is, a voltage for hard decision, is a hard bit reading voltage (HB), HB, the read data which is read using the boundary voltage shifted upward from HB and the read data which is read using the boundary voltage shifted downward from HB are used to generate the soft bit information.

Figure 45:
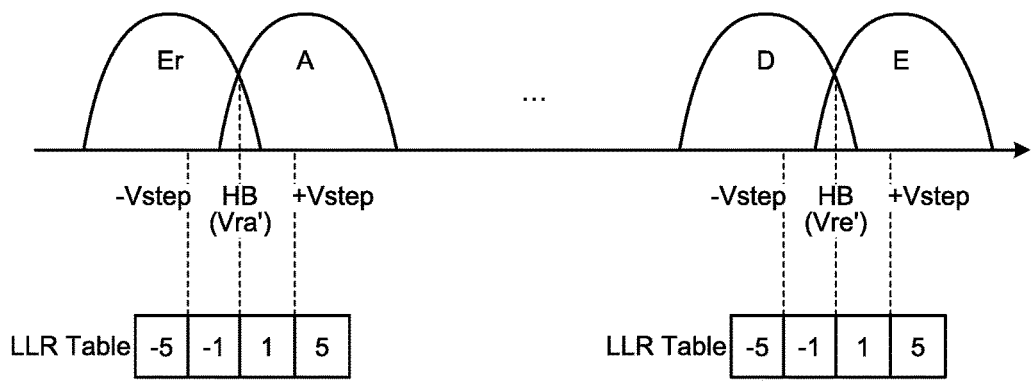
FIG. 45 is a diagram illustrating an example of an LLR table.

The controller 200 stores an LLR table therein and generates soft bit information using the LLR table. FIG. 45 is a diagram illustrating an example of the LLR table. In FIG. 45, the boundary voltages for acquiring the soft bit information when the optimal boundary voltage Vra' is used as the HB voltage is illustrated. In the example illustrated in FIG. 45, HB, one point (+Vstep) higher than HB, and one point (−Vstep) lower than HB are applied. When the optimal boundary voltage Vre' is used as the HB voltage, the boundary voltages of points higher and lower than HB are applied similarly. The number of boundary voltages which are applied to acquire the soft bit information may not be one for each side of higher and lower than HB.

An example of the LLR table is illustrated in the lower part of FIG. 45. When three boundary voltages which are HB, HB−Vstep, and HB+Vstep are applied, in which of four areas of an area equal to or lower than HB−Vstep, an area higher than HB−Vstep and equal to or lower than HB, an area higher than HB and equal to or lower than HB+Vstep, and an area higher than HB+Vstep the threshold voltage of each memory cell is can be found by deciding whether the memory cell is in the ON state or in the OFF state. The controller 200 generates information (area information) indicating in which of the fourth areas the threshold voltage of each memory cell is.

Specifically, the controller 200 (for example, the CPU 230) holds all the separated data in the controller 200 (for example, the buffer memory 240) and determines the optimal boundary voltages from the used shift reading voltages. The controller 200 regards each of the optimal boundary voltages as the HB voltage. The controller 200 selects the separated data generated from the read data of the shift reading using the boundary voltage higher by Vstep than the HB voltage and the separated data generated from the read data of the shift reading using the boundary voltage lower by Vstep than the HB voltage from all the separated data held in the controller 200, and generates the area information using the selected separated data. The area information is generated for each HB voltage. The controller 200 converts the area information into the soft bit information using the LLR table. The ECC circuit 260 performs error detection and error correction on the basis of the soft bit information.

In the third embodiment, the controller 200 selects the separated data for each type of single-level reading among all the separated data held in the controller 200 and generates the same data as the read data acquired by the shift reading when the optimal boundary voltages are used from the selected separated data.

Figure 46:
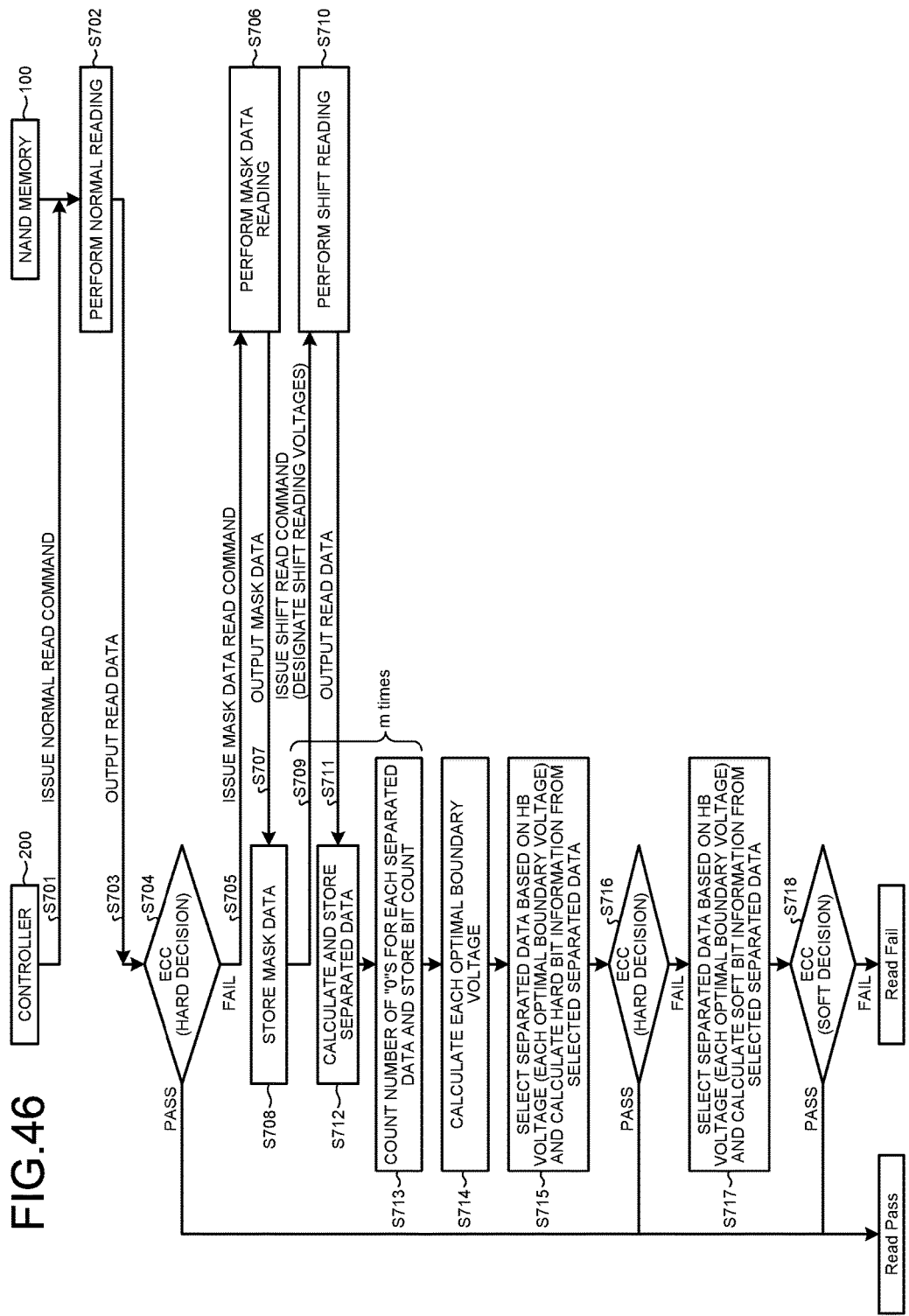
FIG. 46 is a flowchart illustrating an operation of a memory system according to a third embodiment.

FIG. 46 is a flowchart illustrating the operation of the memory system 1 according to the third embodiment. First, the same processes as S101 to S106 are performed in S701 to S706. The CPU 230 causes the NAND memory 100 to output the mask data (S707) and stores the acquired mask data, for example, in the buffer memory 240 of the controller 200 (S708). One piece of mask data is output in a case of the lower estimation process or the upper estimation process, and two pieces of mask data are output in a case of the middle estimation process.

Subsequently, the CPU 230 issues a shift read command and transmits the shift read command to the NAND memory 100 (S709). In the NAND memory 100, the shift reading is performed (S710). The CPU 230 acquires read data from the NAND memory 100 (S711) and calculates separated data from the read data acquired for every shift reading using the mask data (S712). The CPU 230 stores the separated data, for example, in the buffer memory 240 of the controller 200. The CPU 230 calculates the bit counts on the basis of the separated data and stores the calculated bit counts (S713).

The processes of S709 to S713 are performed plural (m herein) times while shifting the boundary voltages.

Figure 47:
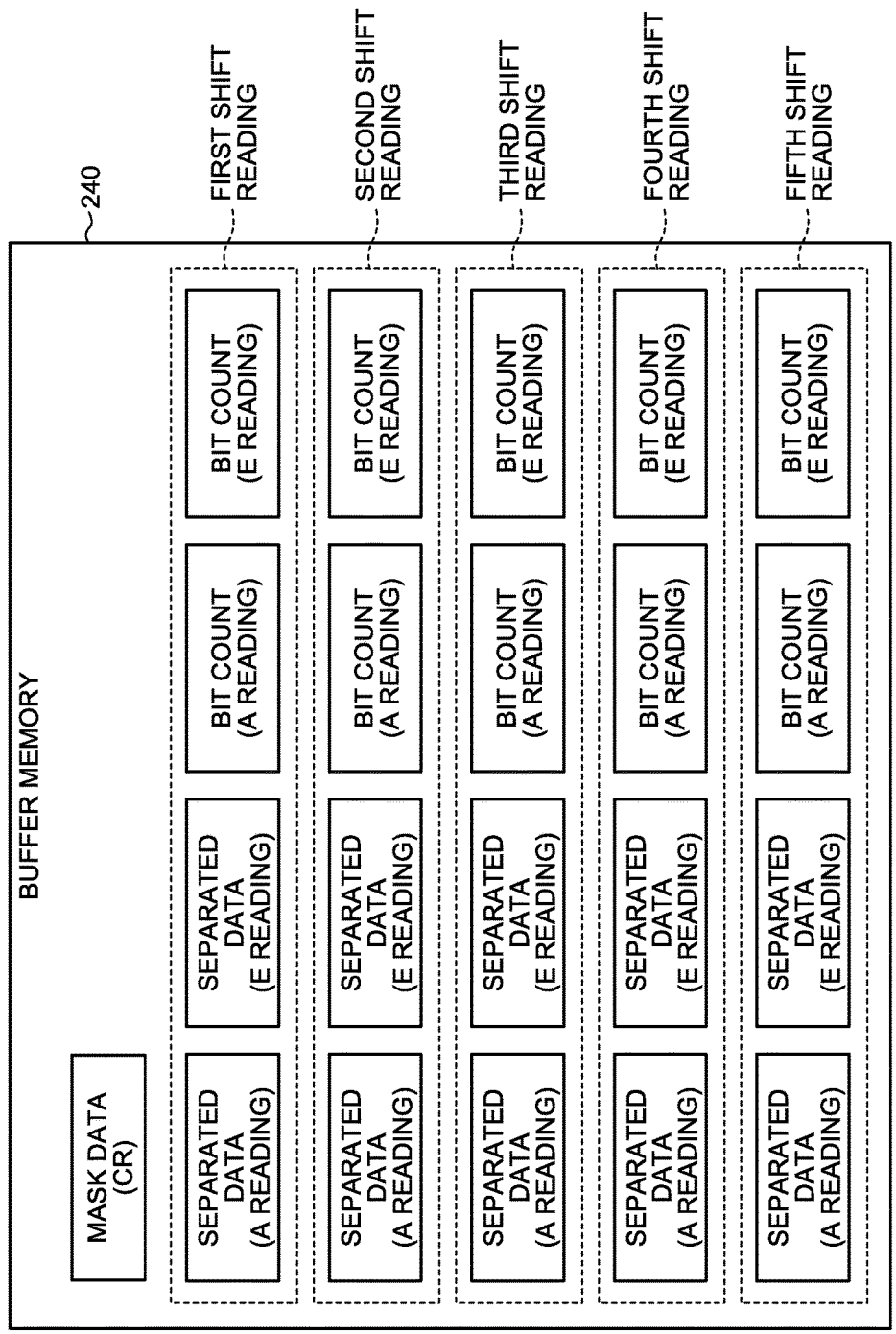
FIG. 47 is a diagram illustrating data in a buffer memory of the memory system according to the third embodiment.

FIG. 47 is a diagram illustrating data in the buffer memory 240 when S713 is completed. This drawing illustrates data in the buffer memory 240 in a case where a lower page is to be read. The mask data CR is held in the buffer memory 240. In the buffer memory 240, the separated data AR and the separated data ER are held for every shift reading. In the buffer memory 240, the bit count corresponding to the separated data AR and the bit count corresponding to the separated data ER are held for every shift reading.

The CPU 230 calculates the optimal boundary voltages using the same method as in the first and second embodiments on the basis of the bit counts (S714). Each of the optimal boundary voltages is one of plural shift reading voltages which have been used.

Subsequently, the CPU 230 selects one piece of separated data for each HB voltage (that is, for each optimal boundary voltage) from plural pieces of separated data stored in the buffer memory 240, and calculates the read data which should be read if the optimal boundary voltages are used from the selected separated data (S715). Since each of the optimal boundary voltages is one of the plural shift reading voltages which have been used, the sensing result acquired when the optimal boundary voltages are used has been already acquired as the separated data in the buffer memory 240. In the process of S715, the CPU 230 selects the sensing results acquired when the optimal boundary voltages are used among the separated data stored in the buffer memory 240.

For example, a case in which a lower page is to be read and Shift_a4 and Shift_e2 are used as the optimal boundary voltages is considered. The CPU 230 selects the separated data of the A reading generated from the read data of the fourth shift reading (SFT4), the separated data of the E reading generated from the read data of the second shift reading (SFT2), and generates hard bit information from the selected separated data. For example, the CPU 230 can acquire the hard bit information of the lower page by performing a NOT operation on the separated data of the A reading and performing an OR operation of the separated data of the A reading which is inverted by the NOT operation and the separated data of the E reading.

The ECC circuit 260 performs the error detection on the hard bit information and the error correction when an error or errors are detected (S716). Determination using the soft bit information is called soft decision, and the process of S716 is called hard decision. The process of S704 corresponds to the hard decision similarly to the process of S716.

When the hard decision of S716 fails (S716, Fail), the CPU 230 regards each of the optimal boundary voltages as the HB voltage and calculates the soft bit information using the separated data stored in the buffer memory 240 (S717). The CPU 230 inputs the calculated soft bit information to the ECC circuit 260. The ECC circuit 260 performs the soft decision using the soft bit information (S718).

When any one of the hard decision of S704, the hard decision of S716, and the soft decision of S718 succeeds, the data reading ends. When all of the hard decision of S704, the hard decision of S716, and the soft decision of S718 fail, the CPU 230 determines that the data reading fails (Read Fail) and the data reading ends.

As described above, according to the third embodiment, the controller 200 performs the shift reading plural times while shifting the boundary voltages in the estimation process and acquires the separated data for every shift reading. The controller 200 calculates the soft bit information from the separated data for every shift reading and inputs the calculated soft bit information to the ECC circuit 260. The ECC circuit 260 performs the soft decision using the soft bit information. The decoding process using the soft decision has higher correction capability than the decoding process using the hard decision. Since the controller 200 can use the separated data acquired by the estimation process to generate the soft bit information, a calculation cost required for reading for acquiring the soft bit information can be reduced and high correction capability can be achieved.

The controller 200 generates, by using the separated data acquired by the estimation process, in the controller 200, the same data as the read data which should be read by using the optimal boundary voltages are used. Accordingly, the controller 200 can acquire the read data without accessing the NAND memory 100 using the optimal boundary voltages acquired by the estimation process.

The controller 200 may acquire the read data from the NAND memory 100 by performing an access to the NAND memory 100 (the shift reading) using the optimal boundary voltages acquired by the estimation processes.

In the third embodiment, it has been described that the controller 200 calculates the separated data in the estimation process. Instead of the above-mentioned estimation process, the estimation process of the first embodiment or the estimation process of the second embodiment can be employed.

Fourth Embodiment

Figure 48:
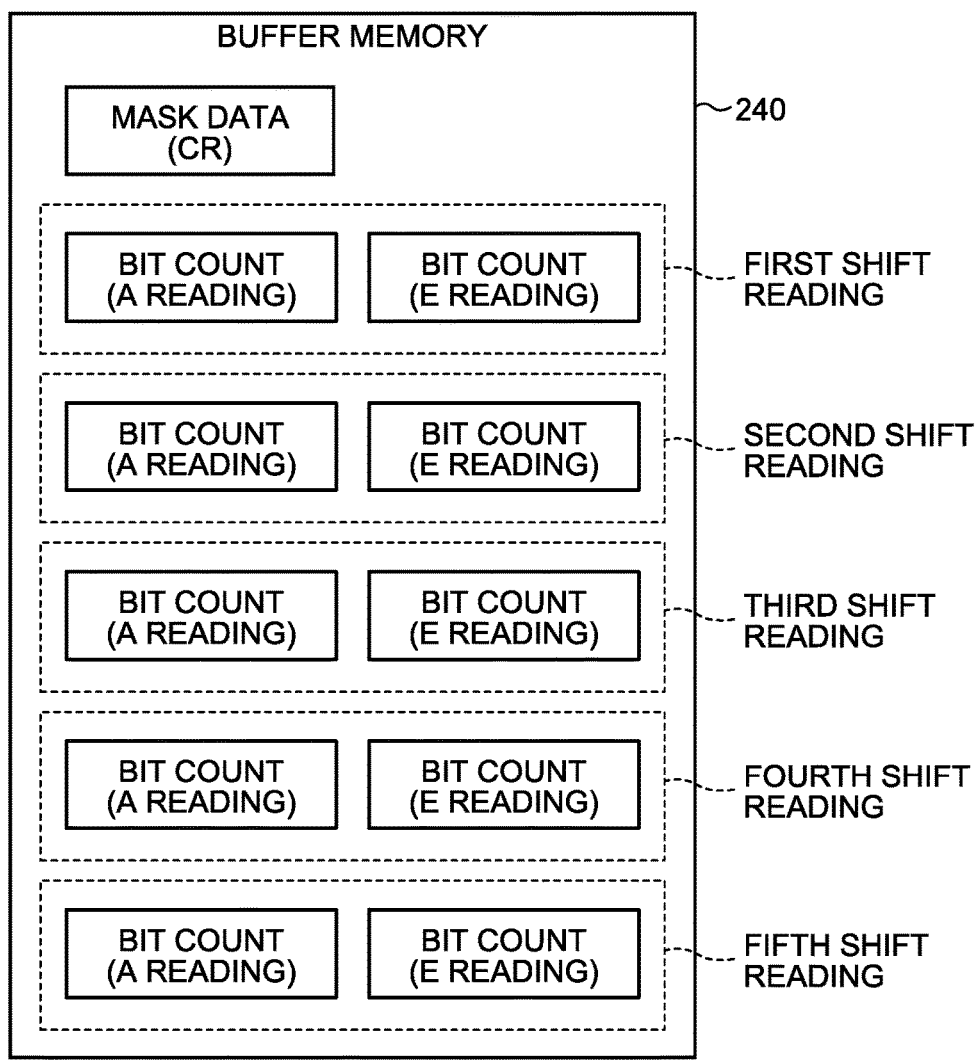
FIG. 48 is a diagram illustrating an example of data stored in a buffer memory of a memory system according to a fourth embodiment.

In the third embodiment, the controller 200 holds the separated data in the controller 200. The controller 200 may not hold the separated data in the controller 200. FIG. 48 is a diagram illustrating an example of data which is stored in the buffer memory 240 in a case where the separated data is not held in the controller 200. The CPU 230 holds the mask data in the buffer memory 240. The CPU 230 calculates the separated data from the shift data which is sequentially received, and calculates the bit counts without holding the separated data in the buffer memory 240.

In this way, since the separated data is not accumulated in the controller 200, memory use of the buffer memory 240 can be reduced. In the fourth embodiment, the controller 200 cannot generate the soft bit information from the separated data. Accordingly, the controller 200 needs to perform the shift reading again using the acquired optimal boundary voltages and appropriate voltages around the optimal boundary voltages in order to perform the hard and soft decision.

Fifth Embodiment

Figure 49:
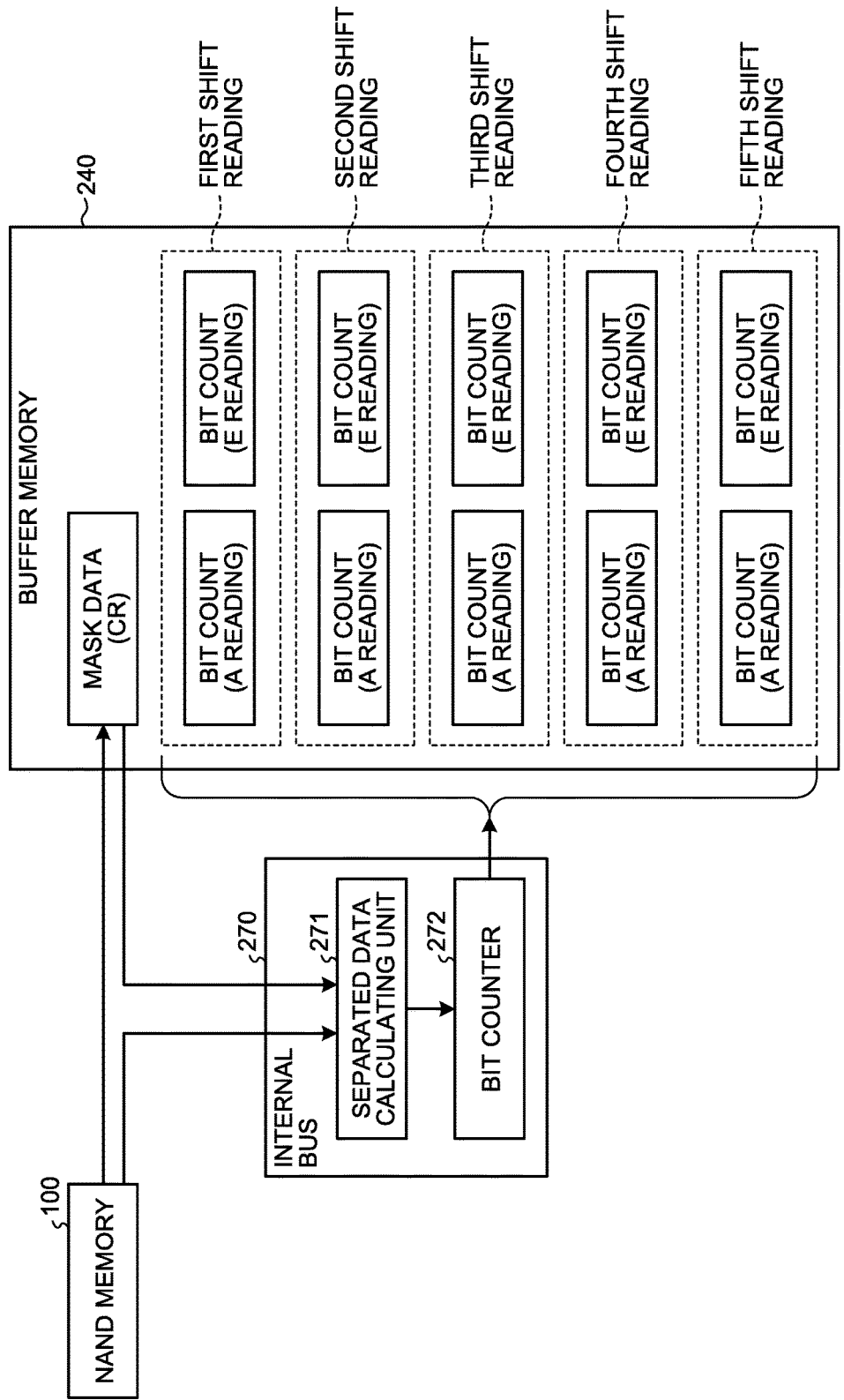
FIG. 49 is a diagram illustrating an example of a configuration of an internal bus in a controller of a memory system according to a fifth embodiment.

In a fifth embodiment, the internal bus 270 of the controller 200 instead of the CPU 230 performs various operations. FIG. 49 is a diagram illustrating an example of the configuration of the internal bus 270. As illustrated in the drawing, the internal bus 270 of the controller 200 includes a separated data calculating unit 271 and a bit counter 272. The separated data calculating unit 271 generates separated data on the basis of the mask data stored in the buffer memory 240 and the read data of the shift reading received from the NAND memory 100, and calculates the bit count from the generated separated data. The bit count is stored in the buffer memory 240.

Sixth Embodiment

In a sixth embodiment, the controller 200 causes the NAND memory 100 to perform multi-level reading instead of the shift reading in the estimation process. The multi-level reading is a process of performing plural times of single-level reading and holding the acquired sensing results in different latch circuits respectively. For example, the multi-level reading includes the same types of single-level reading as the normal reading. That is, similarly to the normal reading and the shift reading, each bit of a data value of multiple bits stored in the memory cell are correlated with corresponding types of single-level reading in advance.

For example, in the case of memory cells of 3 bits/cell, multi-level reading in which a lower page is to be read includes A reading and E reading. Multi-level reading in which a middle page is to be read includes B reading, D reading, and F reading. Multi-level reading in which an upper page is to be read includes C reading and G reading. Hereinafter, for example, the case of memory cells of 3 bits/cell will be described.

In first embodiment, the read data is first calculated and then the separated data is calculated on the basis of the read data. The separated data corresponds to the sensing result of the single-level reading. On the other hand, in the multi-level reading, the calculating of the read data is not performed. The controller 200 issues a command for the multi-level reading (a multi-level read command) and then causes the NAND memory 100 to output the sensing results. Thereafter, the sensing result of the single-level reading may be referred to as single-level data.

In the multi-level read command, the boundary voltages which are used in single-level reading constituting the multi-level reading can be designated. Similarly to the shift read command, an arbitrary method can be employed as the method of designating the boundary voltages for the multi-level reading.

In the multi-level read command, a target page can be designated similarly to the shift read command. Similarly to the shift read command, a word line can be designated by the multi-level read command. In the multi-level read command, a page can be designated. As an example of the method of designating a word line and a page, the same block address and the same page address as in the normal read command may be designated. As another example of the method of designating a word line and a page, the CPU 230 may transmit an address of a word line and designation of an upper page, a middle page, or a lower page to the NAND memory 100.

Figure 50:
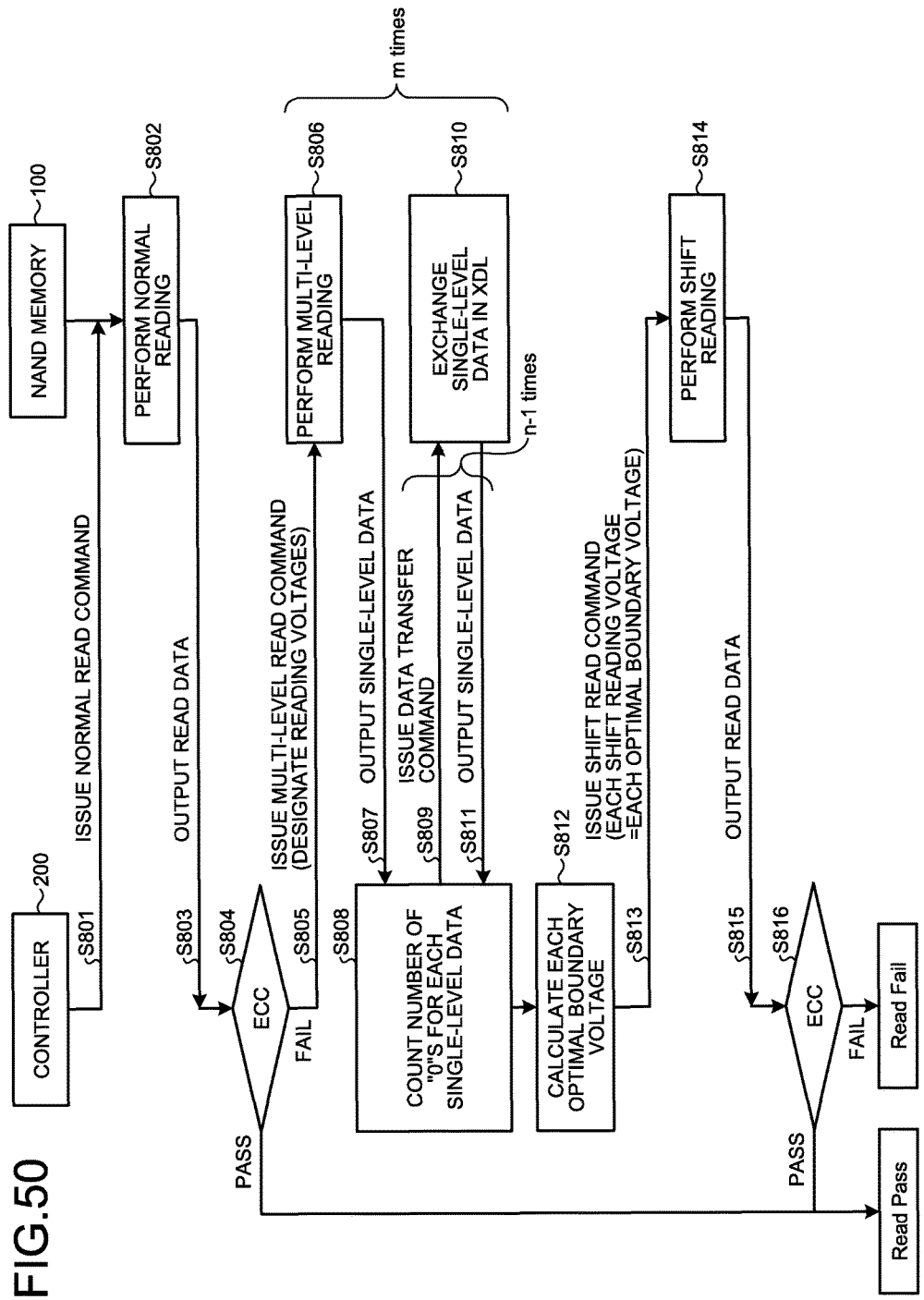
FIG. 50 is a flowchart illustrating an operation of a memory system according to a sixth embodiment.

FIG. 50 is a flowchart illustrating the operation of the memory system 1 according to the sixth embodiment. First, the same operations as S101 to S104 are performed in S801 to S804. In S804, when no error is present or the number of errors is equal to or less than a predetermined value and the errors can be corrected (S804, Pass), the reading of target data ends (Read Pass).

When the number of errors is greater than the predetermined value (S804, Fail), the CPU 230 starts an estimation process for estimating the optimal boundary voltages for each single-level reading constituting the normal reading of S802. The estimation process of the sixth embodiment includes the processes of S805 to S812.

The multi-level reading in the estimation process of the sixth embodiment corresponds to the shift reading in the estimation process of the first embodiment. That is, in the same way as the boundary voltages are shifted for every shift reading in the estimation process of the first embodiment, the boundary voltages are shifted for every multi-level reading in the estimation process of the sixth embodiment. For example, the boundary voltages are shifted by the certain amount.

In the estimation process of the sixth embodiment, the CPU 230 performs the multi-level reading plural times (m times herein) while shifting the boundary voltages. In S805, the CPU 230 issues a multi-level read command and transmits the multi-level read command to the NAND memory 100. In the multi-level read command, the CPU 230 designates the target page of the normal reading of S802.

In response to the multi-level read command, the sequencer 170 performs the multi-level reading (S806). The sequencer 170 performs plural times of single-level reading and stores the sensing results of the single-level reading (single-level data) in different latch circuits among the latch circuits ADL, BDL, CDL, DDL, and XDL, respectively. In the lower estimation process, single-level data AR and ER are stored in different latch circuits respectively. In the middle estimation process, single-level data BR, DR, and FR are stored in different latch circuits respectively. In the upper estimation process, single-level data CR and GR are stored in different latch circuits respectively.

Subsequently, outputting of data is performed for each piece of single-level data read by the multi-level reading. Here, the outputting of data is performed n times. Here, n is the number of types of single-level reading constituting the shift reading. For example, n is "2" in the lower estimation process or the upper estimation process, and n is "3" in the middle estimation process.

Here, in the multi-level reading of S806, it is assumed that the single-level data which is acquired at the first time from the memory cell array 110 among n pieces of single-level data is stored in the latch circuit XDL. The CPU 230 outputs the single-level data stored in the latch circuit XDL among the n pieces of single-level data (S807). The output single-level data is input to, for example, the buffer memory 240 of the controller 200 via the NAND interface.

When the single-level data is acquired by the process of S807, the CPU 230 counts the number of "0"s included in the single-level data (S808). That is, the CPU 230 calculates the bit count similarly to the process of S112 of the first embodiment.

Subsequently, the CPU 230 issues a data transfer command and transmits the data transfer command to the NAND memory 100 (S809). The data transfer command is a command for storing single-level data which has not been output yet among the n pieces of single-level data in the latch circuit XDL. In response to the data transfer command, the column control circuit 140 stores the single-level data which has not been output yet in the latch circuit XDL (S810). More specifically, the column control circuit 140 overwrites the latch circuit XDL with the single-level data which has not been output yet. The CPU 230 causes the column control circuit 140 to output the single-level data stored in the latch circuit XDL (S811). The output single-level data is input to, for example, the buffer memory 240 of the controller 200 via the NAND interface, similarly to S807.

The processes of S809, S810, S811, and S808 are performed on n−1 pieces of single-level data except for the single-level data which is output by the process of S807 among the n pieces of single-level data. That is, the processes of S809, S810, S811, and S808 are performed n−1 times.

The acquisition of the n pieces of single-level data is performed for each of m times of multi-level reading. After the acquisition of the n pieces of single-level data is completed for each of the m times of multi-level reading, the CPU 230 calculates the optimal boundary voltages (S812). The process of S812 is the same as the process of S113.

After the process of S812, the same operations as S114 to S117 are performed in S813 to S816.

A specific example of the method of operating the latch circuits in every multi-level reading will be described below with reference to FIGS. 51 to 53. The order of performing the single-level reading constituting the multi-level reading can be arbitrarily designed. For example, it is assumed herein that the single-level reading is performed in the order of voltages from the single-level reading in which the smallest boundary voltage is used.

Figure 51:
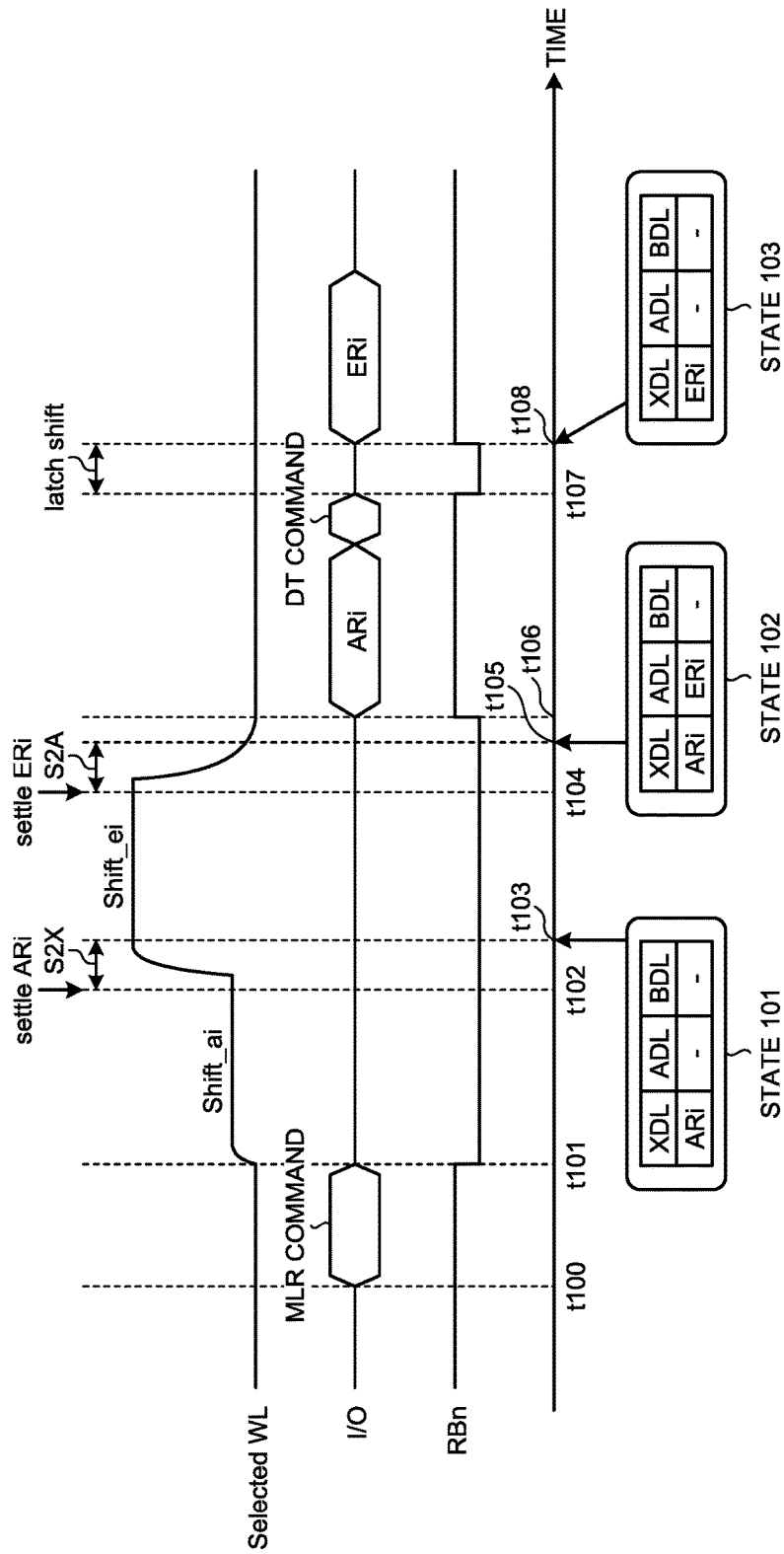
FIG. 51 is a diagram illustrating an example of a method of operating each latch circuit in the lower estimation process according to the sixth embodiment.

FIG. 51 is a diagram illustrating an example of the method of operating the latch circuits in the lower estimation process. The FIG. 51 illustrates transition of a latch circuit state, transition of a voltage of a selected word line WL (Selected WL), and transition of an input/output signal I/O and a ready/busy signal RBn.

First, the CPU 230 issues a multi-level read command (MLR command) (time t100). The issuing of the multi-level read command corresponds to the process of S805.

When the multi-level read command is received (time t101), the sequencer 170 changes the ready/busy signal RBn from the ready state to the busy state and starts elevating the voltage of the selected word line WL. First, the sequencer 170 elevates the voltage of the selected word line WL to a voltage Shift_ai in order to perform the A reading. After the voltage of the selected word line WL reaches the voltage Shift_ai, the sequencer 170 causes the column control circuit 140 to settle the single-level data ARi (time t102). The single-level data ARi is stored in the latch circuit SDL. Subsequently, the sequencer 170 causes the column control circuit 140 to perform a process (S2X) of transferring the data from the latch circuit SDL to the latch circuit XDL. Accordingly, the single-level data ARi in the latch circuit SDL is moved to the latch circuit XDL. STATE 101 in the drawing indicates states of the latch circuits at a time at which S2X is completed (time t103). Here, the latch circuits CDL, DDL, and SDL are not illustrated. As indicated by STATE 101, the single-level data ARi is stored in the latch circuit XDL and no data is stored in the latch circuits ADL and BDL.

The sequencer 170 elevates the voltage of the selected word line WL to a voltage Shift_ei in order to perform the E reading after the single-level data ARi is settled. After the voltage of the selected word line WL reaches the voltage Shift_ei, the sequencer 170 causes the column control circuit 140 to settle the single-level data ERi (time t104). The single-level data ER is stored in the latch circuit SDL. Subsequently, the sequencer 170 causes the column control circuit 140 to perform a process (S2A) of transferring the data from the latch circuit SDL to the latch circuit ADL. Accordingly, the single-level data ERi in the latch circuit SDL is moved to the latch circuit ADL. STATE 102 in the drawing indicates states of the latch circuits at a time at which S2A is completed (time t105). The single-level data ARi is stored in the latch circuit XDL, the single-level data ERi is stored in the latch circuit ADL, and no data is stored in the latch circuit BDL.

The sequencer 170 discharges the voltage applied to the selected word line WL after the single-level data ERi is settled. When the S2A is completed and the process on the memory cell array 110 is completed (time t106), the sequencer 170 changes the ready/busy signal RBn from the busy state to the ready state. The completion of the process on the memory cell array 110 means that the discharging of the voltage applied to the selected word line WL is completed and a next process on the memory cell array 110 can be performed. The processes from time t101 to time t106 correspond to the process of S806.

In this way, the sequencer 170 performs the settling of the single-level data AR, the S2X, the settling of the single-level data ER, and the S2A in this order in accordance with the multi-level read command having a lower page as a target.

The CPU 230 causes the column control circuit 140 to output the data in the latch circuit XDL (the single-level data ARi at this time) in response to the changing of the ready/busy signal RBn to the ready state after the multi-level read command is issued. This process corresponds to the process of S807. The CPU 230 issues the data transfer command when the acquiring of the single-level data ARi is completed. This process corresponds to the process of S809.

Figure 52:
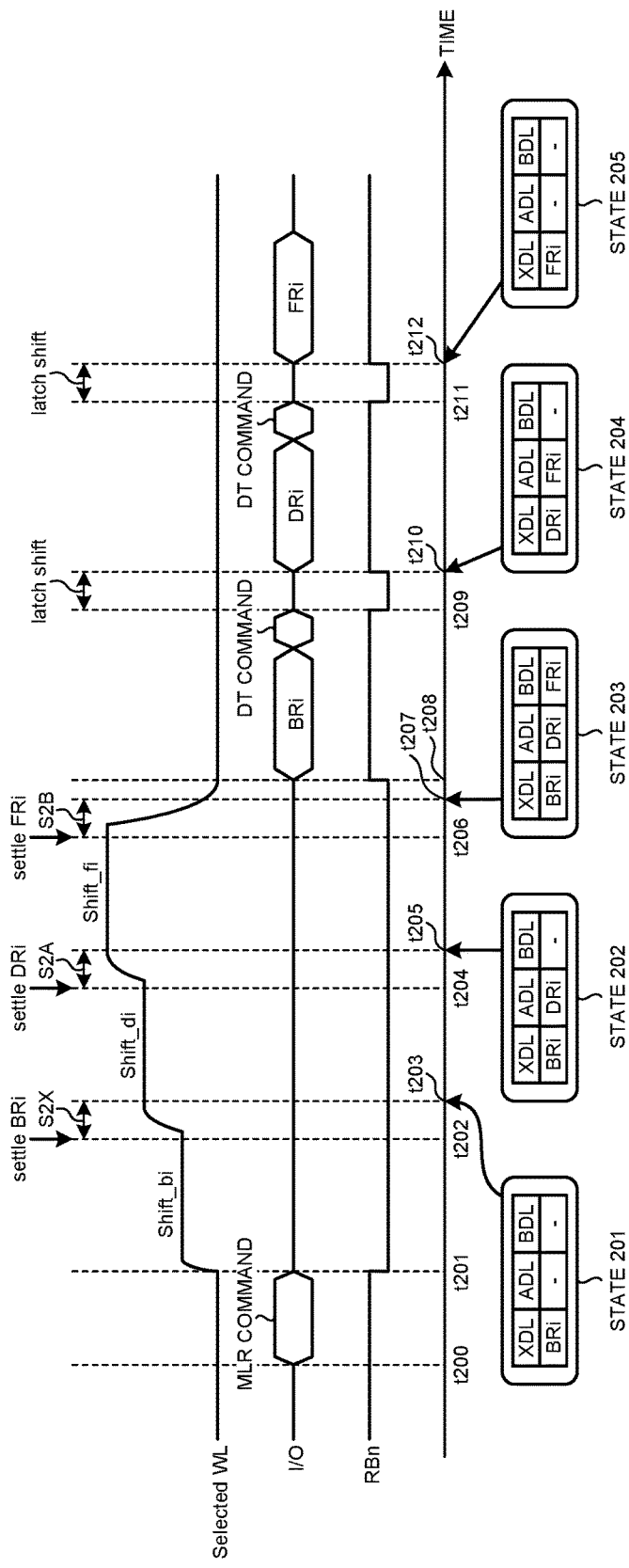
FIG. 52 is a diagram illustrating an example of a method of operating each latch circuit in the middle estimation process according to the sixth embodiment.
Figure 53:
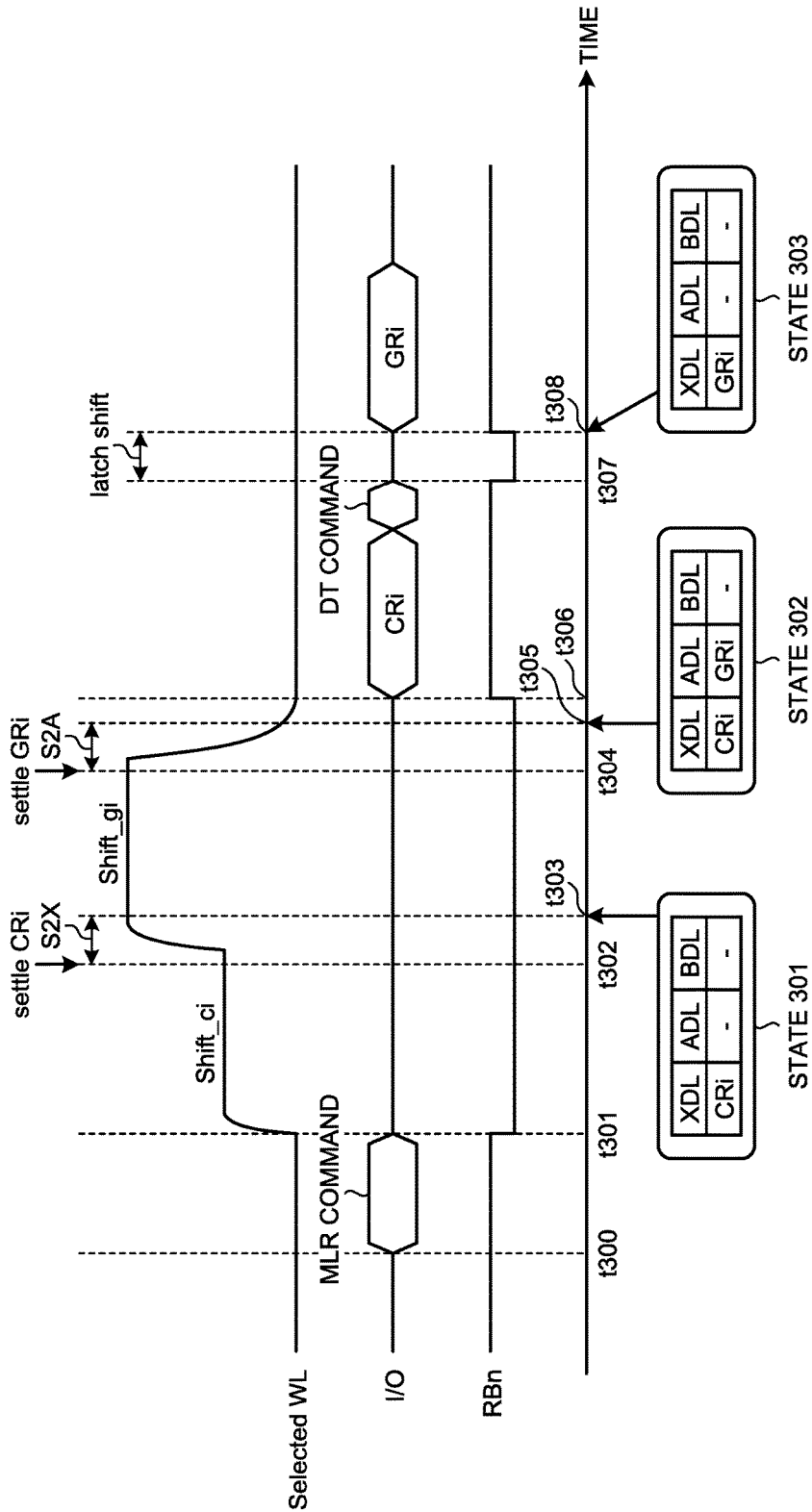
FIG. 53 is a diagram illustrating an example of a method of operating each latch circuit in the upper estimation process according to the sixth embodiment.

In the examples illustrated in FIGS. 51 to 53, as an example of exchanging the data in the latch circuit XDL with non-output single-level data (the process of S810), the column control circuit 140 transfers data from the latch circuit ADL to the latch circuit XDL (A2X), transfers data from the latch circuit BDL to the latch circuit ADL (B2A), transfers data from the latch circuit CDL to the latch circuit BDL (C2B), and transfers data from the latch circuit DDL to the latch circuit CDL (D2C). This process is referred to as a latch shift process. By this latch shift process, the data stored in the latch circuit XDL before the data transfer command is exchanged with the data stored in the latch circuit ADL before the data transfer command.

When the data transfer command is received (time t107), the sequencer 170 causes the column control circuit 140 to perform the latch shift process. The sequencer 170 changes the ready/busy signal RBn to the busy state when the latch shift process is started, and changes the ready/busy signal RBn to the ready state when the latch shift process is completed. When the latch shift process is completed (time t108), the states of the latch circuits are changed to STATE 103. In STATE 103, the single-level data ERi is stored in the latch circuit XDL and no data is stored in the latch circuits ADL and BDL.

The CPU 230 causes the column control circuit 140 to output the data in the latch circuit XDL (the single-level data ERi at this time) in response to the changing of the ready/busy signal RBn to ready state. This process corresponds to the process of S811.

The process illustrated in FIG. 51 is performed m times while shifting the boundary voltages.

FIG. 52 is a diagram illustrating an example of the method of operating the latch circuits in the middle estimation process. First, the CPU 230 issues a multi-level read command (time t200). The issuing of the multi-level read command corresponds to the process of S805.

When the multi-level read command is received (time t201), the sequencer 170 changes the ready/busy signal RBn from the ready state to the busy state and starts elevating the voltage of the selected word line WL. In order to perform the B reading, the sequencer 170 first elevates the voltage of the selected word line WL to a voltage Shift_bi. After the voltage of the selected word line WL reaches the voltage Shift_bi, the sequencer 170 causes the column control circuit 140 to settle the single-level data BRi (time t202). The single-level data BRi is stored in the latch circuit SDL. Subsequently, the sequencer 170 causes the column control circuit 140 to perform the S2X. Accordingly, the single-level data BRi in the latch circuit SDL is moved to the latch circuit XDL. STATE 201 indicates the states of the latch circuits at a time at which the S2X is completed (time t203). Here, the latch circuits CDL, DDL, and SDL are not illustrated. In STATE 201, the single-level data BRi is stored in the latch circuit XDL and no data is stored in the latch circuits ADL and BDL.

After the single-level data BRi is settled, the sequencer 170 elevates the voltage of the selected word line WL to a voltage Shift_di in order to perform the D reading. After the voltage of the selected word line WL reaches the voltage Shift_di, the sequencer 170 causes the column control circuit 140 to settle the single-level data DRi (time t204). The single-level data DRi is stored in the latch circuit SDL. Subsequently, the sequencer 170 causes the column control circuit 140 to perform the S2A. Accordingly, the single-level data DRi in the latch circuit SDL is moved to the latch circuit ADL. STATE 202 in the drawing indicates the states of the latch circuits at a time at which the S2A is completed (time t205). The single-level data BRi is stored in the latch circuit XDL, the single-level data DRi is stored in the latch circuit ADL, and no data is stored in the latch circuit BDL.

After the single-level data DRi is settled, the sequencer 170 elevates the voltage of the selected word line WL to a voltage Shift_fi in order to perform the F reading. After the voltage of the selected word line WL reaches the voltage Shift_fi, the sequencer 170 causes the column control circuit 140 to settle the single-level data FRi (time t206). The single-level data FRi is stored in the latch circuit SDL. Subsequently, the sequencer 170 causes the column control circuit 140 to perform the process of transferring data from the latch circuit SDL to the latch circuit BDL (S2B). Accordingly, the single-level data FRi in the latch circuit SDL is moved to the latch circuit BDL. STATE 203 in the drawing indicates the states of the latch circuits at a time at which the S2B is completed (time t207). In STATE 203, the single-level data BRi is stored in the latch circuit XDL, the single-level data DRi is stored in the latch circuit ADL, and the single-level data FRi is stored in the latch circuit BDL.

After the single-level data FRi is settled, the NAND memory 100 discharges the voltage applied to the selected word line WL. When the S2B is completed and the process on the memory cell array 110 is completed (time t208), the sequencer 170 changes the ready/busy signal RBn from the busy state to the ready state. The process from time t201 to time t208 corresponds to the process of S806.

In this way, the sequencer 170 performs the settling of the single-level data BR, the S2X, the settling of the single-level data DR, the S2A, the settling of the single-level data FR, and the S2B in this order in accordance with the multi-level read command having a middle page as a target.

The CPU 230 causes the column control circuit 140 to output the data in the latch circuit XDL (the single-level data BRi at this time) in response to the changing of the ready/busy signal RBn to the ready state after the multi-level read command is issued. This process corresponds to the process of S807. The CPU 230 issues the data transfer command when the acquiring of the single-level data BRi is completed. This process corresponds to the process of S809.

When the data transfer command is received (time t209), the sequencer 170 causes the column control circuit 140 to perform the latch shift process. When the latch shift process is being performed, the sequencer 170 sets the ready/busy signal RBn to the busy state. When the latch shift process is completed (time t210), the states of the latch circuits are changed to STATE 204. In STATE 204, the single-level data DRi is stored in the latch circuit XDL, the single-level data FRi is stored in the latch circuit ADL, and no data is stored in the latch circuit BDL.

The CPU 230 causes the column control circuit 140 to output the data in the latch circuit XDL (the single-level data DRi at this time) in response to the changing of the ready/busy signal RBn to the ready state. This process corresponds to the process of S807. The controller 200 issues the data transfer command when the acquiring of the single-level data DRi is completed. This process corresponds to the process of S809.

When the data transfer command is received again (time t211), the sequencer 170 causes the column control circuit 140 to perform the latch shift process again. When the latch shift process is being performed, the sequencer 170 sets the ready/busy signal RBn to the busy state. When the latch shift process is completed (time t212), the states of the latch circuits are changed to STATE 205. In STATE 205, the single-level data FRi is stored in the latch circuit XDL and no data is stored in the latch circuits ADL and BDL.

The CPU 230 causes the column control circuit 140 to output the data in the latch circuit XDL (the single-level data FRi at this time) in response to the changing of the ready/busy signal RBn to the ready state. This process corresponds to the process of S811.

The process illustrated in FIG. 52 is performed m times while shifting the boundary voltages.

FIG. 53 is a diagram illustrating an example of the method of operating the latch circuits in the upper estimation process. First, the CPU 230 issues a multi-level read command (time t300). The issuing of the multi-level read command corresponds to the process of S805.

When the multi-level read command is received (time t301), the sequencer 170 changes the ready/busy signal RBn from the ready state to the busy state and starts elevating the voltage of the selected word line WL. First, the sequencer 170 elevates the voltage of the selected word line WL to a voltage Shift_ci in order to perform the C reading. After the voltage of the selected word line WL reaches the voltage Shift_ci, the sequencer 170 causes the column control circuit 140 to settle the single-level data CRi (time t302). The single-level data CRi is stored in the latch circuit SDL. Subsequently, the sequencer 170 causes the column control circuit 140 to perform the S2X. Accordingly, the single-level data CRi in the latch circuit SDL is moved to the latch circuit XDL. STATE 301 in the drawing indicates states of the latch circuits at a time at which the S2X is completed (time t303). In STATE 301, the single-level data CRi is stored in the latch circuit XDL and no data is stored in the latch circuits ADL and BDL.

After the single-level data CRi is settled, the sequencer 170 elevates the voltage of the selected word line WL to a voltage Shift_gi in order to perform the G reading. After the voltage of the selected word line WL reaches the voltage Shift_gi, the sequencer 170 causes the column control circuit 140 to settle the single-level data GRi (time t304). The single-level data GRi is stored in the latch circuit SDL. Subsequently, the sequencer 170 causes the column control circuit 140 to perform the S2A. Accordingly, the single-level data GRi in the latch circuit SDL is moved to the latch circuit ADL. STATE 302 in the drawing indicates states of the latch circuits at a time at which the S2A is completed (time t305). In STATE 302, the single-level data CRi is stored in the latch circuit XDL, the single-level data GRi is stored in the latch circuit ADL, and no data is stored in the latch circuit BDL.

The sequencer 170 discharges the voltage applied to the selected word line WL after the single-level data GRi is settled. When the S2A is completed and the process on the memory cell array 110 is completed (time t306), the sequencer 170 changes the ready/busy signal RBn from the busy state to the ready state. The processes from time t301 to time t306 correspond to the process of S806.

In this way, the sequencer 170 performs the settling of the single-level data CR, the S2X, the settling of the single-level data GR, and the S2A in this order in accordance with the multi-level read command having an upper page as a target.

The CPU 230 causes the column control circuit 140 to output the data in the latch circuit XDL (the single-level data CRi at this time) in response to the changing of the ready/busy signal RBn to the ready state after the multi-level read command is issued. This process corresponds to the process of S807. The CPU 230 issues the data transfer command when the acquiring of the single-level data CRi is completed. This process corresponds to the process of S809.

When the data transfer command is received (time t307), the sequencer 170 causes the column control circuit 140 to perform the latch shift process. The sequencer 170 changes the ready/busy signal RBn to the busy state when the latch shift process is started, and changes the ready/busy signal RBn to the ready state when the latch shift process is completed. When the latch shift process is completed (time t308), the states of the latch circuits are changed to STATE 303. In STATE 303, the single-level data GRi is stored in the latch circuit XDL and no data is stored in the latch circuits ADL and BDL.

The CPU 230 causes the column control circuit 140 to output the data in the latch circuit XDL (the single-level data GRi at this time) in response to the changing of the ready/busy signal RBn to ready state. This process corresponds to the process of S811.

The process illustrated in FIG. 53 is performed m times while shifting the boundary voltages.

In this way, according to the sixth embodiment, the sequencer 170 performs at least two types of single-level reading depending on the page and settles the single-level data. After all pieces of single-level data are settled, the column control circuit 140 can output each piece of the single-level data. Since the NAND memory 100 outputs the single-level data without calculating the read data, it is possible to reduce the calculation cost required for calculating the separated data.

The sequencer 170 may adjust the boundary voltages in the normal reading and the multi-level reading. The adjustment algorithm is the same as in the normal reading and the multi-level reading. For example, a adjustment algorithm based on temperature can be employed as the adjustment algorithm.

The estimation process of the sixth embodiment may be employed as the estimation process of the third embodiment. That is, the controller 200 may generate read data from the single-level data acquired by the estimation process of the sixth embodiment. The controller 200 may generate soft bit information on the basis of the single-level data acquired by the estimation process of the sixth embodiment and may input the soft bit information to the ECC circuit 260, and the ECC circuit 260 may perform soft decision using the soft bit information.

Seventh Embodiment

According to a seventh embodiment, the NAND memory 100 can operate in a cache mode. By using the cache mode, the NAND memory 100 can perform outputting of the single-level data and an access to the memory cell array 100 in parallel.

Figure 54:
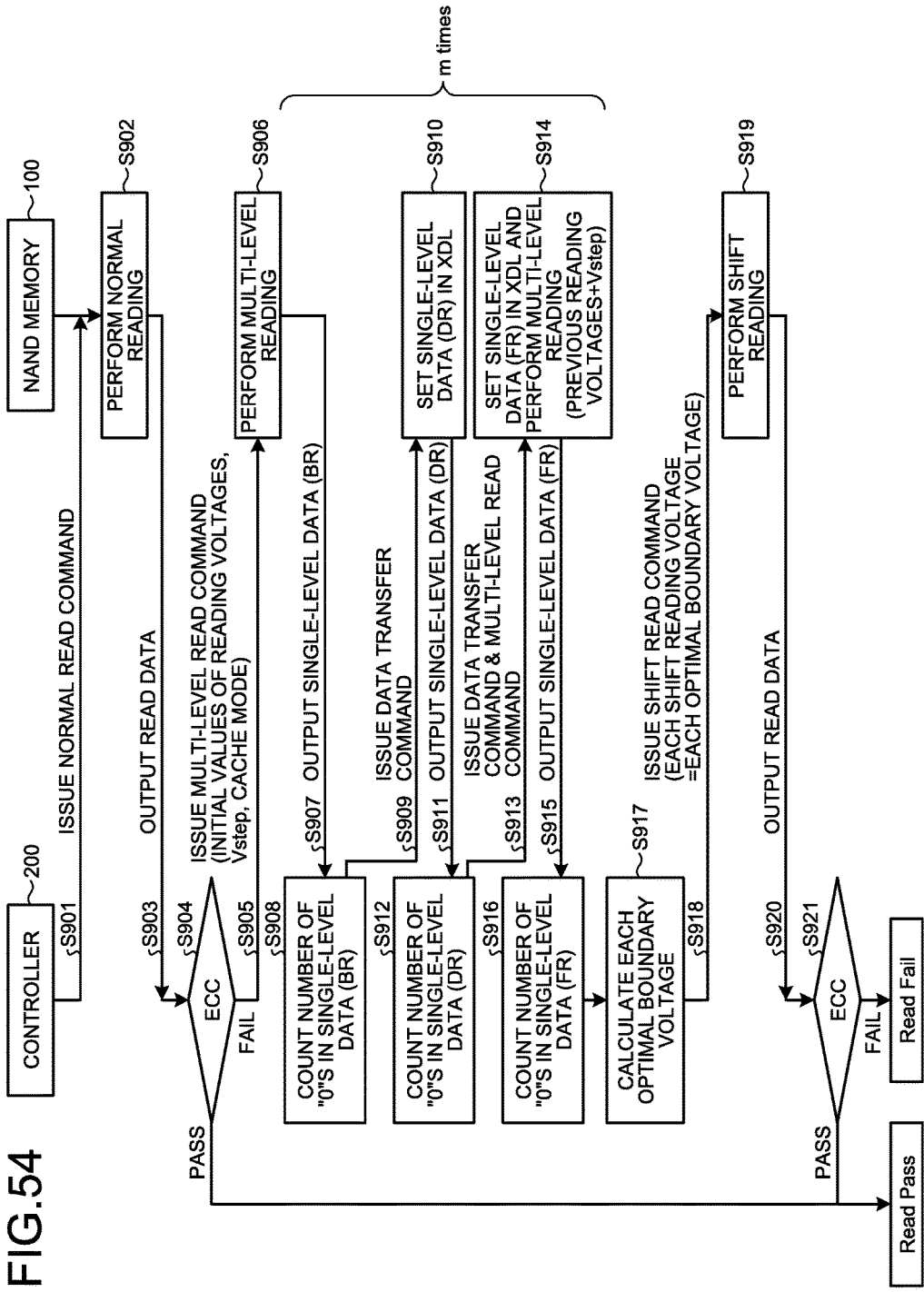
FIG. 54 is a flowchart illustrating an operation of a memory system according to a seventh embodiment.

FIG. 54 is a flowchart illustrating the operation of the memory system 1 according to the seventh embodiment. For example, a reading operation with a middle page as a target location of reading will be described herein.

The same processes as S501 to S504 are performed in S901 to S904. In S904, when no error is present or the number of errors is equal to or less than a predetermined value and the error or errors can be corrected (S904, Pass), the reading of data ends.

When the number of errors is greater than the predetermined value (S904, Fail), the CPU 230 starts the estimation process. The estimation process of the seventh embodiment includes the processes of S905 to S917.

In the estimation process of the seventh embodiment, the CPU 230 performs the multi-level reading plural times (m times herein) while shifting the boundary voltages. In S905, the CPU 230 issues a multi-level read command and transmits the multi-level read command to the NAND memory 100. In the multi-level read command, the CPU 230 designates a target page of the normal reading of S902. The CPU 230 designates initial values of the reading voltages, Vstep, and the cache mode. Here, it is assumed that the shift reading voltages are elevated by Vstep whenever the shift reading is performed, and the initial values are reading voltages which are used in the first multi-level reading.

In response to the multi-level read command, the sequencer 170 performs the multi-level reading (S906). The sequencer 170 performs plural times of single-level reading and stores the sensing results of the single-level reading (single-level data) in different latch circuits among the latch circuits ADL, BDL, CDL, DDL, and XDL, respectively. Here, single-level data BR, DR, and FR are stored in different latch circuits respectively.

Subsequently, each piece of single-level data read by the multi-level reading is performed. Here, the outputting of the single-level data BR, DR, and FR is performed.

In the multi-level reading of S906, it is assumed that the single-level data BR, the single-level data DR, and the single-level data FR are acquired in this order. It is assumed that the single-level data BR which is the single-level data first acquired from the memory cell array 110 among the above-mentioned single-level data is stored in the latch circuit XDL.

The CPU 230 causes the column control circuit 140 to output the single-level data stored in the latch circuit XDL (that is, the single-level data BR) among three pieces of single-level data (S907). The single-level data BR is input to, for example, the buffer memory 240 of the controller 200 via the NAND interface.

When the single-level data BR is acquired by the process of S907, the CPU 230 counts the number of "0"s included in the single-level data BR (S908). The CPU 230 calculates the bit count from the single-level data BR using the same method as the process of S112 of the first embodiment.

Subsequently, the CPU 230 issues a data transfer command and transmits the data transfer command to the NAND memory 100 (S909). In response to the data transfer command, the column control circuit 140 stores the non-output single-level data in the latch circuit XDL (S910). For example, the column control circuit 140 stores the single-level data DR in the latch circuit XDL herein. The CPU 230 causes the column control circuit 140 to output the single-level data stored in the latch circuit XDL (that is, the single-level data DR) (S911). The output single-level data DR is input to, for example, the buffer memory 240 of the controller 200 via the NAND interface, similarly to S907. When the single-level data DR is acquired, the CPU 230 counts the number of "0"s included in the single-level data DR using the same method as the process of S908 (S912).

Subsequently, the CPU 230 issues a data transfer command and a multi-level read command for requesting next multi-level reading and successively transmits the issued commands to the NAND memory 100 (S913). The successive transmitting of the data transfer command and the multi-level read command to the NAND memory 100 means that the data transfer command is transmitted and then the multi-level read command is transmitted before the sequencer 170 starts transferring the data to the latch circuit XDL in response to the data transfer command.

In response to the data transfer command and the multi-level read command, the sequencer 170 causes the column control circuit 140 to store the single-level data which has not been output yet (the single-level data FR herein) in the latch circuit XDL and performs the multi-level reading (S914). In S914, the sequencer 170 uses the voltage values, which are acquired by adding Vstep to the boundary voltages which are previously used, as the current boundary voltages.

When the multi-level reading is being performed, the CPU 230 causes the NAND memory 100 to output the single-level data stored in the latch circuit XDL (that is, the single-level data FR) (S915). When the single-level data FR is acquired, the CPU 230 counts the number of "0"s included in the single-level data FR using the same method as the process of S908 (S916).

In S914, the sequencer 170 keeps the ready/busy signal RBn in the busy state while the data transfer command is being executed. Then, when executing of the data transfer command is completed, the sequencer 170 changes the ready/busy signal RBn to the ready state regardless of whether the multi-level reading is being performed on the memory cell array 110 in the background. The CPU 230 can recognize that the single-level data FR is completely stored in the latch circuit XDL by monitoring the ready/busy signal RBn after the process of S914. Since the CPU 230 performs the process of S915 in response to the recognizing of the complete storing of the single-level data FR in the latch circuit XDL, the NAND memory 100 can perform the multi-level reading and outputting of the single-level data FR in parallel. In S914 and S915, the NAND memory 100 performs at least the B reading included in the next multi-level reading while outputting the separated data. The NAND memory 100 may complete the B reading until the outputting of the single-level data FR is completed or may not complete the B reading until the outputting of the single-level data FR is completed. The NAND memory 100 performs a part or all of the outputting of the single-level data FR and a part or all of the first single-level reading constituting the next multi-level reading in parallel.

The processes of S907 to S916 are performed m times while elevating the boundary voltages by Vstep. In the m-th process of S913, the next multi-level read command may not be issued. When the next multi-level read command is not issued in the m-th process of S913, the multi-level reading is not performed in the process of S914.

After the processes of S907 to S916 are performed m times, the CPU 230 calculates the optimal boundary voltages for each of the B reading, the D reading, and the F reading (S917). In S918 to S921, the memory system 1 performs the same processes as the processes of S114 to S117.

Specific examples of the method of operating the latch circuits in each multi-level reading will be described below with reference to FIGS. 55 to 57. The order of performing the single-level reading constituting the multi-level reading can be arbitrarily designed. Here, as described in the sixth embodiment, it is assumed that the single-level reading is performed in the order of boundary voltages.

Figure 55:
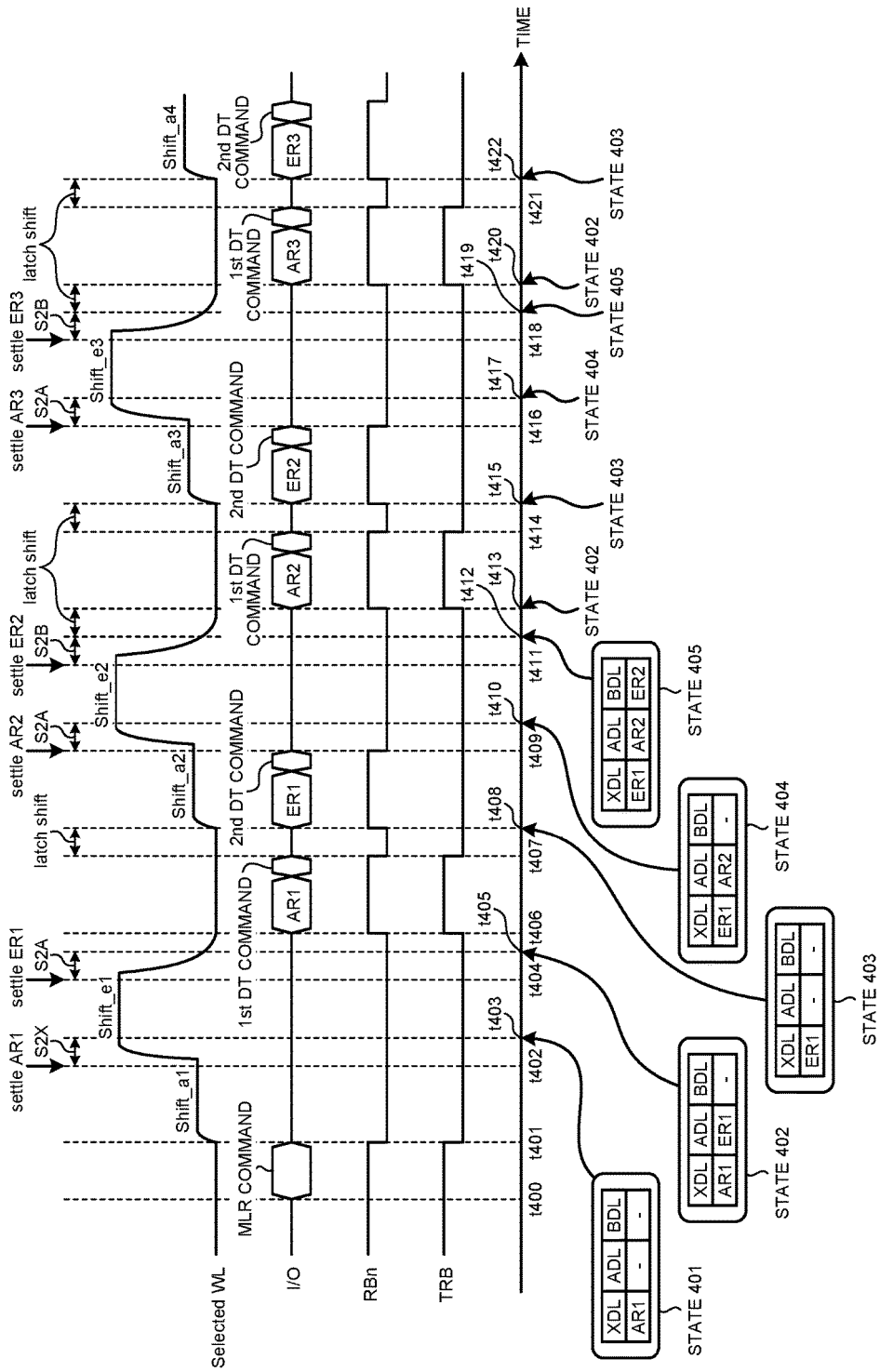
FIG. 55 is a diagram illustrating an example of a method of operating each latch circuit in the lower estimation process according to the seventh embodiment.

FIG. 55 is a diagram illustrating an example of the method of operating the latch circuits in the lower estimation process. The example of FIG. 55 illustrates state changes of the latch circuits, a voltage change of a selected word line WL, a change of an input/output signal I/O, and changes of a ready/busy signal RBn and a true ready/busy TRB.

The true ready/busy TRB is state information which is changed to a busy state when an access to the latch circuit XDL is inhibited or an access to the memory cell array 110 is performed, and which is changed to a ready state when an access to the latch circuit XDL is permitted and an access to the memory cell array 110 is not performed. The sequencer 170 may output the true ready/busy TRB in response to a status read command when the status read command is input via the input/output signal I/O.

First, the CPU 230 issues a multi-level read command (time t400). The issuing of the multi-level read command corresponds to the process of S905.

When the multi-level read command is received (time t401), the sequencer 170 starts first multi-level reading. The NAND memory 100 changes the ready/busy signal RBn and the true ready/busy TRB from the ready state to the busy state and starts elevating the voltage of the selected word line WL.

After time t401, in order to perform the A reading, the sequencer 170 elevates the voltage of the selected word line WL to a voltage Shift_a1 and causes the column control circuit 140 to settle the single-level data AR1 (time t402). The single-level data AR1 is stored in the latch circuit SDL. Subsequently, the sequencer 170 causes the column control circuit 140 to perform the S2X. STATE 401 in the drawing indicates states of the latch circuits at a time at which the S2X is completed (time t403). Here, the latch circuits CDL, DDL, and SDL are not illustrated. In STATE 401, the single-level data AR1 is stored in the latch circuit XDL and no data is stored in the latch circuits ADL and BDL.

The sequencer 170 elevates the voltage of the selected word line WL to a voltage Shift_e1 in order to perform the E reading after the single-level data AR1 is settled, and causes the column control circuit 140 to settle the single-level data ER1 (time t404). The single-level data ER1 is stored in the latch circuit SDL. Subsequently, the sequencer 170 causes the column control circuit 140 to perform the S2A. STATE 402 in the drawing indicates states of the latch circuits at a time at which the S2A is completed (time t405). In STATE 402, the single-level data AR1 is stored in the latch circuit XDL, the single-level data ER1 is stored in the latch circuit ADL, and no data is stored in the latch circuit BDL.

The sequencer 170 discharges the voltage applied to the selected word line WL after the single-level data ER1 is settled. When the S2A is completed and the process on the memory cell array 110 is completed (time t406), the sequencer 170 changes the ready/busy signal RBn and the true ready/busy TRB from the busy state to the ready state. The processes from time t401 to time t406 correspond to the process of S906.

In this way, the sequencer 170 performs the settling of the single-level data AR, the S2X, the settling of the single-level data ER, and the S2A in this order in accordance with the multi-level read command having a lower page as a target.

The CPU 230 causes the column control circuit 140 to output the data in the latch circuit XDL (the single-level data AR1 at this time) in response to the changing of the ready/busy signal RBn to the ready state after the multi-level read command is issued. This process corresponds to the process of S907 in the lower estimation process. The CPU 230 issues a first data transfer command (1st DT command) when the acquiring of the single-level data AR1 is completed. This process corresponds to the process of S913 in the lower estimation process.

The first data transfer command is a command for causing the NAND memory 100 to perform the latch shift process and then causing the NAND memory 100 to perform the next multi-level reading. The latch shift process in the seventh embodiment is the same process as the latch shift process of the sixth embodiment. The latch shift process of the seventh embodiment is one process of exchanging the data in the latch circuit XDL with non-output single-level data.

When the first data transfer command is received (time t407), the sequencer 170 causes the column control circuit 140 to perform the latch shift process. The sequencer 170 changes the ready/busy signal RBn and the true ready/busy TRB to the busy state when the latch shift process is started, and changes the ready/busy signal RBn to the ready state when the latch shift process is completed. When the latch shift process is completed, the sequencer 170 starts next multi-level reading (hereinafter, second multi-level reading) (time t408). Accordingly, the sequencer 170 maintains the true ready/busy TRB in the busy state after the latch shift process is completed.

When the latch shift process is completed (time t408), the states of the latch circuits are changed to STATE 403. In STATE 403, the single-level data ER1 is stored in the latch circuit XDL and no data is stored in the latch circuits ADL and BDL.

The controller 200 causes the column control circuit 140 to output the data in the latch circuit XDL (the single-level data ER1 at this time) in response to the changing of the ready/busy signal RBn to the ready state. This process corresponds to the process of S915 in the lower estimation process.

When the acquiring of the single-level data ER1 is completed, the CPU 230 issues a second data transfer command (2nd DT command).

The second data transfer command is a command for causing the NAND memory 100 to perform the latch shift process after causing the NAND memory 100 to perform all the previously issued commands. In the example illustrated in FIG. 55, the sequencer 170 is performing the second multi-level reading at a time at which the second data transfer command is received. Accordingly, the sequencer 170 performs the latch shift process after the second multi-level reading is completed.

According to the second multi-level reading, the sequencer 170 elevates the voltage of the selected word line WL to a voltage Shift_a2 in order to perform the A reading and causes the column control circuit 140 to settle the single-level data AR2 (time t409). Shift_a2 is a value which is obtained, for example, by adding Vstep to Shift_a1. The single-level data AR2 is stored in the latch circuit SDL. Subsequently, the sequencer 170 causes the column control circuit 140 to perform the S2A. STATE 404 in the drawing indicates the states of the latch circuits at a time at which the S2A is completed (time t410). As indicated by STATE 404, the single-level data ER1 which is obtained by the first multi-level reading is stored in the latch circuit XDL, the single-level data AR2 which is obtained by the second multi-level reading is stored in the latch circuit ADL, and no data is stored in the latch circuit BDL.

After the single-level data AR2 is settled, the sequencer 170 elevates the voltage of the selected word line WL to a voltage Shift_e2 in order to perform the E reading and causes the column control circuit 140 to settle the single-level data ER2 (time t411). The single-level data ER2 is stored in the latch circuit SDL. Subsequently, the sequencer 170 causes the column control circuit 140 to perform the S2B. STATE 405 in the drawing indicates the states of the latch circuits at a time at which the S2B is completed (time t412). As indicated by STATE 405, the single-level data ER1 which is obtained by the first multi-level reading is stored in the latch circuit XDL, the single-level data AR2 which is obtained by the second multi-level reading is stored in the latch circuit ADL, and the single-level data ER2 which is obtained by the second multi-level reading is stored in the latch circuit BDL.

In this way, the sequencer 170 performs the settling of the single-level data AR, the S2A, the settling of the single-level data ER, and the S2B in this order in accordance with the first data transfer command having a lower page as a target.

After the S2B is completed (time t412), the NAND memory 100 starts the latch shift process in response to the second data transfer command. When the latch shift process is completed (time t413), the states of the latch circuits are changed to STATE 402. Here, the single-level data which are stored in the latch circuits are obtained by the second shift reading.

When the latch shift process is completed (time t413), the sequencer 170 changes the ready/busy signal RBn and the true ready/busy TRB from the busy state to the ready state. Thereafter, the same processes as the processes from time t406 to t413 are repeatedly performed m−1 times.

In this way, in the lower estimation process of the seventh embodiment, the outputting of the single-level data ER and the next multi-level reading are performed in parallel. Accordingly, in comparison with a case in which the multi-level reading of the sixth embodiment is performed m times, it is possible to shorten the time required for the lower estimation process.

Figure 56:
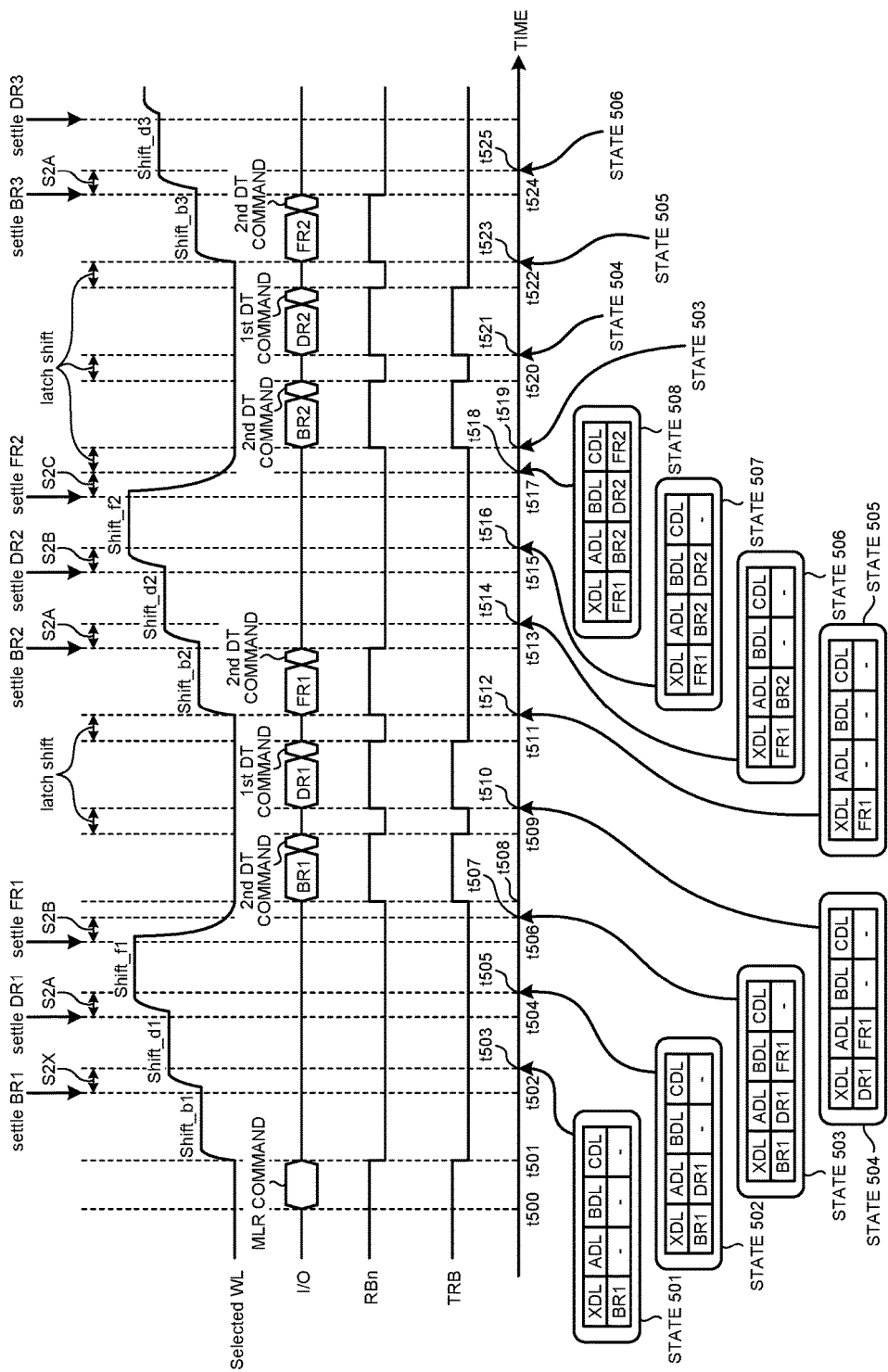
FIG. 56 is a diagram illustrating an example of a method of operating each latch circuit in the middle estimation process according to the seventh embodiment.

FIG. 56 is a diagram illustrating an example of the method of operating the latch circuits in the middle estimation process. First, the CPU 230 issues a multi-level read command (time t500). The issuing of the multi-level read command corresponds to the process of S905.

When the multi-level read command is received (time t501), the sequencer 170 starts first multi-level reading. In order to perform the B reading, the sequencer 170 elevates the voltage of the selected word line WL to a voltage Shift_b1 and causes the column control circuit 140 to settle the single-level data BR1 (time t502). The single-level data BR1 is stored in the latch circuit SDL. Subsequently, the sequencer 170 causes the column control circuit 140 to perform the S2X. STATE 501 in the drawing indicates the states of the latch circuits at a time at which the S2X is completed (time t503). In STATE 501, the single-level data BR1 is stored in the latch circuit XDL and no data is stored in the latch circuits ADL, BDL, and CDL.

After the single-level data BR1 is settled, the sequencer 170 elevates the voltage of the selected word line WL to a voltage Shift_d1 in order to perform the D reading and causes the column control circuit 140 to settle the single-level data DR1 (time t504). The single-level data DR1 is stored in the latch circuit SDL. Subsequently, the sequencer 170 causes the column control circuit 140 to perform the S2A. STATE 502 in the drawing indicates the states of the latch circuits at a time at which the S2A is completed (time t505). In STATE 502, the single-level data BR1 is stored in the latch circuit XDL, the single-level data DR1 is stored in the latch circuit ADL, and no data is stored in the latch circuits BDL and CDL.

After the single-level data DR1 is settled, the sequencer 170 elevates the voltage of the selected word line WL to a voltage Shift_f1 in order to perform the F reading and causes the column control circuit 140 to settle the single-level data FR1 (time t506). The single-level data FR1 is stored in the latch circuit SDL. Subsequently, the sequencer 170 causes the column control circuit 140 to perform the S2B. STATE 503 in the drawing indicates the states of the latch circuits at a time at which the S2B is completed (time t507). As indicated by STATE 503, the single-level data BR1 is stored in the latch circuit XDL, the single-level data DR1 is stored in the latch circuit ADL, the single-level data FR1 is stored in the latch circuit BDL, and no data is stored in the latch circuit CDL.

The sequencer 170 discharges the voltage applied to the selected word line WL after the single-level data FR1 is settled. When the S2B is completed and the process on the memory cell array 110 is completed (time t508), the sequencer 170 changes the ready/busy signal RBn and true ready/busy TRB from the busy state to the ready state. The processes from time t501 to time t508 correspond to the process of S906.

In this way, the sequencer 170 performs the settling of the single-level data BR, the S2X, the settling of the single-level data DR, the S2A, the settling of the single-level data FR, and the S2B in this order in accordance with the multi-level read command having a middle page as a target.

The CPU 230 causes the column control circuit 140 to output the data in the latch circuit XDL (the single-level data BR1 at this time) in response to the changing of the ready/busy signal RBn to the ready state after the multi-level read command is issued. This process corresponds to the process of S907. The CPU 230 issues the second data transfer command when the acquiring of the single-level data BR1 is completed. This process corresponds to the process of S909.

At a time at which the sequencer 170 receives the second data transfer command (time t509), the previously issued commands are all completed. Accordingly, when the second data transfer command is received, the sequencer 170 causes the column control circuit 140 to start the latch shift process. The sequencer 170 changes the ready/busy signal RBn and the true ready/busy TRB to the busy state when the latch shift process is started, and changes the ready/busy signal RBn and the true ready/busy TRB to the ready state when the latch shift process is completed.

When the latch shift process is completed (time t510), the states of the latch circuits are changed to STATE 504. In STATE 504, the single-level data DR1 is stored in the latch circuit XDL, the single-level data FR1 is stored in the latch circuit ADL, and no data is stored in the latch circuits BDL and CDL.

The CPU 230 causes the column control circuit 140 to output the data in the latch circuit XDL (the single-level data DR1 at this time) in response to the changing of the ready/busy signal RBn to the ready state. This process corresponds to the process of S911. The CPU 230 issues the first data transfer command when the acquiring of the single-level data DR1 is completed. This process corresponds to the process of S913.

When the first data transfer command is received (time t511), the sequencer 170 causes the column control circuit 140 to perform the latch shift process. The sequencer 170 changes the ready/busy signal RBn and the true ready/busy TRB to the busy state when the latch shift process is started, and changes the ready/busy signal RBn to the ready state when the latch shift process is completed. When the latch shift process is completed, the sequencer 170 starts next multi-level reading (hereinafter, referred to as second multi-level reading) (time t512). Accordingly, the sequencer 170 maintains the true ready/busy TRB in the busy state after the latch shift process is completed.

When the latch shift process is completed (time t512), the states of the latch circuits are changed to STATE 505. In STATE 505, the single-level data FR1 is stored in the latch circuit XDL and no data is stored in the latch circuits ADL, BDL, and CDL.

The CPU 230 causes the column control circuit 140 to output the data in XDL (the single-level data FR1 at this time) in response to the changing of the ready/busy signal RBn to the ready state. This process corresponds to the process of S915. The CPU 230 issues the second data transfer command when the acquiring of the single-level data FR1 is completed.

In the example illustrated in FIG. 56, the NAND memory 100 is performing the second multi-level reading at a time at which the second data transfer command is received. In the second multi-level reading, the sequencer 170 elevates the voltage of the selected word line WL to a voltage Shift_b2 in order to perform the B reading and causes the column control circuit 140 to settle the single-level data BR2 (time t513). Shift_b2 is a value which is obtained, for example, by adding Vstep to Shift_b1. The single-level data BR2 is stored in the latch circuit SDL. Subsequently, the sequencer 170 causes the column control circuit 140 to perform the S2A. STATE 506 in the drawing indicates the states of the latch circuits at a time at which the S2A is completed (time t514). In STATE 506, the single-level data FR1 which is acquired by the first multi-level reading is stored in the latch circuit XDL, the single-level data BR2 which is acquired by the second multi-level reading is stored in the latch circuit ADL, and no data is stored in the latch circuits BDL and CDL.

After the single-level data BR2 is settled, the sequencer 170 elevates the voltage of the selected word line WL to a voltage Shift_d2 in order to perform the D reading and causes the column control circuit 140 to settle the single-level data DR2 (time t515). The single-level data DR2 is stored in the latch circuit SDL. Subsequently, the sequencer 170 causes the column control circuit 140 to perform the S2B. STATE 507 in the drawing indicates the states of the latch circuits at a time at which the S2B is completed (time t516). In STATE 507, the single-level data FR1 which is acquired by the first multi-level reading is stored in the latch circuit XDL, the single-level data BR2 which is acquired by the second multi-level reading is stored in the latch circuit ADL, the single-level data DR2 which is acquired by the second multi-level reading is stored in the latch circuit BDL, and no data is stored in the latch circuit CDL.

After the single-level data DR2 is settled, the sequencer 170 elevates the voltage of the selected word line WL to a voltage Shift_f2 in order to perform the F reading and causes the column control circuit 140 to settle the single-level data FR2 (time t517). The single-level data FR2 is stored in the latch circuit SDL. Subsequently, the sequencer 170 causes the column control circuit 140 to perform the S2C. STATE 508 in the drawing indicates the states of the latch circuits at a time at which the S2C is completed (time t518). In STATE 508, the single-level data FR1 which is acquired by the first multi-level reading is stored in the latch circuit XDL, the single-level data BR2 which is acquired by the second multi-level reading is stored in the latch circuit ADL, the single-level data DR2 which is acquired by the second multi-level reading is stored in the latch circuit BDL, and the single-level data FR2 which is acquired by the second multi-level reading is stored in the latch circuit CDL.

In this way, the sequencer 170 performs the settling of the single-level data BR, the S2A, the settling of the single-level data DR, the S2B, the settling of the single-level data FR, and the S2C in this order in accordance with the first data transfer command having a middle page as a target.

When the S2C is completed (time t518), the sequencer 170 causes the column control circuit 140 to start the latch shift process based on the second data transfer command. When the latch shift process is completed (time t519), the states of the latch circuits are changed to STATE 503. Here, the single-level data stored in the latch circuits are obtained by the second shift reading.

When the latch shift process is completed (time t518), the sequencer 170 changes the ready/busy signal RBn and the true ready/busy TRB from the busy state to the ready state. Thereafter, the same processes as the processes from time t508 to time t519 are repeatedly performed m−1 times.

In this way, in the middle estimation process of the seventh embodiment, the outputting of the single-level data FR and the next multi-level reading are performed in parallel. Accordingly, the total time required for the middle estimation process can be shortened in comparison with a case in which the multi-level reading of the sixth embodiment is performed m times.

Figure 57:
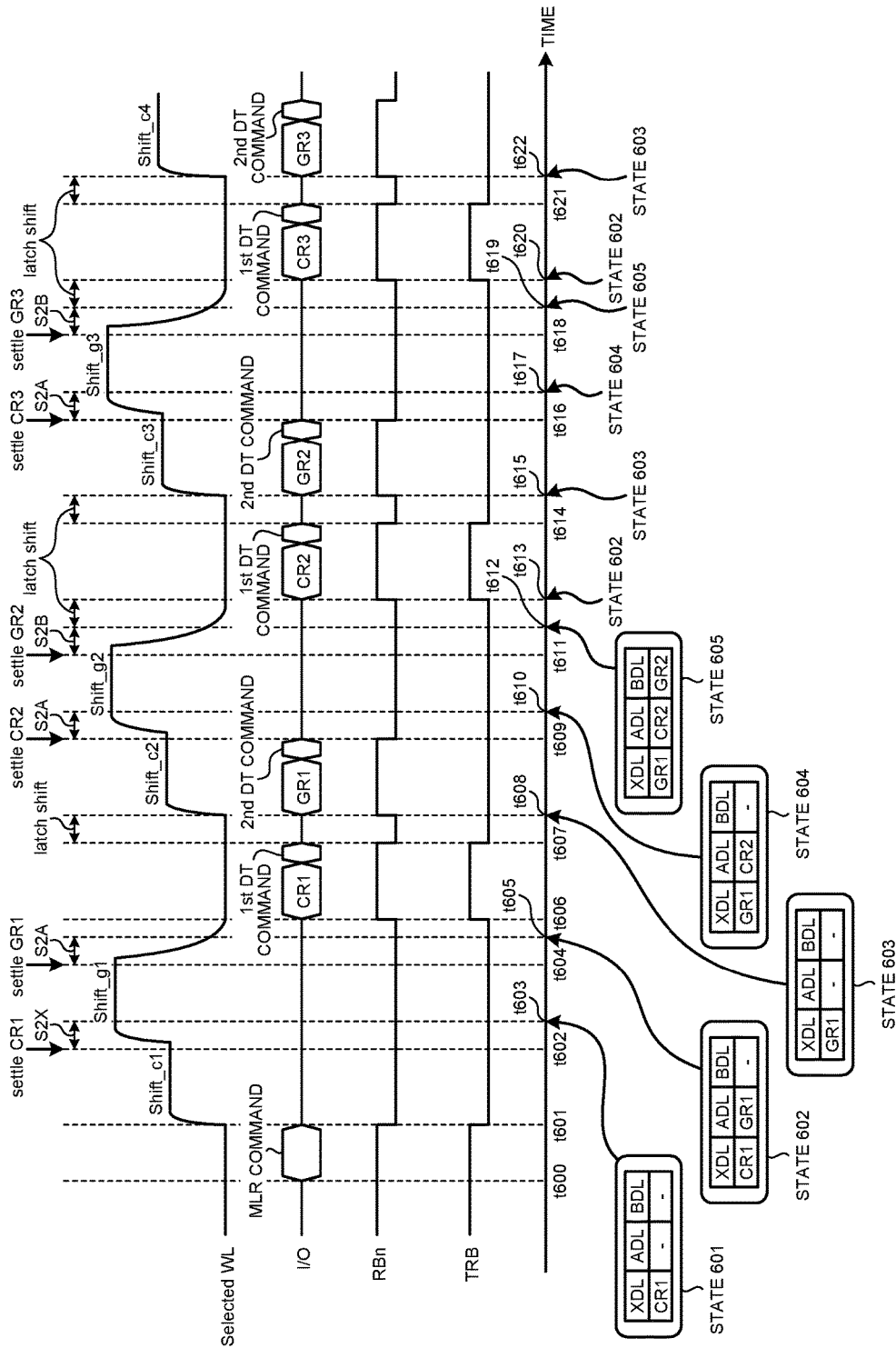
FIG. 57 is a diagram illustrating an example of a method of operating each latch circuit in the upper estimation process according to the seventh embodiment.

FIG. 57 is a diagram illustrating an example of the method of operating the latch circuits in the upper estimation process. First, the CPU 230 issues a multi-level read command (time t600). The issuing of the multi-level read command corresponds to the process of S905 in the lower estimation process.

When the multi-level read command is received (time t601), the sequencer 170 starts first multi-level reading. The sequencer 170 changes the ready/busy signal RBn and the true ready/busy TRB from the ready state to the busy state and starts elevating the voltage of the selected word line WL.

After time t601, the sequencer 170 elevates the voltage of the selected word line WL to a voltage Shift_c1 in order to perform the C reading and causes the column control circuit 140 to settle the single-level data CR1 (time t602). The single-level data CR1 is stored in the latch circuit SDL. Subsequently, the sequencer 170 causes the column control circuit 140 to perform the S2X. STATE 601 in the drawing indicates the states of the latch circuits at a time at which the S2X is completed (time t603). Here, the latch circuits CDL, DDL, and SDL are not illustrated. In STATE 601, the single-level data CR1 is stored in the latch circuit XDL and no data is stored in the latch circuits ADL and BDL.

After the single-level data CR1 is settled, the sequencer 170 elevates the voltage of the selected word line WL to a voltage Shift_g1 in order to perform the G reading and causes the column control circuit 140 to settle the single-level data GR1 (time t604). The single-level data GR1 is stored in the latch circuit SDL. Subsequently, the sequencer 170 causes the column control circuit 140 to perform the S2A. STATE 602 in the drawing indicates the states of the latch circuits at a time at which the S2A is completed (time t605). In STATE 602, the single-level data CR1 is stored in the latch circuit XDL, the single-level data GR1 is stored in the latch circuit ADL, and no data is stored in the latch circuit BDL.

After the single-level data GR1 is settled, the sequencer 170 discharges the voltage applied to the selected word line WL. When the S2A is completed and the process on the memory cell array 110 is completed (time t606), the sequencer 170 changes the ready/busy signal RBn and the true ready/busy TRB from the busy state to the ready state. The process from time t601 to time t606 corresponds to the process of S906 in the lower estimation process.

In this way, the sequencer 170 performs the settling of the single-level data CR, the S2X, the settling of the single-level data GR, and the S2A in this order in accordance with the multi-level read command having an upper page as a target.

The CPU 230 causes the column control circuit 140 to output the data in the latch circuit XDL (the single-level data CR1 at this time) in response to the changing of the ready/busy signal RBn to the ready state after the multi-level read command is issued. This process corresponds to the process of S907 in the lower estimation process. The CPU 230 issues the first data transfer command when the acquiring of the single-level data CR1 is completed. This process corresponds to the process of S913.

When the first data transfer command is received (time t607), the sequencer 170 causes the column control circuit 140 to perform the latch shift process. The sequencer 170 changes the ready/busy signal RBn and the true ready/busy TRB to the busy state when the latch shift process is started, and changes the ready/busy signal RBn to the ready state when the latch shift process is completed. When the latch shift process is completed, the sequencer 170 starts next multi-level reading (hereinafter, referred to as second multi-level reading) (time t608). Accordingly, the sequencer 170 maintains the true ready/busy TRB in the busy state after the latch shift process is completed.

When the latch shift process is completed (time t608), the states of the latch circuits are changed to STATE 603. In STATE 603, the single-level data GR1 is stored in the latch circuit XDL and no data is stored in the latch circuits ADL and BDL.

The CPU 230 causes the column control circuit 140 to output the data in the latch circuit XDL (the single-level data GR1 at this time) in response to the changing of the ready/busy signal RBn to the ready state. This process corresponds to the process of S915. The CPU 230 issues the second data transfer command when the acquiring of the single-level data GR1 is completed.

In the example illustrated in FIG. 57, the sequencer 170 is performing the second multi-level reading at a time at which the second data transfer command is received. In the second multi-level reading, the sequencer 170 elevates the voltage of the selected word line WL to a voltage Shift_c2 in order to perform the C reading and causes the column control circuit 140 to settle the single-level data CR2 (time t609). Shift_c2 is a value which is obtained, for example, by adding Vstep to Shift_c1. The single-level data CR2 is stored in the latch circuit SDL. Subsequently, the sequencer 170 causes the column control circuit 140 to perform the S2A. STATE 604 in the drawing indicates the states of the latch circuits at a time at which the S2A is completed (time t610). In STATE 604, the single-level data GR1 which is acquired by the first multi-level reading is stored in the latch circuit XDL, the single-level data CR2 which is acquired by the second multi-level reading is stored in the latch circuit ADL, and no data is stored in the latch circuit BDL.

After the single-level data CR2 is settled, the sequencer 170 elevates the voltage of the selected word line WL to a voltage Shift_g2 in order to perform the G reading. Then, the sequencer 170 causes the column control circuit 140 to settle the single-level data GR2 (time t611). The single-level data GR2 is stored in the latch circuit SDL. Subsequently, the sequencer 170 causes the column control circuit 140 to perform the S2B. STATE 605 in the drawing indicates the states of the latch circuits at a time at which the S2B is completed (time t612). As indicated by STATE 605, the single-level data GR1 which is acquired by the first multi-level reading is stored in the latch circuit XDL, the single-level data CR2 which is acquired by the second multi-level reading is stored in the latch circuit ADL, and the single-level data GR2 which is acquired by the second multi-level reading is stored in the latch circuit BDL.

In this way, the sequencer 170 performs the settling of the single-level data CR, the S2A, the settling of the single-level data GR, and the S2B in this order in accordance with the first data transfer command having an upper page as a target.

When the S2B is completed (time t612), the sequencer 170 causes the column control circuit 140 to start the latch shift process based on the second data transfer command. When the latch shift process is completed (time t613), the states of the latch circuits are changed to STATE 602. Here, the single-level data stored in the latch circuits are acquired by the second shift reading.

When the latch shift process is completed (time t613), the NAND memory 100 changes the ready/busy signal RBn and the true ready/busy TRB from the busy state to the ready state. Thereafter, the same processes as the processes from time t606 to time t613 are repeatedly performed m−1 times.

In this way, in the upper estimation process of the seventh embodiment, the outputting of the single-level data GR and the next multi-level reading are performed in parallel. Accordingly, the total time required for the upper estimation process can be shortened in comparison with a case in which the multi-level reading of the sixth embodiment is performed m times.

As described above, according to the seventh embodiment, the NAND memory 100 performs the operation of outputting the single-level data from the NAND memory 100 to the controller 200 and the single-level reading of the next multi-level reading in parallel. Accordingly, the time required for the estimation process is shortened in comparison with the sixth embodiment.

The estimation process of the seventh embodiment may be employed as the estimation process of the third embodiment. That is, the controller 200 may generate the read data from the single-level data acquired by the estimation process of the seventh embodiment. The controller 200 may generate soft bit information on the basis of the single-level data acquired by the estimation process of the seventh embodiment and may input the soft bit information to the ECC circuit 260, and the ECC circuit 260 may perform soft decision using the soft bit information.

Eighth Embodiment

Figure 58:
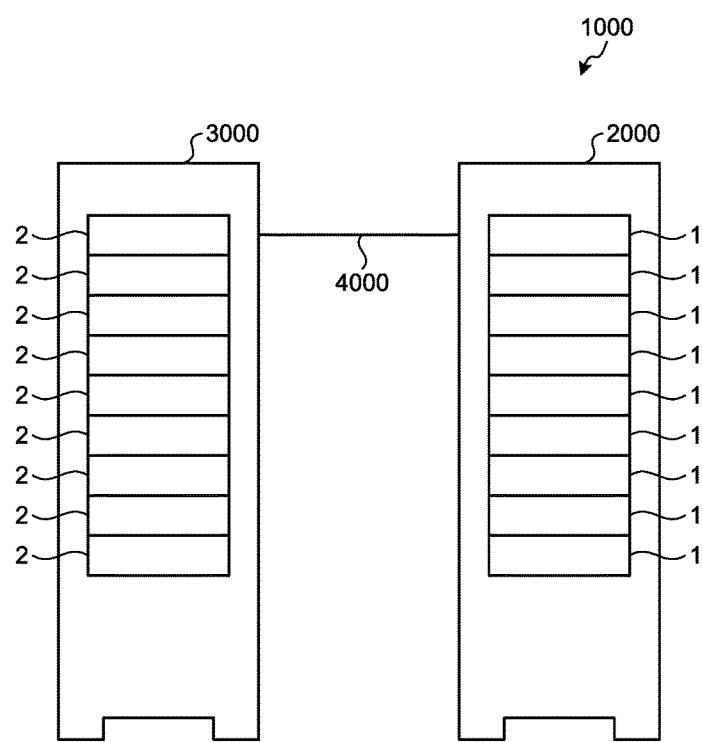
FIG. 58 is a diagram illustrating a mounting example of a memory system.

FIG. 58 is a diagram illustrating a mounting example of the memory system 1. The memory system 1 is mounted on, for example, a server system 1000. The server system 1000 has a configuration in which a disk array 2000 and a rack mount server 3000 are connected to each other via a communication interface 4000. An arbitrary standard can be employed as the standard of the communication interface 4000. The rack mount server 3000 includes a server rack.

One or more host devices 2 are mounted on the server rack of the rack mount server 3000. Each host device 2 can access the disk array 2000 via the communication interface 4000.

The disk array 2000 includes a server rack. One or more memory systems 1 are mounted on the server rack of the disk array 2000. In addition to the memory systems 1, one or more hard disk units may be mounted on the disk array 2000. Each memory system 1 can execute commands from the host devices 2. Each memory system 1 has a configuration employing at least one embodiment of the first to seventh embodiments. Accordingly, even when the threshold voltage distributions vary, each memory system can efficiently estimate the optimal values of the boundary voltages.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage apparatus comprising:
a memory cell array that includes a memory cell which is connected to a word line, a threshold voltage of the memory cell corresponding to a data value of multiple bits; and
a read circuit that receives designation of one bit among the multiple bits, applies a first reading voltage and a second reading voltage corresponding to the designated bit to the word line, senses ON or OFF of the memory cell for each reading voltage, and outputs a first sensed value and a second sensed value after performing the sensing for each reading voltage, the first sensed value being a sensing result in a case where the first reading voltage is applied and the second sensed value being a sensing result in a case where the second reading voltage is applied, wherein the read circuit:
includes a first latch circuit and a second latch circuit,
applies a third reading voltage to the word line and senses ON or OFF of the memory cell for the third reading voltage, the third reading voltage being a voltage between the first reading voltage and the second reading voltage,
stores a third sensed value in the first latch circuit, the third sensed value being a sensing result in a case where the third reading voltage is applied,
calculates a data value of the designated bit on the basis of the first sensed value and the second sensed value and stores the calculated data value in the second latch circuit,
calculates the first sensed value and the second sensed value on the basis of the third sensed value stored in the first latch circuit and the data value stored in the second latch circuit, and
outputs the calculated first sensed value and the calculated second sensed value.

2. The semiconductor storage apparatus according to claim 1, wherein the read circuit:
further includes a third latch circuit,
calculates the first sensed value on the basis of the third sensed value stored in the first latch circuit and the data value stored in the second latch circuit and stores the calculated first sensed value in the third latch circuit,
outputs the first sensed value stored in the third latch circuit,
calculates the second sensed value on the basis of the third sensed value stored in the first latch circuit and the data value stored in the second latch circuit and stores the calculated second sensed value in the third latch circuit after outputting the first sensed value, and
outputs the second sensed value stored in the third latch circuit.

3. The semiconductor storage apparatus according to claim 2, wherein the read circuit receives designation of an amount, performs the sensing for each reading voltage, then shifts the first reading voltage and the second reading voltage by the amount, applies the shifted first reading voltage and the shifted second reading voltage to the word line, and senses ON or OFF of the memory cell for each level.

4. The semiconductor storage apparatus according to claim 3, wherein the read circuit performs outputting of the second sensed value and applying of the shifted first reading voltage in parallel.

5. A memory system comprising:
a semiconductor storage apparatus that includes a memory cell array including a memory cell which is connected to a word line, a threshold voltage of the memory cell corresponding to a data value of multiple bits, and a read circuit; and
a controller that designates one bit among the multiple bits and causes the read circuit to perform a reading process, the reading process being a process of applying a first reading voltage and a second reading voltage corresponding to the designated bit to the word line, sensing ON or OFF of the memory cell for each reading voltage, and outputting a first sensed value and a second sensed value after performing the sensing, the first sensed value being a sensing result in a case where the first reading voltage is applied and the second sensed value being a sensing result in a case where the second reading voltage is applied, wherein
the read circuit includes a first latch circuit and a second latch circuit, and
the reading process is a process of:
applying a third reading voltage to the word line and sensing ON or OFF of the memory cell for the third reading voltage, the third reading voltage being a voltage between the first reading voltage and the second reading voltage,
storing a third sensed value in the first latch circuit, the third sensed value being a sensing result in a case where the third reading voltage is applied,
calculating a data value of the designated bit on the basis of the first sensed value and the second sensed value and storing the calculated data value in the second latch circuit,
calculating the first sensed value and the second sensed value on the basis of the third sensed value stored in the first latch circuit and the data value stored in the second latch circuit, and
outputting the calculated first sensed value and the calculated second sensed value.

* * * * *